US012684895B2

(12) United States Patent 
Arimura et al.

(10) Patent No.: US 12,684,895 B2 
(45) Date of Patent: Jul. 14, 2026

(54) INSULATION MODULE

(71) Applicant: ROHM CO., LTD., Kyoto (JP)

(72) Inventors: Masahiko Arimura, Kyoto (JP); 
Tomoichiro Toyama, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 296 days.

(21) Appl. No.: 18/537,258

(22) Filed: Dec. 12, 2023

(65) Prior Publication Data

US 2024/0113238 A1 Apr. 4, 2024

Related U.S. Application Data

(63) Continuation of application No. PCT/JP2022/023700, filed on Jun. 14, 2022.

(30) Foreign Application Priority Data

Jun. 14, 2021 (JP) ................................. 2021-098852

(51) Int. Cl. 
*H10F 77/50* (2025.01) 
*H10F 55/25* (2025.01) 
(Continued)

(52) U.S. Cl. 
CPC ............. *H10F 77/50* (2025.01); *H10F 55/25* (2025.01); *H10F 77/40* (2025.01); *H10W 90/00* (2026.01)

(58) Field of Classification Search 
CPC ................................. H10F 55/25; H10F 55/00 
See application file for complete search history.

(56) References Cited

U.S. PATENT DOCUMENTS

| | | | |
|---|---|---|---|
| 2010/0270483 A1 | 10/2010 | Omura | |
| 2011/0235974 A1 | 9/2011 | Tay et al. | |
| (Continued) | | | |

FOREIGN PATENT DOCUMENTS

| | | |
|---|---|---|
| JP | H09283790 A | 10/1997 |
| JP | H10163518 A | 6/1998 |
| (Continued) | | |

OTHER PUBLICATIONS

International Search Report issued for International Patent Application No. PCT/JP2022/023700, Date of mailing: Aug. 2, 2022, 8 pages including English translation.

(Continued)

*Primary Examiner* — Matthew L Reames 
(74) *Attorney, Agent, or Firm* — HSML P.C.

(57) ABSTRACT

An insulation module includes: a light-emitting element; a light-receiving element that receives light from the light-emitting element; a first die pad on which the light-emitting element is mounted; a second die pad that is provided in alignment with the first die pad and on which the light-receiving element is mounted; a transparent resin that at least covers both the light-emitting element and the light-receiving element; a reflection member that covers at least the transparent resin and is formed from a material that reflects light from the light-emitting element; and an encapsulation resin that encapsulates the reflection member as well as the transparent resin and is formed from a material having a light-blocking effect. At least one of the reflection member and the transparent resin includes inorganic particles that absorb or reflect light from the light-emitting element.

20 Claims, 31 Drawing Sheets

(51) Int. Cl.
    *H10F 77/40*      (2025.01)
    *H10W 90/00*     (2026.01)

(56)           References Cited

U.S. PATENT DOCUMENTS

| | | |
|---|---|---|
| 2011/0235975 A1 | 9/2011 | Tay et al. |
| 2012/0076455 A1 | 3/2012 | Siew et al. |
| 2013/0313447 A1 | 11/2013 | Tay et al. |
| 2019/0006550 A1 | 1/2019 | Fujii |

FOREIGN PATENT DOCUMENTS

| | | |
|---|---|---|
| JP | 2010258165 A | 11/2010 |
| JP | 2013065717 A | 4/2013 |
| JP | 2013120940 A | 6/2013 |
| JP | 2015060869 A | 3/2015 |
| JP | 2019012713 A | 1/2019 |

OTHER PUBLICATIONS

Written Opinion issued for International Patent Application No. PCT/JP2022/023700, Date of mailing: Aug. 2, 2022, 13 pages including English machine translation.

INSULATION MODULE

BACKGROUND

The present disclosure relates to an insulation module.

Optical insulation modules such as photocouplers are known. For example, Japanese Patent Application Publication No. 2013-120940 discloses an optocoupler that includes an optical transmitter, an optical receiver, a transparent encapsulant encapsulating the optical transmitter and the optical receiver, and an opaque encapsulant encapsulating the transparent encapsulant.

DETAILED DESCRIPTION

Figure 1:
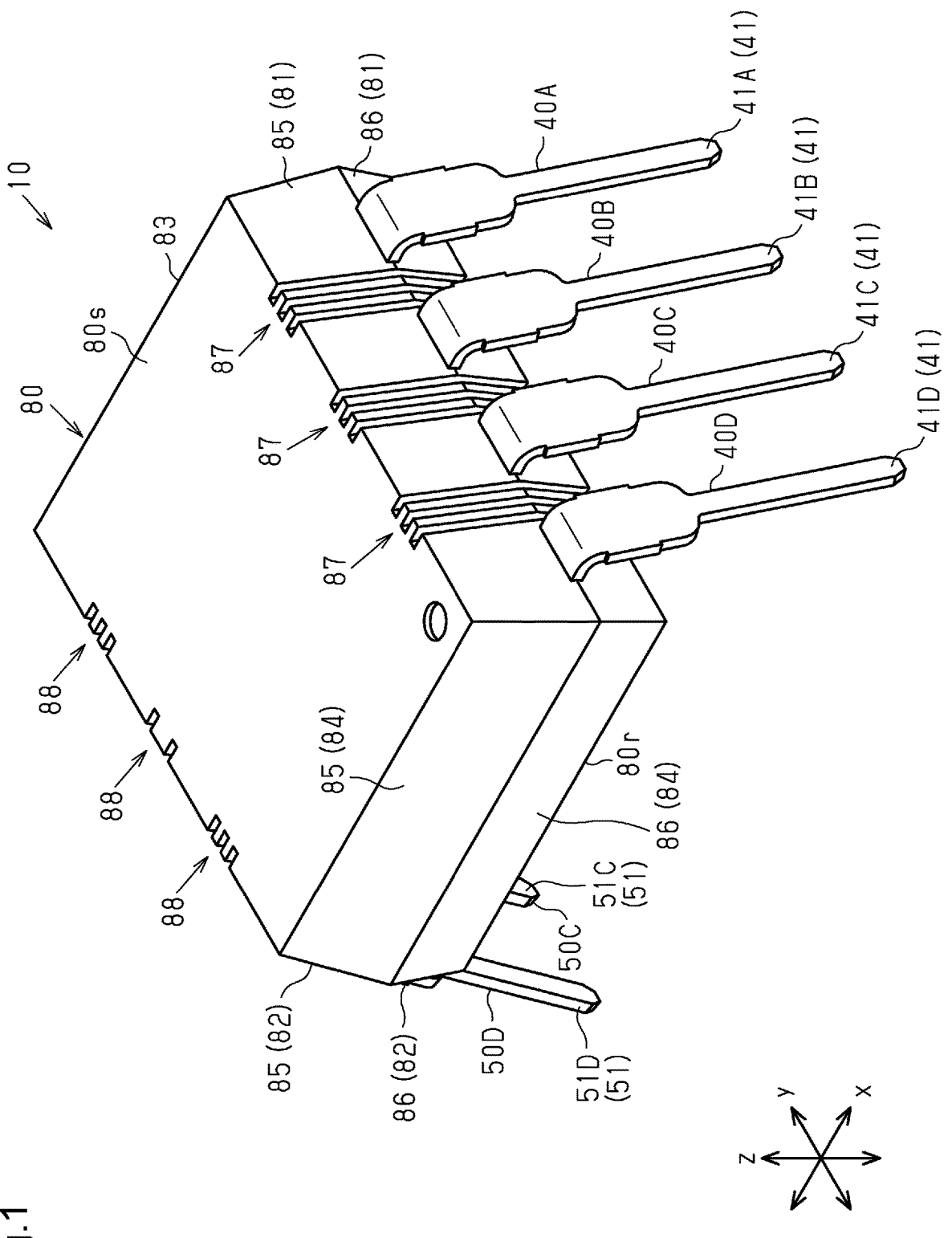
FIG. 1 is a perspective view of an insulation module of a first embodiment.

Referring to the drawings, embodiments of an insulation module are now described. The embodiments described below illustrate configurations and methods for embodying technical ideas. The materials, shapes, structures, arrangements, dimensions, and the like of the components are not limited to those described below. For simplicity and clarity of illustration, components shown in the drawings are not necessarily drawn to scale. Also, to facilitate understanding, hatching lines may be omitted in cross-sectional views. The accompanying drawings are merely illustrative of embodiments of the disclosure and should not be considered as limiting the disclosure.

First Embodiment

Referring to FIGS. 1 to 10, an insulation module 10 of a first embodiment is now described.

Figure 2:
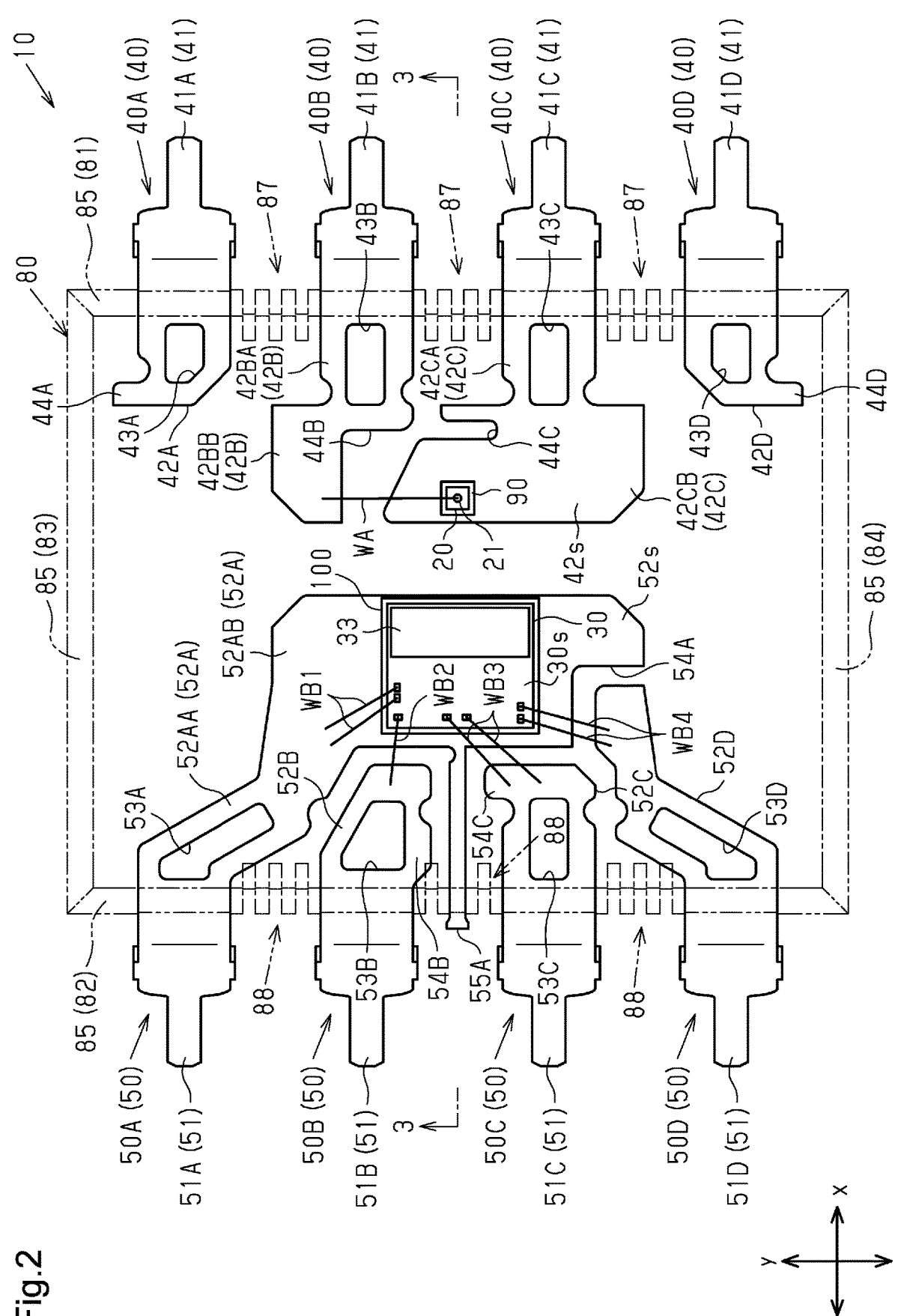
FIG. 2 is a plan view schematically showing the internal structure of the insulation module of FIG. 1.
Figure 3:
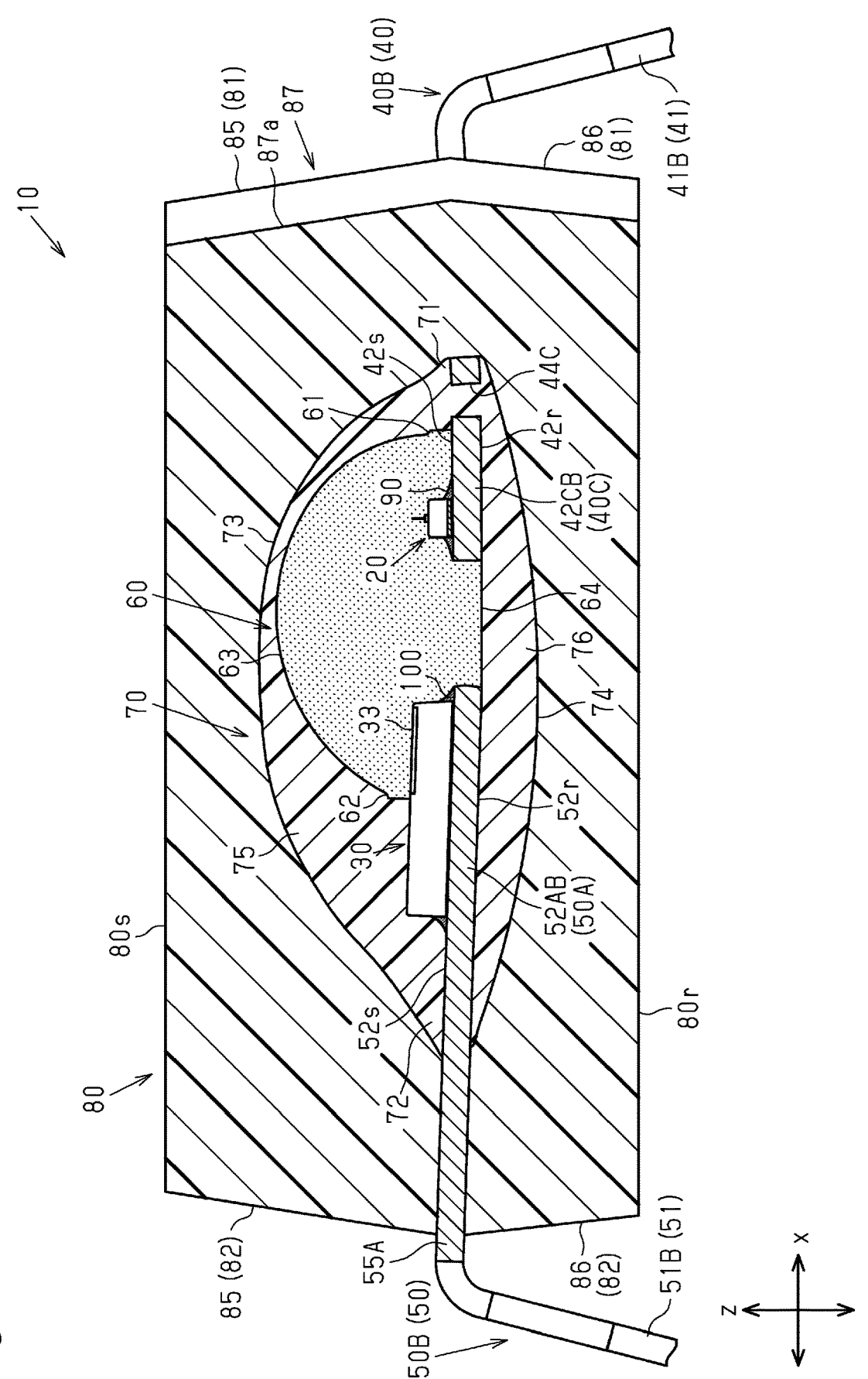
FIG. 3 is a cross-sectional view of the insulation module taken along line 3-3 in FIG. 2.

FIGS. 1 to 3 show the overall configuration of the insulation module 10. FIGS. 4 to 9 are enlarged views of parts of the insulation module 10. FIG. 10 shows the electrical configuration of the insulation module 10.

The insulation module 10 is used for a gate driver that applies a driving voltage signal to the gate of a switching element. As shown in FIGS. 1 and 2, the insulation module 10 has a package structure of dual in-line package (DIP). The insulation module 10 includes a rectangular sealing plastic 80 and multiple terminals 41 and 51 projecting from the sealing plastic 80. The dielectric strength voltage of the insulation module 10 may be in a range of 3500 Vrms to 7500 Vrms. However, the specific value of the dielectric strength voltage of the insulation module 10 is not limited to this and may be any value.

The sealing plastic 80 is made of an insulating material having a light blocking property. An example of an insulating material is epoxy resin. In this embodiment, the sealing plastic 80 is made from black epoxy resin. As shown in FIGS. 1 and 2, the sealing plastic 80 has a plastic main surface 80s, a plastic rear surface 80r, and first to fourth plastic side surfaces 81 to 84. In the following description, the thickness direction of the sealing plastic 80 is referred to as a z-direction, and two directions perpendicular to each other among the directions perpendicular to the z-direction are referred to as an x-direction and a y-direction.

The plastic main surface 80s and the plastic rear surface 80r form opposite end surfaces of the sealing plastic 80 in the thickness direction (z-direction). As viewed in the z-direction, both plastic main and rear surfaces 80*s* and 80*r* are formed in a rectangular shape. In this embodiment, the shape of the plastic main and rear surfaces 80*s* and 80*r* as viewed in the z-direction is a rectangular shape having shorter sides extending in the x-direction and longer sides extending in the y-direction. The z-direction may also be considered a height direction of the insulation module.

The first and second plastic side surfaces 81 and 82 form opposite end surfaces in the x-direction. Both the first and second plastic side surfaces 81 and 82 extend in the y-direction as viewed in the z-direction. Multiple (four in this embodiment) terminals 41A to 41D are provided on the first plastic side surface 81, and multiple (four in this embodiment) terminals 51A to 51D are provided on the second plastic side surface 82. The terminals 41A to 41D project from the first plastic side surface 81. The terminals 51A to 51D project from the second plastic side surface 82. As such, as viewed in the z-direction, the terminals 41A to 41D and the terminals 51A to 51D are considered to be arranged and spaced apart in the x-direction. In other words, the x-direction may be considered the arrangement direction of the terminals 41A to 41D and the terminals 51A to 51D. As shown in FIGS. 1 and 2, the terminals 51A to 51D have the same shape as the terminals 41A to 41D.

The third and fourth plastic side surfaces 83 and 84 form opposite end surfaces in the y-direction. The third and fourth plastic side surfaces 83 and 84 are free of terminals 41A to 41D or 51A to 51D. Both the third and fourth plastic side surfaces 83 and 84 extend in the x-direction as viewed in the z-direction.

In this embodiment, the terminals 41A to 41D and 51A to 51D have the same shape. Specifically, as shown in FIG. 1, each of the terminals 41A to 41D includes a first section extending in the x-direction from the first plastic side surface 81, a bent section bent downward from the first section, and a second section that is inclined downward as it extends away from the sealing plastic 80 in the x-direction. The second section includes a wide section, which is relatively wide, and a narrow section, which is relatively narrow. The wide section is the section of the second section that is continuous with the bent section and has the same width as the first section. The narrow sections form the distal ends of the terminals 41A to 41D. The length of the wide section in the direction in which the second section extends is shorter than the length of the narrow section. In other words, the length of the narrow section in the direction in which the second section extends is longer than the length of the wide section.

The terminals 41A to 41D and 51A to 51D form external terminals, which are inserted in through-holes of a wiring board (not shown) when the insulation module 10 is mounted on the wiring board. The narrow section of the second section of each of the terminals 41A to 41D and 51A to 51D is bonded with a conductive bonding material, which may be made of solder, Ag (silver) paste, or the like, in a state in which it is inserted in a through-hole of the wiring board. The insulation module 10 is thus electrically connected to the wiring board.

The plastic side surfaces 81 to 84 each include a first side surface 85 and a second side surface 86. The first side surface 85 is continuous with the second side surface 86. The first side surface 85 is closer to the plastic main surface 80*s* than to the plastic rear surface 80*r* in the z-direction. The second side surface 86 is closer to the plastic rear surface 80*r* than to the plastic main surface 80*s* in the z-direction. The first side surfaces 85 of the first and second plastic side surfaces 81 and 82 are inclined so as to be closer to each other in the x-direction at locations closer to the plastic main surface 80*s*. The second side surfaces 86 of the first and second plastic side surfaces 81 and 82 are inclined so as to be closer to each other in the x-direction at locations closer to the plastic rear surface 80*r*. The first side surface 85 (not shown) of the third plastic side surface 83 and the first side surface 85 of the fourth plastic side surface 84 are inclined so as to be closer to each other in the y-direction at locations closer to the plastic main surface 80*s*. The second side surface 86 (not shown) of the third plastic side surface 83 and the second side surface 86 of the fourth plastic side surface 84 are inclined so as to be closer to each other in the y-direction at locations closer to the plastic rear surface 80*r*. In this embodiment, the length of the first side surface 85 of each of the plastic side surfaces 81 to 84 in the z-direction is longer than the length of the second side surface 86 of each of the plastic side surfaces 81 to 84 in the z-direction.

The four terminals 41A to 41D project from between the first side surface 85 and the second side surface 86 of the first plastic side surface 81. The four terminals 41A to 41D are spaced apart from each other in the y-direction. Each of the terminals 41A to 41D projects from a section of the first plastic side surface 81 that is closer to the plastic rear surface 80*r* than the center of the sealing plastic 80 in the z-direction.

The four terminals 51A to 51D project from between the first side surface 85 and the second side surface 86 of the second plastic side surface 82. The four terminals 51A to 51D are spaced apart from each other in the y-direction. Each of the terminals 51A to 51D projects from a section of the second plastic side surface 82 that is closer to the plastic rear surface 80*r* than the center of the sealing plastic 80 in the z-direction.

The structure inside the sealing plastic 80 is now described.

FIG. 2 is a plan view of the insulation module 10 showing the internal structure of the insulation module 10. In FIG. 2, the sealing plastic 80 is indicated by dashed double-dotted lines for convenience. Also, in FIG. 2, for convenience of explanation, a transparent plastic 60 and a reflection member 70, which will be described below, are omitted.

As shown in FIG. 2, the insulation module 10 includes a light emitting element 20, a light receiving element 30, a first lead frame 40, and a second lead frame 50. The light emitting element 20 and the light receiving element 30 form a photocoupler.

The light emitting element 20 is mounted on the first lead frame 40. The first lead frame 40 includes first lead frames 40A to 40D as four first lead frames. As viewed in the z-direction, the first lead frames 40A to 40D are arranged at the side of the center in the x-direction of the sealing plastic 80 corresponding to the first plastic side surface 81. As viewed in the z-direction, the first lead frames 40A to 40D are spaced apart from each other in the y-direction.

The first lead frame 40A is closer to the third plastic side surface 83 than the first lead frames 40B to 40D. The first lead frame 40A includes the terminal 41A. That is, the terminal 41A is the section of the first lead frame 40A that projects from the first plastic side surface 81 to the outside of the sealing plastic 80.

An inner lead 42A, which is the section of the first lead frame 40A that is located within the sealing plastic 80, extends in the x-direction. As viewed in the z-direction, the distal end of the inner lead 42A is closer to the first plastic side surface 81 than the center in the x-direction of the sealing plastic 80. The section at the distal end of the inner lead 42A includes a through-hole 43A. As viewed in the z-direction, the through-hole 43A substantially has the shape of a rectangle with longer sides extending in the x-direction and shorter sides extending in the y-direction. The through-hole 43A is filled with the sealing plastic 80. The sealing plastic 80 in the through-hole 43A limits movement of the first lead frame 40A relative to the sealing plastic 80 in directions perpendicular to the z-direction.

The distal end of the inner lead 42A includes a projection 44A extending toward the third plastic side surface 83. In this embodiment, the projection 44A extends in the y-direction. The distal end of the projection 44A is spaced apart from the third plastic side surface 83 in the y-direction. That is, the projection 44A is not exposed from the third plastic side surface 83. The sealing plastic 80 is present on opposite sides in the x-direction of the projection 44A. The projection 44A thus limits movement of the first lead frame 40A relative to the sealing plastic 80 in the x-direction.

The first lead frame 40B is closer to the fourth plastic side surface 84 than the first lead frame 40A. The first lead frame 40B includes the terminal 41B. That is, the terminal 41B is the section of the first lead frame 40B that projects from the first plastic side surface 81 to the outside of the sealing plastic 80.

An inner lead 42B, which is the section of the first lead frame 40B that is located within the sealing plastic 80, extends in the x-direction. As viewed in the z-direction, the distal end of the inner lead 42B is closer to the first plastic side surface 81 than the center in the x-direction of the sealing plastic 80. The length of the inner lead 42B in the x-direction is longer than the length of the inner lead 42A in the x-direction. The inner lead 42B includes a first lead portion 42BA and a second lead portion 42BB.

The first lead portion 42BA is continuous with the terminal 41B and extends from the first plastic side surface 81 in the x-direction. The section near the second lead portion 42BB of the first lead portion 42BA includes a through-hole 43B. As viewed in the z-direction, the through-hole 43B has the shape of a rectangle with longer sides extending in the x-direction and shorter sides extending in the y-direction. In this embodiment, the length of the shorter sides of the through-hole 43B is equal to the length of the shorter sides of the through-hole 43A, and the length of the longer sides of the through-hole 43B is longer than the length of the longer sides of the through-hole 43A. The through-hole 43B is filled with the sealing plastic 80. The sealing plastic 80 in the through-hole 43B limits movement of the first lead frame 40A relative to the sealing plastic 80 in directions perpendicular to the z-direction.

The second lead portion 42BB includes the distal end of the inner lead 42B. As viewed in the z-direction, the second lead portion 42BB is offset from the first lead portion 42BA toward the inner lead 42A in the y-direction. A recess 44B is thus formed in a section at the distal end of the inner lead 42B. The recess 44B is recessed toward the third plastic side surface 83 from one of two edges in the y-direction of the first lead portion 42BA that is closer to the fourth plastic side surface 84. It may be considered that the second lead portion 42BB protrudes beyond the first lead portion 42BA toward the inner lead 42A as viewed in the z-direction. The sealing plastic 80 is present on opposite sides in the x-direction of the second lead portion 42BB. The second lead portion 42BB thus limits movement of the first lead frame 40B relative to the sealing plastic 80 in the x-direction.

The second lead portion 42BB includes a section that is closer to the second plastic side surface 82 than the inner lead 42A of the first lead frame 40A in the x-direction. As viewed in the z-direction, the second lead portion 42BB substantially has the shape of a rectangle with longer sides extending in the x-direction and shorter sides extending in the y-direction.

The first lead frame 40C is closer to the fourth plastic side surface 84 than the first lead frame 40B. The first lead frame 40C includes a terminal 41C. The terminal 41C is the section of the first lead frame 40C that projects from the first plastic side surface 81 to the outside of the sealing plastic 80.

An inner lead 42C, which is the section of the first lead frame 40C that is located within the sealing plastic 80, extends in the x-direction. The inner lead 42C includes a lead portion 42CA and a die pad portion 42CB. In this embodiment, the die pad portion 42CB corresponds to a first die pad.

The lead portion 42CA is continuous with the terminal 41C and extends from the first plastic side surface 81 in the x-direction. The section of the lead portion 42CA near the die pad portion 42CB includes a through-hole 43C. In this embodiment, the shape of the through-hole 43C as viewed in the z-direction is the same as the shape of the through-hole 43B as viewed in the z-direction. Also, the area of the through-hole 43C as viewed in the z-direction is the same as the area of the through-hole 43B as viewed in the z-direction. The through-hole 43C is filled with the sealing plastic 80. The sealing plastic 80 in the through-hole 43C limits movement of the first lead frame 40C relative to the sealing plastic 80 in directions perpendicular to the z-direction.

The die pad portion 42CB is provided at the same location in the x-direction as the second lead portion 42BB of the first lead frame 40B and is spaced apart from the second lead portion 42BB in the y-direction. The one of the end portions in the y-direction of the die pad portion 42CB that is closer to the second lead portion 42BB is located within the recess 44B of the second lead portion 42BB. That is, the die pad portion 42CB is arranged such that a part thereof overlaps with the lead portion 42BA as viewed in the x-direction.

As viewed in the z-direction, the die pad portion 42CB substantially has the shape of a rectangle with shorter sides extending in the x-direction and longer sides extending in the y-direction. The length of the die pad portion 42CB in the y-direction is longer than the length of the lead portion 42CA in the y-direction. As shown in FIG. 2, the die pad portion 42CB protrudes beyond the opposite sides of the lead portion 42CA in the y-directions. The sealing plastic 80 is present on opposite sides in the x-direction of the die pad portion 42CB. The die pad portion 42CB thus limits movement of the first lead frame 40C relative to the sealing plastic 80 in the x-direction.

The die pad portion 42CB has a recessed section 44C. The recessed section 44C is provided at one of the end portions in the y-direction of the die pad portion 42CB that is closer to the second lead portion 42BB. The recessed section 44C opens toward the second lead portion 42BB. The recessed section 44C is closer to the lead portion 42CA than the center in the x-direction of the die pad portion 42CB.

The first lead frame 40D is closer to the fourth plastic side surface 84 than the first lead frames 40A to 40C. The first lead frame 40D includes the terminal 41D. The terminal 41D is the section of the first lead frame 40D that projects from the first plastic side surface 81 to the outside of the sealing plastic 80.

An inner lead 42D, which is the section of the first lead frame 40D that is located within the sealing plastic 80, extends in the x-direction. As viewed in the z-direction, the distal end of the inner lead 42D is closer to the first plastic side surface 81 than the center in the x-direction of the sealing plastic 80. The section at the distal end of the inner lead 42D includes a through-hole 43D. As viewed in the z-direction, the through-hole 43D substantially has the shape of a rectangle with longer sides extending in the x-direction and shorter sides extending in the y-direction. The through-hole 43D is filled with the sealing plastic 80. The sealing plastic 80 in the through-hole 43D limits movement of the first lead frame 40D relative to the sealing plastic 80 in directions perpendicular to the z-direction.

The distal end of the inner lead 42D includes a projection 44D extending toward the third plastic side surface 83. In this embodiment, the projection 44D extends in the y-direction. The distal end of the projection 44D is spaced apart from the fourth plastic side surface 84 in the y-direction. That is, the projection 44D is not exposed from the fourth plastic side surface 84. The sealing plastic 80 is present on opposite sides in the x-direction of the projection 44D. The projection 44D thus limits movement of the first lead frame 40D relative to the sealing plastic 80 in the x-direction.

As shown in FIG. 2, as viewed in the z-direction, the first lead frame 40D has a shape that is symmetrical to the first lead frame 40A with respect to a straight line extending in the x-direction at the center in the y-direction of the sealing plastic 80.

As shown in FIG. 2, the light emitting element 20 is mounted on the die pad portion 42CB of the first lead frame 40C. Specifically, the light emitting element 20 is located at one of the end portions in the x-direction of the die pad portion 42CB that is closer to the second plastic side surface 82. The light emitting element 20 is located at a position on the die pad portion 42CB that is closer to the second lead portion 42BB of the first lead frame 40B than the lead portion 42CA in the y-direction. As viewed in the x-direction, the light emitting element 20 overlaps with the recessed section 44C of the die pad portion 42CB.

As viewed in the z-direction, the light emitting element 20 is located at the center in the y-direction of the sealing plastic 80. The light emitting element 20 is also located closer to the first plastic side surface 81 than the center in the x-direction of the sealing plastic 80. The shape of the light emitting element 20, as viewed in the z-direction, is rectangular. In this embodiment, the shape of the light emitting element 20, as viewed in the z-direction, is a square.

A wire WA connects the light emitting element 20 to the second lead portion 42BB of the first lead frame 40B. The wire WA is a bonding wire, which may be formed of a wire bonding device (not shown). The wire WA may be made of a conductive material such as Cu, aluminum (Al), gold (Au), or Ag. In this embodiment, the wire WA is made of a material containing Au.

The light receiving element 30 is mounted on the second lead frame 50. The second lead frame 50 includes second lead frames 50A to 50D as four second lead frames. As viewed in the z-direction, the second lead frames 50A to 50D are arranged at the side of the center in the x-direction of the sealing plastic 80 corresponding to the second plastic side surface 82. As viewed in the z-direction, the second lead frames 50A to 50D are spaced apart from each other in the y-direction.

The second lead frame 50A is closer to the third plastic side surface 83 than the second lead frames 50B to 50D. The second lead frame 50A includes the terminal 51A. The terminal 51A is the section of the second lead frame 50A that projects from the second plastic side surface 82 to the outside of the sealing plastic 80. In this embodiment, the terminal 51A overlaps with the terminal 41A as viewed in the x-direction.

The inner lead 52A, which is the section of the second lead frame 50A located within the sealing plastic 80, includes a lead portion 52AA and a die pad portion 52AB. In this embodiment, the die pad portion 52AB corresponds to a second die pad.

As viewed in the z-direction, the lead portion 52AA includes a first section, which extends from the second plastic side surface 82 in the x-direction, a second section, which is inclined toward the fourth plastic side surface 84 as it extends from the first section toward the first plastic side surface 81, and a third section, which extends from the second section in the x-direction and is continuous with the die pad portion 52AB.

The lead portion 52AA includes a through-hole 53A. The through-hole 53A is formed in the first and second sections. Specifically, the through-hole 53A is formed from a section of the first section near the second section to a section of the second section near the third section. As viewed in the z-direction, the through-hole 53A includes a first through section, which extends in the x-direction, and a second through section, which is inclined from the third plastic side surface 83 toward the fourth plastic side surface 84 as it extends in the direction from the second plastic side surface 82 toward the first plastic side surface 81. The first through section is located in the first section of the lead portion 52AA, and the second through section is located in the second section of the lead portion 52AA. The through-hole 53A is filled with the sealing plastic 80. The sealing plastic 80 in the through-hole 53A limits movement of the second lead frame 50A relative to the sealing plastic 80 in directions perpendicular to the z-direction.

In the present embodiment, as viewed in the z-direction, opposite edges in the x-direction of the third section include a first edge closer to the third plastic side surface 83 and a second edge closer to the fourth plastic side surface 84. The first and second edges are inclined so as to be closer to the fourth plastic side surface 84 at locations closer to the die pad portion 52AB. The angle of inclination of the second edge of the third section with respect to the x-direction is greater than the angle of inclination of the first edge of the third section with respect to the x-direction. As such, as viewed in the z-direction, the third section is tapered such that the width dimension of the third section (dimension in the y-direction) increases toward the die pad portion 52AB. Also, the inclination angle of the first edge of the third section with respect to the x-direction and the inclination angle of the second edge of the third section with respect to the x-direction are both less than the inclination angle of the second section with respect to the x-direction.

The die pad portion 52AB is closer to the first plastic side surface 81 than the lead portion 52AA in the x-direction. In this embodiment, as viewed in the z-direction, the die pad portion 52AB is located at the center in the y-direction of the sealing plastic 80. As viewed in the z-direction, the die pad portion 52AB substantially has the shape of a rectangle with shorter sides extending in the x-direction and longer sides extending in the y-direction. The die pad portion 52AB is opposed to both of the first lead frames 40B and 40C in the x-direction. That is, the die pad portion 52AB extends in the y-direction so as to be opposed to both of the first lead frames 40B and 40C in the x-direction. As such, the length of the die pad portion 52AB in the y-direction is longer than the length of the die pad portion 42CB of the first lead frame 40C in the y-direction.

The die pad portion 52AB is closer to the second plastic side surface 82 than the first lead frames 40B and 40C. As viewed in the z-direction, the die pad portion 52AB is closer to the second plastic side surface 82 than the center in the x-direction of the sealing plastic 80. In this embodiment, one of the edges in the x-direction of the die pad portion 52AB that is closer to the first plastic side surface 81 is closer to the center in the x-direction of the sealing plastic 80 than one of the edges in the x-direction of each of the first lead frames 40B and 40C that is closer to the second plastic side surface 82. That is, the die pad portion 52AB is closer to the center in the x-direction of the sealing plastic 80 than the die pad portion 42CB.

The die pad portion 52AB includes a recess 54A. The recess 54A is formed in the end portion of the die pad portion 52AB that is closer to the second plastic side surface 82 and closer to the fourth plastic side surface 84. The recess 54A is open toward the second plastic side surface 82 and the fourth plastic side surface 84.

The die pad portion 52AB includes a suspension lead 55A. The suspension lead 55A extends in the x-direction toward the second plastic side surface 82 from one of the edges in the x-direction of the die pad portion 52AB that is closer to the second plastic side surface 82. In this embodiment, the suspension lead 55A is provided at the center in the y-direction of the die pad portion 52AB. It may be considered that the suspension lead 55A is located at the center in the y-direction of the sealing plastic 80 as viewed in the z-direction. The suspension lead 55A is exposed from the second plastic side surface 82.

The second lead frame 50B is closer to the fourth plastic side surface 84 than the second lead frame 50A. The second lead frame 50B includes the terminal 51B. The terminal 51B is the section of the second lead frame 50B that projects from the second plastic side surface 82 to the outside of the sealing plastic 80. In this embodiment, the terminal 51B overlaps with the terminal 41B as viewed in the x-direction.

An inner lead 52B, which is the section of the second lead frame 50B that is located within the sealing plastic 80, extends in the x-direction. As viewed in the z-direction, the distal end of the inner lead 52B is closer to the second plastic side surface 82 than the center in the x-direction of the sealing plastic 80. Specifically, the distal end of the inner lead 52B is closer to the second plastic side surface 82 than the die pad portion 52AB of the second lead frame 50A. One of the end portions in the y-direction of the inner lead 52B that is closer to the lead portion 52AA of the second lead frame 50A has an inclined section that is inclined to be closer to the fourth plastic side surface 84 at locations closer to the distal end of the inner lead 52B. As shown in FIG. 2, the inner lead 52B is form to be tapered toward its distal end.

The section at the distal end of the inner lead 52B includes a through-hole 53B. As viewed in the z-direction, the through-hole 53B has a substantially trapezoidal shape that has longer sides extending in the x-direction and shorter sides extending in the y-direction and is tapered toward the distal end of the inner lead 52B. The through-hole 53B is filled with the sealing plastic 80. The sealing plastic 80 in the through-hole 53B limits movement of the second lead frame 50B relative to the sealing plastic 80 in directions perpendicular to the z-direction.

A section of the inner lead 52B spaced apart from the second plastic side surface 82 in the x-direction includes a protruding portion 54B, which protrudes in the y-direction beyond the section that is closer to the second plastic side surface 82. The protruding portion 54B protrudes away from the lead portion 52AA. The sealing plastic 80 is present on opposite sides in the x-direction of the protruding portion 54B. This limits movement of the second lead frame 50B relative to the sealing plastic 80 in the x-direction.

The second lead frame 50C is closer to the fourth plastic side surface 84 than the second lead frame 50B. Specifically, the second lead frame 50C is closer to the fourth plastic side surface 84 than the suspension lead 55A of the second lead frame 50A. In other words, the suspension lead 55A is located between and spaced apart from the second lead frames 50B and 50C in the y-direction. In the present embodiment, the suspension lead 55A is at the midpoint between the terminals 51B and 51C in the y-direction of the second plastic side surface 82.

The second lead frame 50C includes the terminal 51C. The terminal 51C is the section of the second lead frame 50C that projects from the second plastic side surface 82 to the outside of the sealing plastic 80. In this embodiment, the terminal 51C overlaps with the terminal 41C as viewed in the x-direction.

An inner lead 52C, which is the section of the second lead frame 50C that is located within the sealing plastic 80, extends in the x-direction. As viewed in the z-direction, the distal end of the inner lead 52C is closer to the second plastic side surface 82 than the center in the x-direction of the sealing plastic 80. Specifically, the distal end of the inner lead 52C is closer to the second plastic side surface 82 than the die pad portion 52AB of the second lead frame 50A.

The section at the distal end of the inner lead 52C includes a through-hole 53C. As viewed in the z-direction, the through-hole 53C has the shape of a rectangle with longer sides extending in the x-direction and shorter sides extending in the y-direction. The through-hole 53C is filled with the sealing plastic 80. The sealing plastic 80 in the through-hole 53C limits movement of the second lead frame 50C relative to the sealing plastic 80 in directions perpendicular to the z-direction.

The distal end of the inner lead 52C includes a projection 54C extending toward the third plastic side surface 83. In this embodiment, the projection 54C extends in the y-direction. The sealing plastic 80 is present on opposite sides in the x-direction of the projection 54C. The projection 54C thus limits movement of the second lead frame 50C relative to the sealing plastic 80 in the x-direction.

The second lead frame 50D is closer to the fourth plastic side surface 84 than the second lead frame 50C. The second lead frame 50D includes the terminal 51D. The terminal 51D is the section of the second lead frame 50D that projects from the second plastic side surface 82 to the outside of the sealing plastic 80. In this embodiment, the terminal 51D overlaps with the terminal 41D as viewed in the x-direction.

An inner lead 52D, which is the section of the second lead frame 50D located within the sealing plastic 80, includes a first section, which extends in the x-direction, a second section, which is inclined toward the third plastic side surface 83 as it extends from the first section toward the first plastic side surface 81, and a third section, which extends from the second section toward the recess 54A of the die pad portion 52AB.

The inner lead 52D includes a through-hole 53D. The through-hole 53D is formed in the first and second sections. Specifically, the through-hole 53D extends from a section of the first section near the second section to a section of the second section near the third section. As viewed in the z-direction, the through-hole 53D includes a first through section, which extends in the x-direction, and a second through section, which is inclined from the fourth plastic side surface 84 toward the third plastic side surface 83 as it extends in the direction from the second plastic side surface 82 toward the first plastic side surface 81. The first through section is located in the first section of the inner lead 52D, and the second through section is located in the second section of the inner lead 52D. The through-hole 53D is filled with the sealing plastic 80. The sealing plastic 80 in the through-hole 53D limits movement of the second lead frame 50D relative to the sealing plastic 80 in directions perpendicular to the z-direction.

The third section is located within the recess 54A of the die pad portion 52AB. The third section includes a section closer to the first plastic side surface 81 than the second lead frames 50B and 50C in the x-direction. As viewed in the x-direction, the third section overlaps with the die pad portion 42CB of the first lead frame 40C.

In the present embodiment, as viewed in the z-direction, opposite edges in the x-direction of the third section include a first edge, which is closer to the third plastic side surface 83 and extends in the x-direction, and a second edge, which is closer to the fourth plastic side surface 84 and inclined to be closer to the third plastic side surface 83 at locations closer to the die pad portion 52AB. As such, as viewed in the z-direction, the third section is formed such that the width dimension of the third section (dimension in the y-direction) decreases toward the die pad portion 52AB. Also, the angle of inclination of the second edge with respect to the x-direction is less than the angle of inclination of the second section with respect to the x-direction.

As shown in FIG. 2, the light receiving element 30 is mounted on the die pad portion 52AB of the second lead frame 50A. Specifically, the light receiving element 30 is located on one of the end portions in the x-direction of the die pad portion 52AB that is closer to the second plastic side surface 82. The light receiving element 30 is arranged in the center in the y-direction of the die pad portion 52AB. The light receiving element 30 overlaps with the second lead frames 50B and 50C, as viewed in the x-direction. The light receiving element 30 is closer to the third plastic side surface 83 than the second lead frame 50D in the y-direction. On the other hand, as viewed in the y-direction, the light receiving element 30 overlaps with the third section of the second lead frame 50D.

As viewed in the z-direction, the light receiving element 30 is arranged at the center in the y-direction of the sealing plastic 80. As viewed in the x-direction, the light receiving element 30 is thus aligned with the light emitting element 20. It may also be considered that the light receiving element 30 is opposed to the light emitting element 20 in the x-direction. Also, the light receiving element 30 is closer to the second plastic side surface 82 than the center in the x-direction of the sealing plastic 80.

The shape of the light receiving element 30 as viewed in the z-direction is rectangular. In the present embodiment, as viewed in the z-direction, the light receiving element 30 has the shape of a rectangle with shorter sides extending in the x-direction and longer sides extending in the y-direction. The light receiving element 30 is configured to receive light from the light emitting element 20. The light receiving element 30 includes a first semiconductor region, which receives light from the light emitting element 20, and a second semiconductor region, which generates a signal according to the received light. The first semiconductor region includes a photoelectric conversion element. The photoelectric conversion element may be a photodiode, for example. The second semiconductor region may be formed by a large scale integration (LSI), for example. That is, the light receiving element 30 of the present embodiment is an element in which the function of receiving light from the light emitting element 20 and the function of generating a signal from the received light are integrated. As viewed in the z-direction, the first and second semiconductor regions are formed side by side in the x-direction. The first semiconductor region is formed in a section of the light receiving element 30 closer to the light emitting element 20 as viewed in the z-direction. The second semiconductor region is formed in a section of the light receiving element 30 closer to the second lead frames 50B and 50C. The area of the first semiconductor region as viewed in the z-direction is smaller than the area of the second semiconductor region as viewed in the z-direction. As viewed in the z-direction, the dimension of the first semiconductor region in the x-direction is smaller than the dimension of the second semiconductor region in the x-direction. As viewed in the z-direction, the first semiconductor region of the light receiving element 30 forms a light receiving surface 33.

As viewed in the z-direction, the area of the light receiving element 30 is larger than the area of the light emitting element 20. In one example, as viewed in the z-direction, the area of the light receiving element 30 is at least twice as large as, preferably five times as large as, the area of the light emitting element 20. In this embodiment, as viewed in the z-direction, the area of the light receiving element 30 is about ten times as large as the area of the light emitting element 20.

Wires WB1 to WB4 connect the light receiving element 30 to the second lead frames 50A to 50D, respectively. As with the wire WA, the wire WB1 to WB4 are bonding wires formed by wire bonding devices (not shown), for example. The wires WB1 to WB4 are made of a conductive material (Au in this embodiment) in the same manner as the wire WA. In the present embodiment, two wires WB1 connect the second semiconductor region of the light receiving element 30 to the third section of the lead portion 52AA of the second lead frame 50A. One wire WB2 connects the second semiconductor region of the light receiving element 30 to a section of the inner lead 52B of the second lead frame 50B that is closer to the distal end than the through-hole 53B. Two wires WB3 connect the second semiconductor region of the light receiving element 30 to a section of the inner lead 52C of the second lead frame 50C that is closer to the distal end than the through-hole 53C. Two wires WB4 connect the second semiconductor region of the light receiving element 30 to the third section of the inner lead 52D of the second lead frame 50D. These wires WB1 to WB4 are connected to the outer peripheral section of the second semiconductor region of the light receiving element 30 as viewed in the z-direction.

Figure 4:
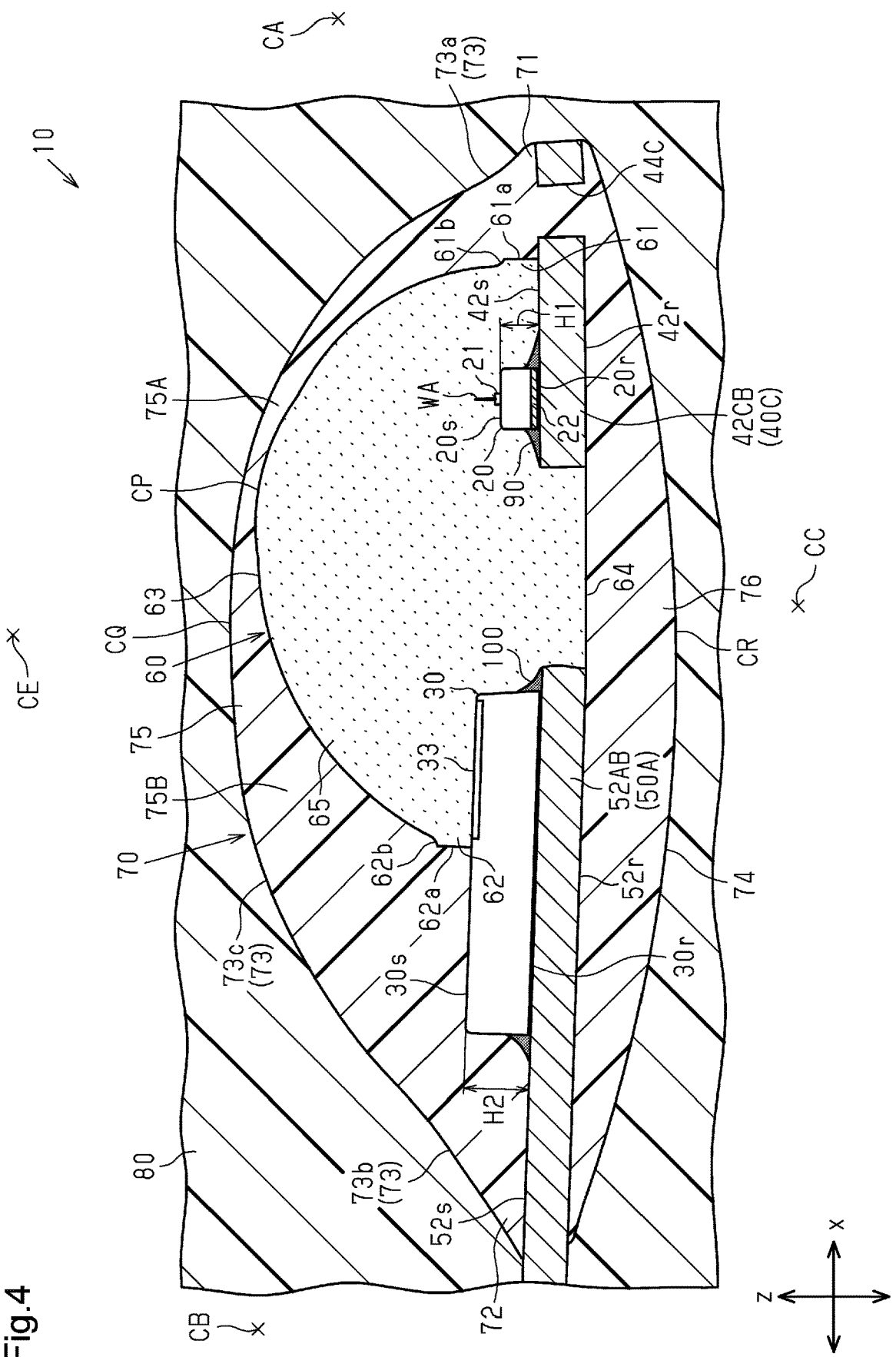
FIG. 4 is a partially enlarged view of the insulation module of FIG. 3.
Figure 5:
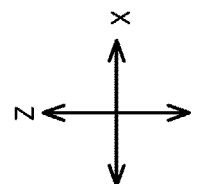
FIG. 5 is an enlarged view of a light emitting element and its surrounding area in the insulation module of FIG. 4.
Figure 6:
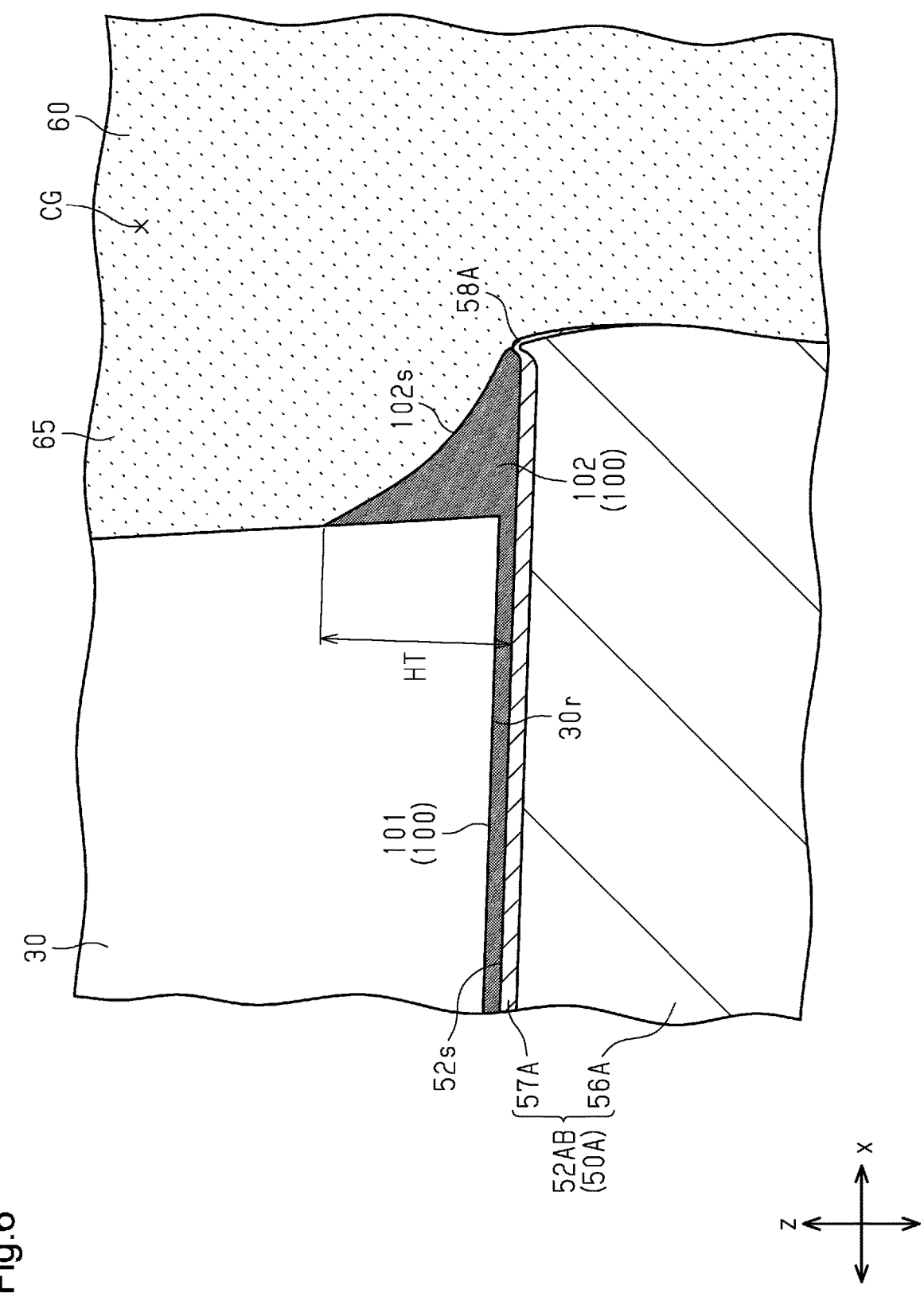
FIG. 6 is an enlarged view of a part of the light receiving element and its surrounding area in the insulation module of FIG. 4.
Figure 7:
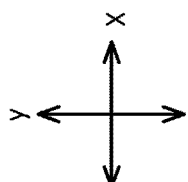
FIG. 7 is an enlarged view of the light emitting element, the light receiving element, and their surrounding areas in the insulation module of FIG. 2.

FIG. 3 shows the cross-sectional structure of the insulation module 10. FIG. 4 is an enlarged view mainly showing the structure inside a reflection member 70, which will be described below, of the cross-sectional structure of the insulation module 10. FIG. 5 is an enlarged view mainly showing the light emitting element 20 and the structure around it within the cross-sectional structure of the insulation module 10. FIG. 6 is an enlarged view mainly showing the light receiving element 30 and the structure around it within the cross-sectional structure of the insulation module 10. FIG. 7 is a schematic plan view in which the transparent plastic 60 and the reflection member 70 are added to FIG. 2 and the reflection member 70 and its surrounding area are enlarged. In FIG. 3, for the sake of convenience, some of the terminals 41 and 51 are omitted.

As shown in FIG. 3, in the present embodiment, the die pad portion 42CB of the first lead frame 40C is slightly inclined toward the plastic rear surface 80r as it extends from the first plastic side surface 81 toward the second plastic side surface 82. The inclination angle of the die pad portion 42CB with respect to the direction (horizontal direction) perpendicular to the z-direction may be in a range of 10 to 2°, for example. However, the inclination angle of the die pad portion 42CB with respect to the horizontal direction is not limited to this, and may be greater than 0° and less than or equal to 10°, for example. Also, the inclination angle of the die pad portion 42CB with respect to the horizontal direction may be in a range of 2° to 3°, 3° to 4°, 4° to 5°, 5° to 6°, 6° to 7°, or 7° to 8°.

The die pad portion 42CB includes a pad surface 42s and a pad rear surface 42r, which face away from each other in the thickness direction of the die pad portion 42CB. The pad surface 42s forms a mount surface on which the light emitting element 20 is mounted. That is, in this embodiment, the pad surface 42s corresponds to a first die pad mount surface. The pad surface 42s faces the same side as the plastic main surface 80s of the sealing plastic 80.

The pad rear surface 42r faces the same side as the plastic rear surface 80r of the sealing plastic 80. The pad rear surface 42r is spaced apart from the plastic rear surface 80r in the z-direction. In other words, the pad rear surface 42r is not exposed from the plastic rear surface 80r.

As shown in FIG. 5, the die pad portion 42CB includes a main metal layer 45C and a plating layer 46C formed on the outer surface of the main metal layer 45C. The main metal layer 45C is made of a metal material containing Cu, for example. The plating layer 46C is made of a material containing nickel (Ni), chromium (Cr), and the like. As shown in FIG. 5, the plating layer 46C is sufficiently thin as compared to the main metal layer 45C.

The light emitting element 20 includes an element main surface 20s and an element rear surface 20r, which face away from each other in the thickness direction. The element main surface 20s faces the same side as the pad surface 42s, and the element rear surface 20r faces the same side as the pad rear surface 42r (see FIG. 3).

A first electrode 21 is provided on the element main surface 20s. The first electrode 21 may be provided at the center of the element main surface 20s in both the x-direction and the y-direction, for example. A second electrode 22 is provided on the element rear surface 20r. The second electrode 22 may be provided over the entire element rear surface 20r, for example. In this embodiment, the element main surface 20s forms a light emitting surface.

The light emitting element 20 is bonded to the pad surface 42s of the die pad portion 42CB of the first lead frame 40C with a conductive bonding material 90 (see FIG. 5). In one example, the light emitting element 20 is attached to the die pad portion 42CB through die bonding using the conductive bonding material 90 so that light emitting element 20 is bonded to the die pad portion 42CB. The conductive bonding material 90 is interposed between the pad surface 42s of the die pad portion 42CB and the element rear surface 20r of the light emitting element 20. In this embodiment, the conductive bonding material 90 corresponds to a first bonding material.

The conductive bonding material 90 may be made of a material that reflects light from the light emitting element 20P, for example. The conductive bonding material 90 is made of a conductive material such as solder or sliver (Ag) paste. Solder and Ag paste reflect light.

The conductive bonding material 90 includes a first bonding region 91, which is interposed between the element rear surface 20r of the light emitting element 20 and the pad surface 42s of the die pad portion 42CB, and a second bonding region 92, which protrudes from the light emitting element 20 as viewed in the z-direction and is bonded to the outer side surface of the light emitting element 20.

The second bonding region 92 is provided such that its thickness is smaller at locations farther from the section at which the second bonding region 92 is bonded to the outer side surface of the light emitting element 20. The second bonding region 92 is formed around the entire periphery of the light emitting element 20 as viewed in the z-direction.

The second bonding region 92 has a surface 92s, which is formed in a curved shape such that the center of curvature CF is located above the surface 92s, that is, the center of curvature CF is located at the opposite side of the surface 92s from the die pad portion 42CB in the z-direction. The curvature of a region of the surface 92s of the second bonding region 92 that is adjacent to the light emitting element 20 is larger than the curvature of a region of the surface 92s of the second bonding region 92 that is farther from the light emitting element 20.

The height HS of the section of the second bonding region 92 that is in contact with the outer side surface of the light emitting element 20 is less than or equal to ½ of the height H1 of the light emitting element 20. In this embodiment, the height HS is less than ½ of the height H1. The height HS is defined by the height of the section of the second bonding region 92 that is in contact with the outer side surface of the light emitting element 20 from the pad surface 42s of the die pad portion 42CB. In other words, the height HS may be considered as the thickness of the section of the second bonding region 92 that is in contact with the outer side surface of the light emitting element 20. The height H1 is defined by the distance between the pad surface 42s of the die pad portion 42CB and the element main surface 20s of the light emitting element 20 in the z-direction.

As shown in FIG. 2, the light emitting element 20 is electrically connected to the first lead frames 40B and 40C. Specifically, the wire WA electrically connects the first electrode 21 of the light emitting element 20 to the first lead frame 40B. As shown in FIG. 5, the conductive bonding material 90 electrically connects the second electrode 22 of the light emitting element 20 to the first lead frame 40C. In one example, the first electrode 21 is a cathode electrode, and the second electrode 22 is an anode electrode. Thus, as shown in FIG. 2, the terminal 41C forms an anode terminal, and the terminal 41B forms a cathode terminal.

As shown in FIGS. 3 and 4, in this embodiment, the die pad portion 52AB of the second lead frame 50A is slightly inclined toward the plastic rear surface 80r as it extends from the second plastic side surface 82 toward the first plastic side surface 81. In other words, it may be considered that the die pad portion 52AB and the die pad portion 42CB of the first lead frame 40C are inclined toward the plastic rear surface 80r as they extend toward each other. The inclination angle of the die pad portion 52AB with respect to the direction (horizontal direction) perpendicular to the z-direction may be in a range of 1° to 2°, for example. However, the inclination angle of the die pad portion 52AB with respect to the horizontal direction is not limited to this, and may be greater than 0° and less than or equal to 10°, for example. Also, the inclination angle of the die pad portion 52AB with respect to the horizontal direction may be in a range of 2° to 3°, 3° to 4°, 4° to 5°, 5° to 6°, 6° to 7°, or 7° to 8°.

The die pad portion 52AB includes a pad surface 52s and a pad rear surface 52r, which face away from each other in the thickness direction of the die pad portion 52AB. The pad surface 52s forms a mount surface on which the light receiving element 30 is mounted. That is, in this embodiment, the pad surface 52s corresponds to a second die pad mount surface. The pad surface 52s faces the same side as the pad surface 42s of the die pad portion 42CB.

The pad rear surface 52r faces the same side as the pad rear surface 42r of the die pad portion 42CB. The pad rear surface 52r is spaced apart from the plastic rear surface 80r in the z-direction. In other words, the pad rear surface 52r is not exposed from the plastic rear surface 80r.

As shown in FIG. 6, the die pad portion 52AB includes a main metal layer 56A and a plating layer 57A formed on the outer surface of the main metal layer 56A. The main metal layer 56A is made of a metal material containing Cu, for example. The plating layer 57A is made of a material containing Ni, Cr, and the like. As shown in FIG. 6, the plating layer 57A is sufficiently thin as compared to the main metal layer 56A.

One of the end portions in the x-direction of the die pad portion 52AB that is closer to the first plastic side surface 81 (see FIG. 2) includes a projection 58A. The projection 58A extends upward. Specifically, the projection 58A is formed by the main metal layer 56A and the plating layer 57A. The thickness of the plating layer 57A at the projection 58A is thinner than the thickness of the section of the plating layer 57A that forms the pad surface 52s.

The height of the section of the projection 58A formed by the main metal layer 56A is equal to the thickness of the section of the plating layer 57A that forms the pad surface 52s. For example, when the difference between the height of the section of the projection 58A formed by the main metal layer 56A and the thickness of the section of the plating layer 57A that forms the pad surface 52s is within 20% of the height of the section of the projection 58A formed by the main metal layer 56A, the height of the section of the projection 58A formed by the main metal layer 56A may be considered equal to the thickness of the section of the plating layer 57A that forms the pad surface 52s.

As shown in FIGS. 2 to 4, the light receiving element 30 is bonded to the pad surface 52s of the die pad portion 52AB of the second lead frame 50A with a conductive bonding material 100 (see FIG. 6).

As shown in FIG. 6, the conductive bonding material 100 is interposed between the pad surface 52s of the die pad portion 52AB and the element rear surface 30r of the light receiving element 30. In this embodiment, the conductive bonding material 100 corresponds to a second bonding material.

The conductive bonding material 100 may be made of a material that reflects light from the light emitting element 20P, for example. The conductive bonding material 100 is made of a conductive material such as solder or Ag paste.

The conductive bonding material 100 includes a first bonding region 101, which is interposed between the element rear surface 30r of the light receiving element 30 and the pad surface 52s of the die pad portion 52AB, and a second bonding region 102, which protrudes from the light receiving element 30 as viewed in the z-direction and is bonded to the outer side surface of the light receiving element 30.

The second bonding region 102 is provided such that its thickness is smaller at locations farther from the section at which the second bonding region 102 is bonded to the outer side surface of the light receiving element 30. The second bonding region 102 is formed around the entire periphery of the light receiving element 30 as viewed in the z-direction.

The second bonding region 102 has a surface 102s, which is formed in a curved shape such that the center of curvature CG is located above the surface 102s, that is, the center of curvature CG is located at the opposite side of the surface 102s from the die pad portion 52AB in the z-direction. The curvature of a region of the surface 102s of the second bonding region 102 that is adjacent to the light receiving element 30 is larger than the curvature of a region of the surface 102s of the second bonding region 102 that is farther from the light receiving element 30.

The height HT of the section of the second bonding region 102 that is in contact with the outer side surface of the light receiving element 30 is less than or equal to ½ of the height H2 of the light receiving element 30 (see FIG. 4). In this embodiment, the height HT is less than ½ of the height H2. The height HT is defined by the height of the section of the second bonding region 102 that is in contact with the outer side surface of the light receiving element 30 from the pad surface 52s of the die pad portion 52AB. In other words, the height HT may be considered as the thickness of the section of the second bonding region 102 that is in contact with the outer side surface of the light receiving element 30. The height H2 is defined by the distance between the pad surface 52s of the die pad portion 52AB and the element main surface 30s of the light receiving element 30 in the z-direction.

The light receiving element 30 is located on one of the end portions in the x-direction of the die pad portion 52AB that is closer to the first plastic side surface 81 (see FIG. 2). The projection 58A limits the spreading of the second bonding region 102 located on one of the end portions in the x-direction of the die pad portion 52AB that is closer to the first plastic side surface 81 (see FIG. 2), from the die pad portion 52AB toward the first plastic side surface 81.

As shown in FIG. 4, the thickness of the light emitting element 20 (the dimension of the light emitting element 20 in the z-direction) is less than the thickness of the light receiving element 30 (the dimension of the light receiving element 30 in the thickness direction of the die pad portion 52AB). The position in the z-direction of the pad surface 42s of the die pad portion 42CB is generally the same as the position in the z-direction of the pad surface 52s of the die pad portion 52AB. Thus, the height H2 of the light receiving element 30 is higher than the height H1 of the light emitting element 20. That is, the light receiving surface 33 of the light receiving element 30 is located at a position higher than the element main surface 20s (light emitting surface) of the light emitting element 20.

As shown in FIGS. 3 and 4, the insulation module 10 includes the transparent plastic 60 and the reflection member 70.

The transparent plastic 60 is made of a resin material that can transmit light from the light emitting element 20. The transparent plastic 60 may be made of transparent epoxy resin, acrylic resin, or silicone resin, for example. The transparent plastic 60 is formed by potting, for example.

The transparent plastic 60 at least covers both the light emitting element 20 and the light receiving element 30. Specifically, as viewed in the z-direction, the transparent plastic 60 covers the entire light emitting element 20 and a part of the light receiving element 30.

The transparent plastic 60 covers a section of the light receiving element 30 that is closer to the light emitting element 20 than the center in the x-direction of the light receiving element 30. In this embodiment, the transparent plastic 60 covers the first semiconductor region of the light receiving element 30. That is, the transparent plastic 60 covers the light receiving surface 33 of the light receiving element 30. On the other hand, as shown in FIG. 7, the transparent plastic 60 does not cover the second semiconductor region of the light receiving element 30. As such, each of the wires WB1 to WB4 connected to the light receiving element 30 is located outside the transparent plastic 60. The wires WB1 to WB4 are located within the reflection member 70.

The transparent plastic 60 covers most of the die pad portion 42CB including the light emitting element 20 in the x-direction. Specifically, the transparent plastic 60 covers a section of the die pad portion 42CB at the opposite side of the light emitting element 20 from the light receiving element 30 in the x-direction. In this embodiment, the transparent plastic 60 covers a section of the die pad portion 42CB that extends to a point closer to the first plastic side surface 81 (see FIG. 3) than the center of the die pad portion 42CB in the x-direction. As such, a part of the single wire WA connected to the light emitting element 20 is located within the transparent plastic 60. The remaining part of the wire WA is located outside the transparent plastic 60, that is, inside the reflection member 70. In other words, the wire WA extends from the transparent plastic 60 to the reflection member 70.

The transparent plastic 60 is also located in the section between the light emitting element 20 and the light receiving element 30 in the x-direction. The transparent plastic 60 is also located in the section between the die pad portion 42CB of the first lead frame 40C and the die pad portion 52AB of the second lead frame 50A in the x-direction. In this embodiment, the lower end surface 64 of the transparent plastic 60 is located at the same position in the z-direction as the pad rear surface 42r of the die pad portion 42CB. The transparent plastic 60 is therefore in contact with one of the opposite side surfaces in the x-direction of the die pad portion 42CB that is closer to the die pad portion 52AB and also one of the opposite side surfaces in the x-direction of the die pad portion 52AB that is closer to the die pad portion 42CB. In this embodiment, in the cross-sectional structure of the transparent plastic 60 taken along an xz plane, the lower end surface 64 of the transparent plastic 60 is formed as a straight line extending in the x-direction.

As shown in FIG. 5, the transparent plastic 60 covers the light emitting element 20 and the pad surface 42s of the die pad portion 42CB. Thus, the transparent plastic 60 is in contact with the second bonding region 92, which is the section of the conductive bonding material 90 that protrudes from the light emitting element 20. Also, as shown in FIG. 6, the transparent plastic 60 covers the first semiconductor region of the light receiving element 30 and the section of the die pad portion 52AB that is closer to the die pad portion 42CB than the light receiving element 30. Thus, the transparent plastic 60 is in contact with the section of the second bonding region 102, which is the section of the conductive bonding material 100 that protrudes from the light receiving element 30, that is closer to the light emitting element 20 than the light receiving element 30.

As shown in FIG. 7, the transparent plastic 60 covers the entire first semiconductor region of the light receiving element 30 in the y-direction as viewed in the z-direction. That is, as viewed in the z-direction, the y-direction dimension of the section of the transparent plastic 60 that covers the light receiving element 30 is greater than the y-direction dimension of the light receiving element 30.

As shown in FIG. 4, in the cross-sectional structure of the transparent plastic 60 taken along an xz plane, the transparent plastic 60 includes a first end portion 61, which is closer to the light emitting element 20 in the x-direction, a second end portion 62, which is closer to the light receiving element 30 in the x-direction, and a curved surface 63, which has a convex shape bulging upward.

The first end portion 61 is located at the opposite side of the light emitting element 20 from the light receiving element 30 in the x-direction. The first end portion 61 is spaced apart from the light emitting element 20 in the x-direction. Specifically, the first end portion 61 is spaced apart from the conductive bonding material 90 in the x-direction. In the present embodiment, the first end portion 61 is located at a position closer to the first plastic side surface 81 (see FIG. 3) than the center in the x-direction of the die pad portion 42CB. As such, the transparent plastic 60 is also provided on the opposite side of the light emitting element 20 from the light receiving element 30 in the x-direction.

In the cross-sectional structure of the transparent plastic 60 taken along an xz plane, the first end portion 61 includes a first section 61a, which extends in the z-direction, and a second section 61b, which is inclined toward the light emitting element 20 as it extends from the first section 61a in the z-direction. The first section 61a is formed to stand upright from the pad surface 42s of the die pad portion 42CB. The second section 61b connects the first section 61a to the curved surface 63.

The distance between the first section 61a of the first end portion 61 and the light emitting element 20 in the x-direction is longer than the length of the light emitting element 20 in the x-direction. The distance between the conductive bonding material 90 and the first section 61a in the x-direction is longer than the length of the light emitting element 20 in the x-direction.

The second end portion 62 overlaps with the second semiconductor region of the light receiving element 30 as viewed in the z-direction. In other words, the second end portion 62 is adjacent to the light receiving surface 33 of the light receiving element 30 in the x-direction. As such, the transparent plastic 60 is not provided on the section of the second semiconductor region of the light receiving element 30 that is at the opposite side of the second end portion 62 from the light receiving surface 33. The transparent plastic 60 covers the light receiving surface 33 of the light receiving element 30.

In the cross-sectional structure of the transparent plastic 60 taken along an xz plane, the second end portion 62 has a first section 62a, which extends in the z-direction, and a second section 62b, which is inclined toward the light emitting element 20 as it extends from the first section 62a in the z-direction. The first section 62a is formed to stand upright from the pad surface 52s of the die pad portion 52AB. The second section 62b connects the first section 62a to the curved surface 63. As shown in FIGS. 3 and 4, the position in the z-direction of the second end portion 62 on the light receiving element 30 is higher than the position in the z-direction of the first end portion 61 on the die pad portion 42CB.

In the cross-sectional structure of the transparent plastic 60 taken along an xz plane, the curved surface 63 is formed to connect the first end portion 61 and the second end portion 62. The curved surface 63 is located above both the element main surface 20s of the light emitting element 20 and the element main surface 30s of the light receiving element 30.

Since the second end portion 62 is located higher than the first end portion 61, the curved shape of the curved surface 63 is not a uniform curved shape. Specifically, the radius of curvature of a section of the curved surface 63 closer to the first end portion 61 is less than the radius of curvature of a section of the curved surface 63 closer to the second end portion 62. As such, the uppermost position of the curved surface 63, that is, the position at which the curved surface 63 changes from curving upward to curving downward (hereinafter referred to as an inflection position CP), is closer in the x-direction to the first end portion 61 than the center in the x-direction of the curved surface 63. The inflection position CP is closer to the light emitting element 20 than to the light receiving element 30 in the x-direction.

The thickness of the transparent plastic 60 in the section in which the curved surface 63 overlaps with the light emitting element 20 as viewed in the z-direction increases from the first end portion, which is one of the end portions in the x-direction of the light emitting element 20 that is farther from the light receiving element 30, toward the second end portion, which is closer to the light receiving element 30. That is, the section of the curved surface 63 that overlaps with the light emitting element 20 as viewed in the z-direction is curved upward from the first end portion toward the second end portion of the light emitting element 20. As such, when light from the light emitting element 20 reflects off the section of the curved surface 63 that overlaps with the light emitting element 20, the reflected light is more likely to be incident on the light receiving element 30. The thickness of the transparent plastic 60 in the section in which the curved surface 63 overlaps with the light emitting element 20 as viewed in the z-direction is defined by the distance between the element main surface 20s of the light emitting element 20 and the curved surface 63 in the z-direction.

As viewed in the z-direction, the thickness of the transparent plastic 60 in the section in which the curved surface 63 overlaps with the light receiving surface 33 of the light receiving element 30 decreases toward the second end portion 62. In other words, the section of the curved surface 63 that overlaps with the light receiving surface 33 as viewed in the z-direction is curved downward toward the second end portion 62. Thus, the light reflecting off the section of the curved surface 63 that overlaps with the light receiving surface 33 as viewed in the z-direction is more likely to be incident on the light receiving surface 33. The thickness of the transparent plastic 60 in the section in which the curved surface 63 overlaps with the light receiving surface 33 of the light receiving element 30 as viewed in the z-direction is defined by the distance between the light receiving surface 33 of the light receiving element 30 and the curved surface 63 in the z-direction.

As shown in FIG. 4, the transparent plastic 60 includes inorganic particles 65 that absorb or reflect light from the light emitting element 20. An example of the inorganic particles 65 is a filler. The inorganic particles 65 are located in the entire transparent plastic 60.

The content of the inorganic particles 65 in the transparent plastic 60 may be freely modified. The content of the inorganic particles 65 in the transparent plastic 60 may be set such that the amount of light received by the light receiving element 30 from the light emitting element 20 is within a predetermined range.

The cross-sectional shape of the inorganic particles 65 may be elliptical or circular. The inorganic particles 65 may include multiple types of inorganic particles having mutually different cross-sectional shapes. In one example, the inorganic particles 65 may include first inorganic particles having a first cross-sectional shape and second inorganic particles having a second cross-sectional shape different from the first cross-sectional shape.

The inorganic particles 65 may have an equal size. Alternatively, the inorganic particles 65 may include multiple types of inorganic particles of different sizes. In one example, the inorganic particles 65 may include first inorganic particles having a first size and second inorganic particles having a second size different from the first size.

The inorganic particles 65 may include multiple types of inorganic particles of mutually different materials. In one example, the inorganic particles 65 may include first inorganic particles made of a first material and second inorganic particles made of a second material different from the first material.

The inorganic particles 65 of this embodiment are inorganic particles having the same size, the same cross-sectional shape, and the same material.

The inorganic particles 65 may also include multiple types of inorganic particles having combinations of multiple types of cross-sectional shapes, multiple types of sizes, and multiple types of materials. The color of the inorganic particles 65 may be black, which mainly absorbs light, or white, which mainly reflects light.

The reflection member 70 is made of a material that reflects light from the light emitting element 20. The reflection member 70 may be made of a white resin material, for example. An example of the resin material is white epoxy resin. The refractive index of the reflection member 70 differs from the refractive index of the transparent plastic 60. In this embodiment, the reflection member 70 does not contain inorganic particles that absorb or reflect the light from the light emitting element 20. The reflection member 70 may be formed by potting, for example.

The reflection member 70 covers at least the transparent plastic 60. That is, the reflection member 70 covers all of the first end portion 61, the second end portion 62, the curved surface 63, and the lower end surface 64 of the transparent plastic 60. The reflection member 70 covers the second semiconductor region of the light receiving element 30. Thus, it may be considered that the reflection member 70 covers both the light emitting element 20 and the light receiving element 30.

As shown in FIGS. 3 and 4, in the cross-sectional structure of the transparent plastic 60 taken along an xz plane, the reflection member 70 covers the entire die pad portion 42CB of the first lead frame 40C except for the side surface of the die pad portion 42CB that is closer to the first plastic side surface 81 in the x-direction of the die pad portion 42CB. The reflection member 70 is located within the recessed section 44C of the die pad portion 42CB.

In the cross-sectional structure of the transparent plastic 60 taken along an xz plane, the reflection member 70 covers the entire die pad portion 52AB of the second lead frame 50A. The reflection member 70 also covers a part of the suspension lead 55A.

As shown in FIGS. 3 and 4, in the cross-sectional structure of the reflection member 70 taken along an xz plane, the reflection member 70 includes, as opposite end portions in the x-direction, a first end portion 71 closer to the light emitting element 20 in the x-direction, and a second end portion 72 closer to the light receiving element 30 in the x-direction. The reflection member 70 also includes an upper curved surface 73, which has a convex shape bulging upward, and a lower curved surface 74, which has a convex shape bulging downward. The reflection member 70 also includes an upper section 75, which is located above the die pad portions 42CB and 52AB, and a lower section 76, which is located below the die pad portions 42CB and 52AB. The upper section 75 includes the upper curved surface 73, and the lower section 76 includes the lower curved surface 74.

The first end portion 71 forms the end portions of the upper curved surface 73 and the lower curved surface 74 that are closer to the light emitting element 20 in the x-direction. The first end portion 71 is located at one of the end portions in the x-direction of the die pad portion 42CB that is closer to the first plastic side surface 81 (see FIG. 3). That is, the first end portion 71 is spaced apart from the light emitting element 20 and closer to the first plastic side surface 81 than the light emitting element 20. The transparent plastic 60 is interposed between the first end portion 71 and the light emitting element 20.

The second end portion 72 forms the end portions of the upper curved surface 73 and the lower curved surface 74 that are closer to the light receiving element 30 in the x-direction. The second end portion 72 is closer to the second plastic side surface 82 (see FIG. 3) than the die pad portion 52AB in the x-direction. That is, the second end portion 72 is spaced apart from the light receiving element 30 and closer to the second plastic side surface 82 than the light receiving element 30. The transparent plastic 60 is not interposed between the second end portion 72 and the light receiving element 30, and only the reflection member 70 is provided. The second end portion 72 is located on a section closer to the die pad portion 52AB than the center in the x-direction of the suspension lead 55A.

As shown in FIG. 4, the upper curved surface 73 covers the die pad portions 42CB and 52AB, the light emitting element 20, and the light receiving element 30 from above, and includes a first curved surface 73a, a second curved surface 73b, and a third curved surface 73c. In the present embodiment, the first curved surface 73a corresponds to a first end curved surface, the second curved surface 73b corresponds to a second end curved surface, and the third curved surface 73c corresponds to an intermediate curved surface.

The first curved surface 73a is located at the opposite side of the light emitting element 20 from the light receiving element 30 in the x-direction. The first curved surface 73a forms the first end portion 71. In the cross-sectional structure of the reflection member 70 taken along an xz plane, the first curved surface 73a has a curved shape having its center of curvature CA located at the opposite side of the first curved surface 73a from the die pad portion 42CB. In this embodiment, the center of curvature CA is at a position that is higher than the die pad portion 42CB and outside the reflection member 70. As such, in the cross-sectional structure of the reflection member 70 taken along an xz plane, the first curved surface 73a has a convex shape bulging downward and toward the light emitting element 20.

The second curved surface 73b is located at the opposite side of the light receiving element 30 from the light emitting element 20 in the x-direction. The second curved surface 73b forms the second end portion 72. In the cross-sectional structure of the reflection member 70 taken along an xz plane, the second curved surface 73b has a curved shape having its center of curvature CB located at the opposite side of the second curved surface 73b from the die pad portion 52AB. In this embodiment, the center of curvature CB is at a position that is higher than the die pad portion 52AB and outside the reflection member 70. As such, in the cross-sectional structure of the reflection member 70 taken along an xz plane, the second curved surface 73b has a convex shape bulging downward and toward the light receiving element 30.

As shown in FIG. 4, the distance between the first end portion 71 of the reflection member 70 and the first end portion 61 of the transparent plastic 60 in the x-direction is less than the distance between the second end portion 72 of the reflection member 70 and the second end portion 62 of the transparent plastic 60 in the x-direction. The upper curved surface 73 is therefore affected by the curved surface 63 of the transparent plastic 60 more at the first end portion 71 than at the second end portion 72. For this reason, the degree of upward inclination of the first curved surface 73a from the pad surface 42s of the die pad portion 42CB is steeper than the degree of upward inclination of the second curved surface 73b from the pad surface 52s of the die pad portion 52AB. In other words, since the upper curved surface 73 at the second end portion 72 is less affected by the curved surface 63, the second curved surface 73b can be shaped to gently incline upward from the pad surface 52s of the die pad portion 52AB.

The third curved surface 73c is located between the first and second curved surfaces 73a and 73b, and is formed to connect the first and second curved surfaces 73a and 73b. The third curved surface 73c has a curved shape having its center of curvature CC located at the side of the third curved surface 73c at which the die pad portions 42CB and 52AB are located. In this embodiment, the center of curvature CC is located below the die pad portions 42CB and 52AB. The center of curvature CC is located below the reflection member 70. As such, in the cross-sectional structure of the reflection member 70 taken along an xz plane, the third curved surface 73c has a convex shape bulging upward. The third curved surface 73c may be formed by a combination of curved surfaces of different curvatures.

In the cross-sectional structure of the reflection member 70 taken along an xz plane, the inflection position CQ, which is the highest point of the third curved surface 73c, is located closer to the light receiving element 30 than the light emitting element 20 in the x-direction. As viewed in the z-direction, the inflection position CQ is located closer to the light receiving element 30 than the inflection position CP of the curved surface 63 of the transparent plastic 60. In other words, the inflection position CP of the curved surface 63 of the transparent plastic 60 is closer to the light emitting element 20 than the inflection position CQ of the third curved surface 73c of the reflection member 70.

The radius of curvature of the third curved surface 73c is larger than the radius of curvature of the curved surface 63 of the transparent plastic 60. Thus, the thickness of the upper section 75 of the reflection member 70 increases from the inflection position CP of the curved surface 63 toward the first end portion 71. In other words, the thickness of the upper section 75 of the reflection member 70 decreases as it extends upward from the first end portion 71. Likewise, the thickness of the upper section 75 of the reflection member 70 increases from the inflection position CP of the curved surface 63 toward the second end portion 72. In other words, the thickness of the upper section 75 of the reflection member 70 decreases from a section of the upper section 75 closer to the second end portion 62 than the inflection position CP of the curved surface 63 toward the inflection position CP of the curved surface 63. The thickness of the upper section 75 may be defined by the distance between the curved surface 63 and the third curved surface 73c in the direction along the radius of curvature of the curved surface 63, for example.

The upper section 75 of the reflection member 70 covers the light emitting element 20 and the light receiving element 30 by covering the transparent plastic 60 from the outside. That is, the upper section 75 has sections aligned with the light emitting element 20 and the light receiving element 30 as viewed in the z-direction. The upper section 75 (reflection member 70) includes a light emitting-side opposed portion 75A and a light receiving-side opposed portion 75B. The light emitting-side opposed portion 75A is the section of the upper section 75 that is opposed to the element main surface 20*s* of the light emitting element 20 (light emitting surface) and is spaced apart from the element main surface 20*s* in the direction (z-direction) perpendicular to the element main surface 20*s*. The light receiving-side opposed portion 75B is the section of the upper section 75 that is opposed to the light receiving surface 33 of the light receiving element 30 and is spaced apart from the light receiving surface 33 in the direction perpendicular to the light receiving surface 33. Both the light emitting-side opposed portion 75A and the light receiving-side opposed portion 75B are provided between the first curved surface 73*a* and the second curved surface 73*b* in the x-direction. In other words, both the light emitting-side opposed portion 75A and the light receiving-side opposed portion 75B include the third curved surface 73*c*.

As shown in FIG. 4, the light emitting-side opposed portion 75A is closer to the inflection position CP of the curved surface 63 than the light receiving-side opposed portion 75B. As such, it may be considered that the light emitting-side opposed portion 75A is formed to be thinner than the light receiving-side opposed portion 75B.

The lower section 76 of the reflection member 70 is in contact with the pad rear surface 42*r* of the die pad portion 42CB, the pad rear surface 52*r* of the die pad portion 52AB, and the lower end surface 64 of the transparent plastic 60. That is, the lower section 76 covers the pad rear surfaces 42*r* and 52*r* of the die pad portions 42CB and 52AB. In other words, the lower section 76 covers the surfaces of the die pad portions 42CB and 52AB that are opposite to the surfaces on which the light emitting element 20 and the light receiving element 30 are mounted. The thickness of the lower section 76 decreases from the center of the lower section 76 in the x-direction toward the first end portion 71. Likewise, the thickness of the lower section 76 decreases from the center of the lower section 76 in the x-direction toward the second end portion 72. In this embodiment, the lower section 76 of the reflection member 70 corresponds to a pad cover portion.

The lower curved surface 74 covers the die pad portions 42CB and 52AB, the light emitting element 20, and the light receiving element 30 from below. The radius of curvature of the lower curved surface 74 is greater than the radius of curvature of the upper curved surface 73. The center of curvature CE of the lower curved surface 74 is located above both of the die pad portions 42CB and 52AB. The center of curvature CE of the lower curved surface 74 is located above both the light emitting element 20 and the light receiving element 30. The center of curvature CE of the lower curved surface 74 is located above the transparent plastic 60. The center of curvature CE of the lower curved surface 74 is located above the reflection member 70.

In the cross-sectional structure of the reflection member 70 taken along an xz plane, the inflection position CR, which is the lowest point of the lower curved surface 74, is located substantially at the center in the x-direction of the reflection member 70. As such, the inflection position CR is positioned closer to the light receiving element 30 than to the light emitting element 20 in the x-direction.

The lower section 76 of the reflection member 70 is thinner than the upper section 75. The maximum thickness of the lower section 76 is less than the maximum distance between the third curved surface 73*c* of the upper section 75 and the die pad portion 52AB in the z-direction. The maximum thickness of the lower section 76 is defined by the distance between the pad rear surface 52*r* of the die pad portion 52AB and the inflection position CR in the z-direction. The maximum distance between the third curved surface 73*c* and the die pad portion 52AB in the z-direction is defined by the distance between the pad surface 52*s* of the die pad portion 52AB and the inflection position CQ of the third curved surface 73*c*.

Since the reflection member 70 is made of a material that reflects light from the light emitting element 20, the interface surface between the transparent plastic 60 and the reflection member 70 is a reflective surface that reflects light. This reflective surface includes an upper reflective surface, which is located above the die pad portions 42CB and 52AB, and a lower reflective surface, which is located at the same side as the pad rear surfaces 42*r* and 52*r* of the die pad portions 42CB and 52AB. The upper reflective surface has the same shapes as the first and second sections 61*a* and 61*b* of the first end portion 61 of the transparent plastic 60, the first and second sections 62*a* and 62*b* of the second end portion 62, the curved surface 63, and the lower end surface 64. The lower reflective surface has the same shape as the lower end surface 64 of the transparent plastic 60.

Also, the insulation module 10 includes reflective surfaces that reflect light but differ from the interface surface between the transparent plastic 60 and the reflection member 70. In one example, the pad surfaces 42*s* and 52*s* of the die pad portions 42CB and 52AB, one of the end surfaces in the x-direction of each of the die pad portions 42CB and 52AB that is located within the transparent plastic 60, and the surfaces 92*s* and 102*s* of the conductive bonding materials 90 and 100 (see FIGS. 5 and 6) serve as reflective surfaces that reflect light.

As such, the light emitted from the light emitting element 20 reflects off the section of the curved surface 63 that corresponds to the light emitting-side opposed portion 75A, which is the section that overlaps with the light emitting element 20 as viewed in the z-direction. In this embodiment, the light emitting-side opposed portion 75A is formed so that the light from the light emitting element 20 is not totally reflected. That is, when light from the light emitting element 20 is applied to the light emitting-side opposed portion 75A, part of the light applied to the light emitting-side opposed portion 75A is reflected, and the remaining light passes through the reflection member 70. The light traveling through the reflection member 70 is absorbed by the sealing plastic 80.

In one example, the material of the reflection member 70 and the material of the transparent plastic 60 are selected such that the refractive index of the reflection member 70 is greater than the refractive index of the transparent plastic 60. In one example, epoxy resin has a refractive index of 1.55 to 1.61, silicone resin has a refractive index of about 1.57, and acrylic resin has a refractive index of about 1.49. Thus, when the reflection member 70 is made of epoxy resin and the transparent plastic 60 is made of acrylic resin, for example, the light from the light emitting element 20 is not totally reflected off the light emitting-side opposed portion 75A.

Also, when the light emitting-side opposed portion 75A is formed to have an angle that is less than the critical angle of the light from the light emitting element 20, the light from the light emitting element 20 is not totally reflected off the light emitting-side opposed portion 75A even if the refractive index of the reflection member 70 is smaller than the refractive index of the transparent plastic 60.

The light reflecting off the curved surface 63 then reflects off the lower end surface 64 of the transparent plastic 60, the pad surfaces 42*s* and 52*s* of die pad portions 42CB and 52AB, one of the end surfaces in the x-direction of each of the die pad portions 42CB and 52AB that is located within the transparent plastic 60, and the conductive bonding materials 90 and 100. The light reflecting off the lower end surface 64 of the transparent plastic 60, the pad surfaces 42s and 52s of die pad portions 42CB and 52AB, one of the end surfaces in the x-direction of each of the die pad portions 42CB and 52AB that is located within the transparent plastic 60, and the conductive bonding materials 90 and 100 again reflects off the curved surface 63, or reflects off the first and second sections 61a and 61b of the first end portion 61 and the first and second sections 62a and 62b of the second end portion 62. In this manner, the light emitted from the light emitting element 20 is reflected once or multiple times before entering the light receiving element 30.

When the transparent plastic 60 includes inorganic particles 65 that absorb light, part of the light emitted from the light emitting element 20 is absorbed by the inorganic particles 65 while traveling through the transparent plastic 60. For this reason, the light emitted from the light emitting element 20 enters the light receiving element 30 in a weakened state. When the transparent plastic 60 includes inorganic particles 65 that reflects light, part of the light emitted from the light emitting element 20 reflects off the inorganic particles 65 while traveling through the transparent plastic 60. However, not all of the light incident on the inorganic particles 65 is reflected, and part of the light is absorbed by the inorganic particles 65. Accordingly, the light emitted from the light emitting element 20 enters the light receiving element 30 in a weakened state.

Figure 8:
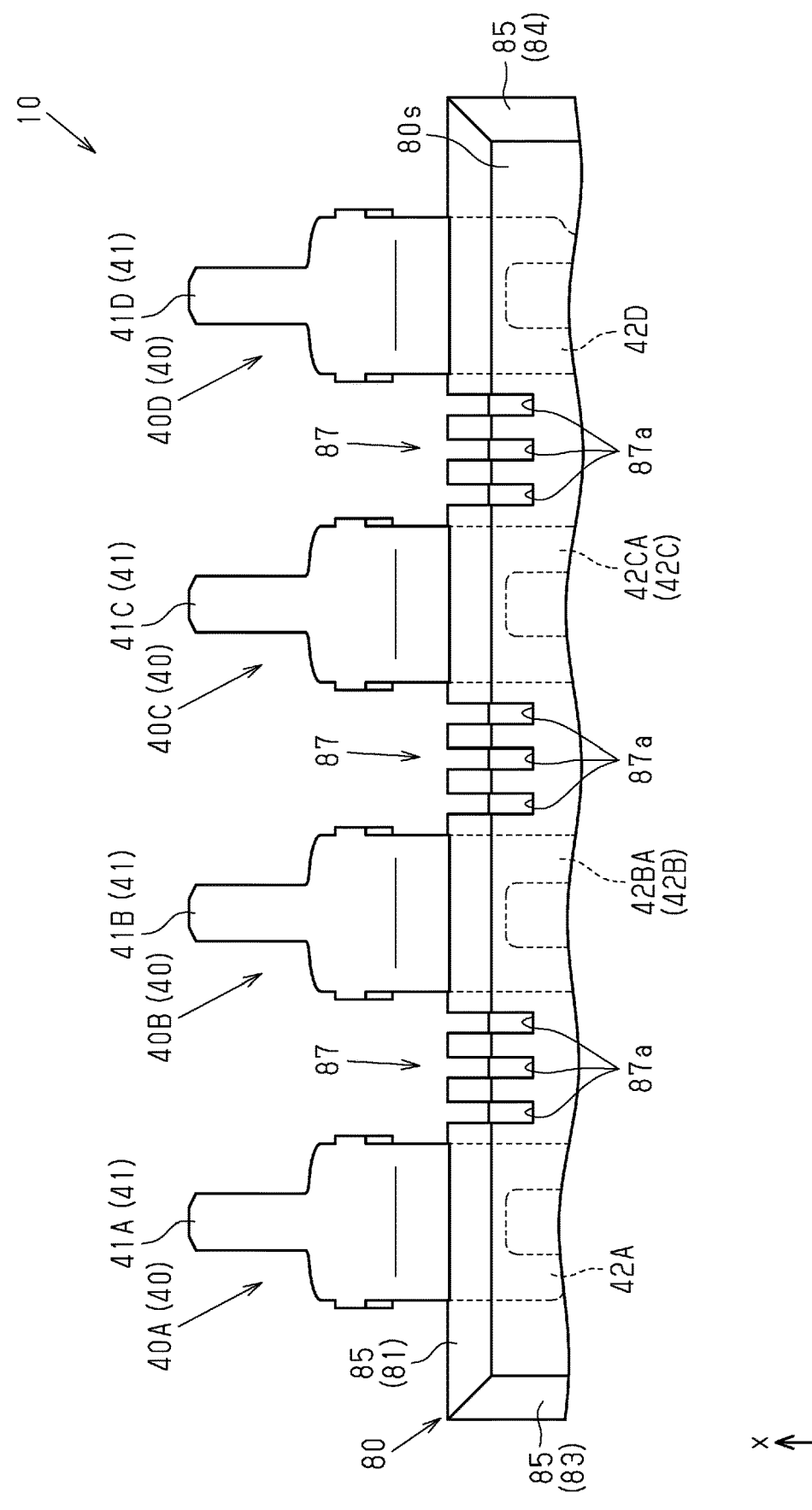
FIG. 8 is an enlarged plan view of a part of the sealing plastic of the insulation module of FIG. 1.
Figure 9:
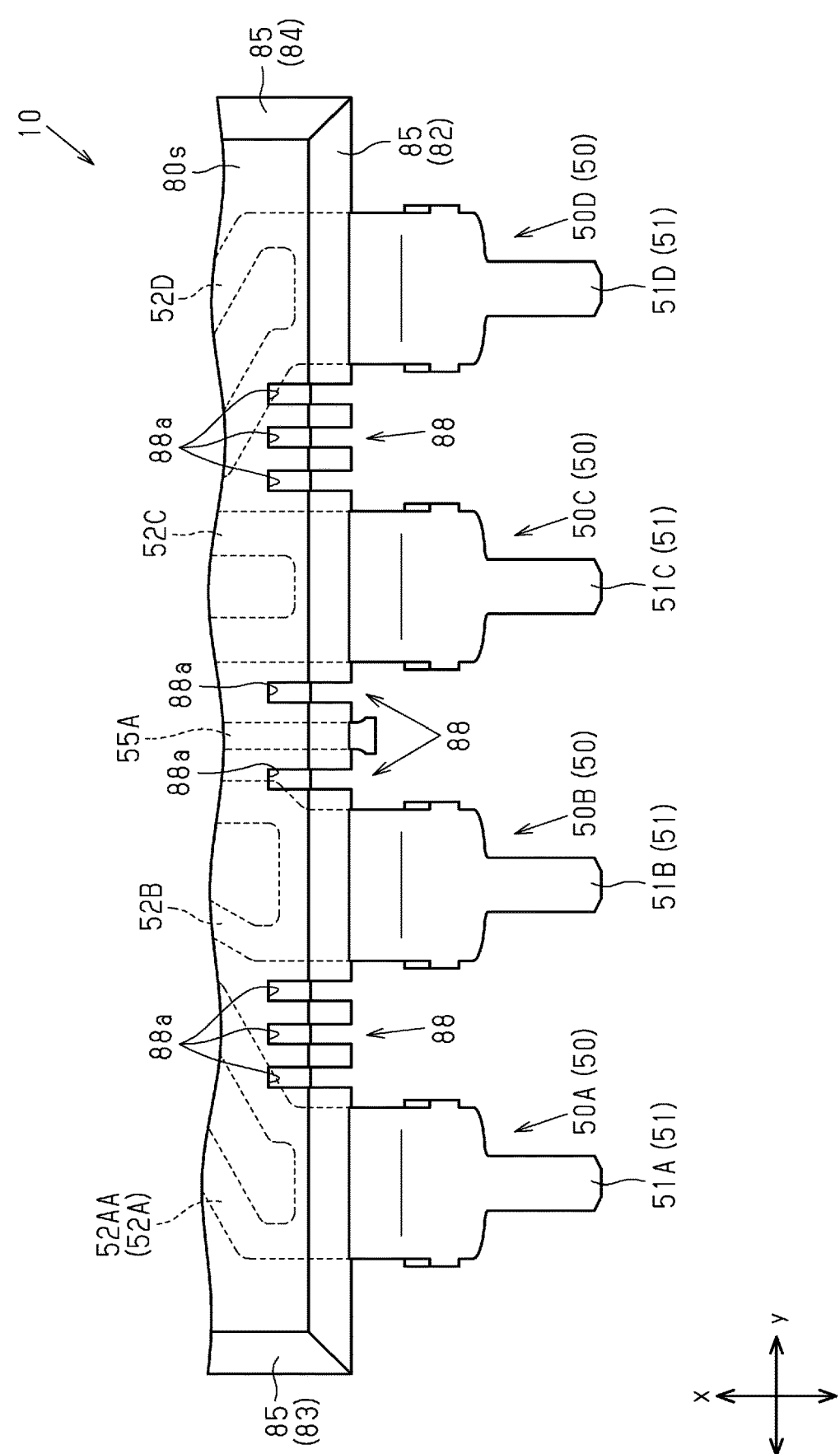
FIG. 9 is an enlarged plan view of a part of the sealing plastic of the insulation module of FIG. 1 different from the part shown in FIG. 8.
Figure 10:
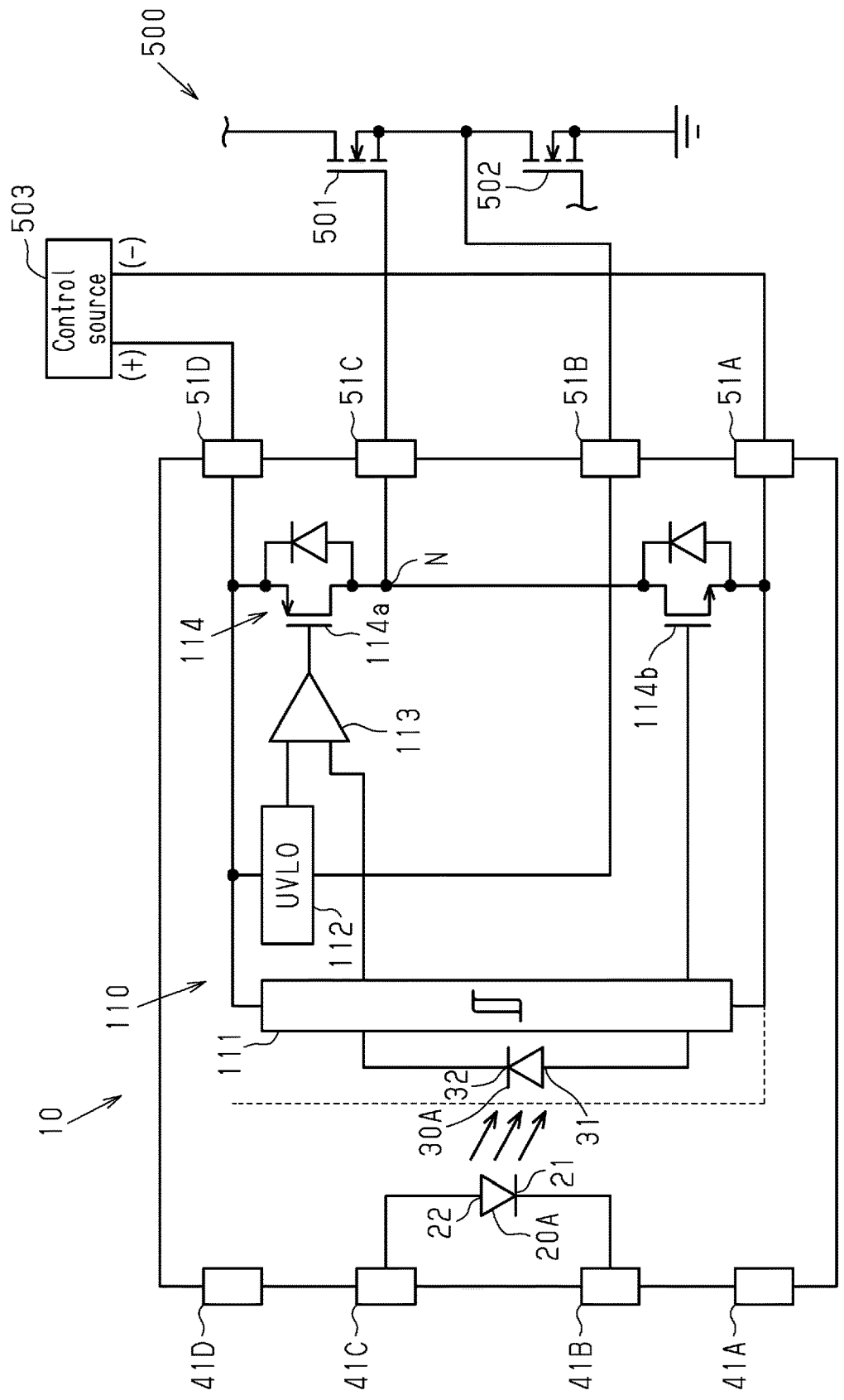
FIG. 10 is a circuit diagram schematically showing the electrical configuration of the insulation module of FIG. 1.

Referring to FIGS. 8 and 9, the structures of the terminals 41A to 41D and the structures of the terminals 51A to 51D of the sealing plastic 80 are now described. FIG. 8 is a plan view of the insulation module 10 showing the terminals 41A to 41D and a part of the sealing plastic 80. FIG. 9 is a plan view of the insulation module 10 showing the terminals 51A to 51D and a part of the sealing plastic 80.

As shown in FIGS. 1 and 8, uneven portions 87 are provided in the first plastic side surface 81 of the sealing plastic 80 between adjacent ones of the terminals 41A to 41D in the y-direction. Specifically, an uneven portion 87 is provided in each of a section of the first plastic side surface 81 between the terminals 41A and 41B in the y-direction, a section of the first plastic side surface 81 between terminals 41B and 41C in the y-direction, and a section of the first plastic side surface 81 between the terminals 41C and 41D in the y-direction. In this embodiment, two terminals among the terminals 41A to 41D correspond to a first terminal and a second terminal.

The uneven portions 87 are formed over the entire extent in the z-direction of the first plastic side surface 81. Each uneven portion 87 is formed by the first plastic side surface 81 and depressions 87a extending from the first plastic side surface 81. Each uneven portion 87 may include multiple (three in this embodiment) depressions 87a. Each depression 87a extends through the sealing plastic 80 in the z-direction. In the present embodiment, the bottom surface of each depression 87a is formed parallel to the first and second side surfaces 85 and 86 (see FIG. 3) of the first plastic side surface 81. That is, the section of the bottom surface of each depression 87a corresponding to the first side surface 85 is inclined outward of the sealing plastic 80 in the x-direction as it extends from the plastic main surface 80s toward the plastic rear surface 80r. The section of the bottom surface of each depression 87a corresponding to the second side surface 86 is inclined outward of the sealing plastic 80 in the x-direction as it extends from the plastic rear surface 80r (see FIG. 3) toward the plastic main surface 80s.

As shown in FIG. 9, uneven portions 88 are provided in the second plastic side surface 82 of the sealing plastic 80 between adjacent ones of the terminals 51A to 51D in the y-direction. Specifically, an uneven portion 88 is provided in each of a section of the second plastic side surface 82 between the terminals 51A and 51B in the y-direction, a section of the second plastic side surface 82 between the terminals 51B and 51C in the y-direction, and a section of the second plastic side surface 82 between the terminals 51C and 51D in the y-direction. In this embodiment, of the terminals 51A to 51D, the terminal 51B corresponds to a first terminal, and the terminal 51C corresponds to a second terminal.

The uneven portions 88 are formed over the entire extent in the z-direction of the second plastic side surface 82. Each uneven portion 88 includes the second plastic side surface 82 and depressions 88a extending from the second plastic side surface 82. Each uneven portion 88 may include multiple depressions 88a, for example. In this embodiment, the uneven portion 88 between the terminals 51A and 51B in the y-direction includes three depressions 88a. The uneven portion 88 between the terminal 51B and the terminal 51C in the y-direction includes two depressions 88a. The uneven portion 88 between the terminal 51C and the terminal 51D in the y-direction includes three depressions 88a.

Each depression 88a extends through the sealing plastic 80 in the z-direction. In the present embodiment, the bottom surface of each depression 88a is formed parallel to the first and second side surfaces 85 and 86 of the second plastic side surface 82. That is, the section of the bottom surface of each depression 88a corresponding to the first side surface 85 is inclined outward of the sealing plastic 80 in the x-direction as it extends from the plastic main surface 80s toward the plastic rear surface 80r. The section of the bottom surface of each depression 88a corresponding to the second side surface 86 is inclined outward of the sealing plastic 80 in the x-direction as it extends from the plastic rear surface 80r toward the plastic main surface 80s.

The two depressions 88a of the uneven portion 88 between the terminal 51B and the terminal 51C in the y-direction are provided separately in the section between the terminal 51B and the suspension lead 55A in the y-direction and the section between the suspension lead 55A and the terminal 51C in the y-direction.

The bottom surfaces of the depressions 87a and 88a may be formed to extend in the z-direction. Also, the number of depressions 87a, 88a of each uneven portion 87, 88 may be freely modified. Each uneven portion 87, 88 only needs to have at least one depression 87a, 88a. Also, instead of the depression 87a, each uneven portion 87 may include a projection extending from the first plastic side surface 81. Instead of the depression 88a, each uneven portion 88 may include a projection extending from the second plastic side surface 82.

Electrical Configuration

The electrical configuration of the insulation module 10 is now described. FIG. 10 is a circuit diagram schematically showing the circuit configuration of the insulation module 10 and the connection configuration between the insulation module 10 and an inverter circuit 500.

As shown in FIG. 10, the inverter circuit 500 includes a first switching element 501 and a second switching element 502, which are connected in series. Each switching element 501, 502 may be a power transistor, for example. Examples of power transistors include insulated gate bipolar transistors (IGBTs) and metal-oxide-semiconductor field effect transistors (MOSFETs). The present embodiment uses MOSFETs as the switching elements 501 and 502.

In this embodiment, the insulation module 10 applies a driving voltage signal to the gate of the first switching element 501. That is, the insulation module 10 is a gate driver that drives the first switching element 501.

The positive electrode of a control source 503 is electrically connected to the terminal 51D of the insulation module 10. The negative electrode of the control source 503 is electrically connected to the terminal 51A of the insulation module 10.

The insulation module 10 includes a light emitting diode 20A, a light receiving diode 30A, and a control circuit 110. The light emitting element 20 includes the light emitting diode 20A. The light receiving element 30 includes the light receiving diode 30A and the control circuit 110.

The light emitting diode 20A includes a first electrode 21 (cathode electrode) and a second electrode 22 (anode electrode) of the light emitting element 20. The first electrode 21 of the light emitting diode 20A is electrically connected to the terminal 41B, and the second electrode 22 is electrically connected to the terminal 41C. In the illustrated example, the terminals 41A and 41D form unconnected terminals that are not electrically connected to the light emitting element 20, the light receiving element 30, or the control circuit 110. That is, the terminals 41B and 41C are electrically connected through the light emitting element 20, and the terminals 41A and 41D are not electrically connected to the terminals 41B and 41C.

The light receiving diode 30A is electrically connected to the control circuit 110 and insulated from the light emitting element 20. In other words, the light emitting element 20 is insulated from the control circuit 110. The control circuit 110 is electrically connected to the terminals 51A to 51D. In this manner, the terminals 41A to 41D are insulated from the terminals 51A to 51D by the photocoupler formed by the light emitting element 20 (light emitting diode 20A) and the light receiving element 30 (light receiving diode 30A).

The light receiving diode 30A includes a first electrode 31 and a second electrode 32. In one example, the first electrode 31 is an anode electrode and the second electrode 32 is a cathode electrode. Both of the first and second electrodes 31 and 32 are electrically connected to the control circuit 110.

The control circuit 110 includes a Schmitt trigger 111, an under voltage lock out (UVLO) portion 112, a comparator 113, and an output portion 114. The control circuit 110 generates an output signal based on a change in the voltage of the light receiving element 30 caused by the light receiving element 30 receiving light from the light emitting element 20.

The Schmitt trigger 111 is electrically connected to both the first and second electrodes 31 and 32 of the light receiving element 30. The Schmitt trigger 111 is also electrically connected to the terminals 51D and 51A. That is, the Schmitt trigger 111 receives power from the control source 503. The Schmitt trigger 111 transmits the voltage of light receiving element 30 to the comparator 113 and the output portion 114. A predetermined hysteresis is set for the threshold voltage of the Schmitt trigger 111. This configuration increases the resistance to noise.

The UVLO portion 112 is electrically connected to the terminals 51D and 51B. That is, the UVLO portion 112 is electrically connected to the control source 503 and between the source of the first switching element 501 and the drain of the second switching element 502. The UVLO portion 112 stops the operation of the control circuit 110 when the voltage of the control source 503 becomes lower than the threshold voltage, thereby limiting the occurrence of malfunction.

The input side of the comparator 113 is electrically connected to the Schmitt trigger 111 and the UVLO portion 112. The output side of the comparator 113 is electrically connected to the output portion 114. The comparator 113 generates a control signal for controlling the output portion 114 based on a comparison between the signal from the Schmitt trigger 111 and the signal from the UVLO portion 112. The comparator 113 outputs the generated control signal to the output portion 114.

The output portion 114 includes a first switching element 114a and a second switching element 114b, which are connected in series. In the example shown in FIG. 10, a p-type MOSFET is used for the first switching element 114a, and an n-type MOSFET is used for the second switching element 114b. The output portion 114 of the present embodiment is thus configured as a complementary MOS (CMOS). The output side of the comparator 113 is electrically connected to the first switching element 114a of the output portion 114.

The source of the first switching element 114a is electrically connected to the terminal 51D. The source of the second switching element 114b is electrically connected to the terminal 51A. A node N between the drain of the first switching element 114a and the drain of the second switching element 114b is electrically connected to the terminal 51C.

The gate of the first switching element 114a is electrically connected to the comparator 113. That is, the control signal from the comparator 113 is applied to the gate of the first switching element 114a.

The gate of the second switching element 114b is electrically connected to the Schmitt trigger 111. That is, the signal from the Schmitt trigger 111 is applied to the gate of the second switching element 114b.

The output portion 114 generates a driving voltage signal based on the on/off operation of the first switching element 114a, which is based on the control signal of the comparator 113, and the on/off operation of the second switching element 114b, which is based on the signal from the Schmitt trigger 111. The output portion 114 applies the driving voltage signal to the gate of the switching element 501.

Operation

Operation of the insulation module 10 of the present embodiment is now described.

When the light receiving element 30 receives an excessively large amount of light, the processing load on the control circuit (LSI) in the second semiconductor region of the light receiving element 30 becomes large. This may lower the operating speed of the control circuit. A decreased operating speed of the control circuit may prevent the driving voltage signal from being supplied to the gate of the first switching element 501 of the inverter circuit 500 at the desired timing.

In this respect, in the insulation module 10 of the present embodiment, the transparent plastic 60 includes inorganic particles 65, which absorb or reflect light from the light emitting element 20. The inorganic particles 65 thus weaken the light from the light emitting element 20 as it passes through the transparent plastic 60. This reduces the amount of light received by the light receiving element 30, reducing the possibility of the processing load on the control circuit of the light receiving element 30 becoming large.

In contrast, when the amount of light received from the light emitting element 20 is excessively small, the light receiving element 30 may fail to generate a driving voltage signal even though it has received light from the light emitting element 20. For this reason, the insulation module 10 has a small distance in the x-direction between the light emitting element 20 and the light receiving element 30, for example, to reduce the likelihood that the amount of light received by the light receiving element 30 from the light emitting element 20 is excessively decreased. That is, in the insulation module 10, the amount of light received by the light receiving element 30 from the light emitting element 20 is adjusted to be within a predetermined range. This allows the insulation module 10 to stably operate the first switching element 501.

Advantages of First Embodiment

The insulation module 10 of the present embodiment has the following advantages.

(1-1) The insulation module 10 includes the light emitting element 20, the light receiving element 30, which receives light from the light emitting element 20, the die pad portion 42CB, on which the light emitting element 20 is mounted, the die pad portion 52AB, which is arranged side by side with the die pad portion 42CB and on which the light receiving element 30 is mounted, the transparent plastic 60, which covers at least both the light emitting element 20 and the light receiving element 30, the reflection member 70, which at least covers the transparent plastic 60 and is made of a material that reflects light from the light emitting element 20, and the sealing plastic 80, which seals the reflection member 70 together with the transparent plastic 60 and is made of a material having a light blocking property. The transparent plastic 60 includes inorganic particles 65 that absorb or reflect light from the light emitting element 20.

According to this configuration, when the light emitted from the light emitting element 20 travels through the transparent plastic 60, the inorganic particles 65 weaken the light from the light emitting element 20. As a result, the light from the light emitting element 20 enters the light receiving element 30 in a weakened state, so that the amount of light received by the light receiving element 30 is reduced.

(1-2) The reflection member 70 has the light emitting-side opposed portion 75A, which is opposed to the element main surface 20s (light emitting surface) of the light emitting element 20 and is spaced apart from the element main surface 20s in a direction perpendicular to the element main surface 20s (z-direction). The angle of the interface between the light emitting-side opposed portion 75A of the reflection member 70 and the transparent plastic 60 is less than the critical angle.

According to this configuration, the light emitted upward from the element main surface 20s of the light emitting element 20 is not totally reflected off the interface between the light emitting-side opposed portion 75A of the reflection member 70 and the transparent plastic 60. As a result, the light from the light emitting element 20 enters the light receiving element 30 in a weakened state, so that the amount of light received by the light receiving element 30 is reduced.

(1-3) The refractive index of the reflection member 70 may be greater than the refractive index of the transparent plastic 60.

According to this configuration, the light from the light emitting element 20 is not totally reflected off the interface between the reflection member 70 and the transparent plastic

60. This reduces the amount of light received by the light receiving element 30 from the light emitting element 20.

(1-4) The reflection member 70 includes the light receiving-side opposed portion 75B, which is opposed to the light receiving surface 33 of the light receiving element 30 and is spaced apart from the light receiving surface 33 in a direction perpendicular to the light receiving surface 33. The light emitting-side opposed portion 75A is formed to be thinner than the light receiving-side opposed portion 75B.

In this configuration, the thickness of the light emitting-side opposed portion 75A, to which the light from the light emitting element 20 tends to be applied, is reduced. This reduces the effect of the difference in thermal expansion between the light emitting-side opposed portion 75A and the sealing plastic 80 on the reflection member 70 and the sealing plastic 80 even when the light from the light emitting element 20 increases the temperature of the light emitting-side opposed portion 75A.

(1-5) The sealing plastic 80 includes the first plastic side surface 81, on which the terminals 41A to 41D are disposed, and the second plastic side surface 82, on which the terminals 51A to 51D are disposed. The section of the first plastic side surface 81 between adjacent ones of the terminals 41A to 41D in the y-direction includes an uneven portion 87. The section of the second plastic side surface 82 between adjacent ones of the terminals 51A to 51D in the y-direction includes an uneven portion 88.

This configuration increases the creepage distance between adjacent ones of the terminals 41A to 41D in the y-direction. The configuration also increases the creepage distance between adjacent ones of the terminals 51A to 51D in the y-direction. This improves the insulation between adjacent ones of the terminals 41A to 41D in the y-direction, and the insulation between adjacent ones of the terminals 51A to 51D in the y-direction.

(1-6) The die pad portion 52AB of the second lead frame 50A includes the suspension lead 55A. The suspension lead 55A is exposed from a section of the second plastic side surface 82 between the terminals 51B and 51C. An uneven portion 88 is disposed in each of the section of the second plastic side surface 82 between the terminal 51B and the suspension lead 55A, and the section between the terminal 51C and the suspension lead 55A.

This configuration increases both the creepage distance between the terminal 51B and the suspension lead 55A and the creepage distance between the terminal 51C and the suspension lead 55A. Accordingly, the insulation between the terminal 51B and the suspension lead 55A and the insulation between the terminal 51C and the suspension lead 55A are both improved.

(1-7) In the x-direction, the die pad portion 52AB of the second lead frame 50A is longer than the die pad portion 42CB of the first lead frame 40C. The distance in the x-direction between the die pad portions 52AB and 42CB is shorter than the length in the x-direction of the die pad portion 42CB.

This configuration shortens the distance in the x-direction between the light emitting element 20 and the light receiving element 30. In other words, the distance of the optical path of the light emitting from the light emitting element 20 and entering the light receiving element 30 is shortened. This increases the amount of light received by the light receiving element 30.

(1-8) The transparent plastic 60 covers the entire light emitting element 20 and covers a part of the light receiving element 30. The transparent plastic 60 covers the light receiving surface 33 of the light receiving element 30. The first end portion 61 of the transparent plastic 60 is adjacent to the light receiving surface 33 in the x-direction.

In this configuration, the wires WB1 to WB4 connected to the light receiving element 30 are located outside the transparent plastic 60. Thus, the light traveling through the transparent plastic 60 is less likely to reflect off the wires WB1 to WB4.

In a configuration in which the transparent plastic covers the entire light receiving element 30, the light traveling through the transparent plastic may be incident on a section of the light receiving element 30 other than the light receiving surface 33, in particular a section that is closer to the second plastic side surface 82 than the light receiving element 30.

In this regard, the transparent plastic 60 of the present embodiment is configured to cover the light receiving surface 33 and a position adjacent to the light receiving surface 33. As such, the light traveling through the transparent plastic 60 is less likely to be incident on a section of the light receiving element 30 other than the light receiving surface 33 and a section that is closer to the second plastic side surface 82 than the light receiving element 30. As a result, the light traveling through the transparent plastic 60 is more likely to be incident on the light receiving surface 33.

(1-9) The conductive bonding material 90 that bonds the light emitting element 20 to the die pad portion 42CB of the first lead frame 40C is formed to protrude from the light emitting element 20 as viewed in the z-direction. The conductive bonding material 100 that bonds the light receiving element 30 to the die pad portion 52AB of the second lead frame 50A is formed protrude from the light receiving element 30 as viewed in the z-direction. The conductive bonding materials 90 and 100 are made of a material that reflects light from the light emitting element 20.

According to this configuration, the light from the light emitting element 20 may reflect off a section (second bonding region 92) of the conductive bonding material 90 that protrudes from the light emitting element 20 as viewed in the z-direction and a section (second bonding region 102) of the conductive bonding material 100 that protrudes from the light receiving element 30 as viewed in the z-direction. The reflected light may be incident on the light receiving surface 33 of the light receiving element 30. This increases the amount of light received by the light receiving element 30 from the light emitting element 20.

(1-10) The light receiving element 30 is bonded to one of the end portions in the x-direction of the die pad portion 52AB of the second lead frame 50A that is closer to the die pad portion 42CB of the first lead frame 40C with the conductive bonding material 100. One of the end portions in the x-direction of the die pad portion 52AB that is closer to the die pad portion 42CB of the first lead frame 40C includes the projection 58A extending perpendicularly from the pad surface 52s of the die pad portion 52AB.

According to this configuration, the projection 58A holds back the conductive bonding material 100. Thus, the conductive bonding material 100 is unlikely to protrude from one of the edges in the x-direction of the die pad portion 52AB that is closer to the die pad portion 42CB.

(1-11) The die pad portion 52AB of the second lead frame 50A is inclined toward the plastic rear surface 80r as it extends in the direction from the second plastic side surface 82 toward the first plastic side surface 81.

This configuration allows the height positions of the terminals 51A to 51D extending from the second plastic side surface 82 of the sealing plastic 80 to be the specified height positions, and also allows thick inorganic particles 65 to be encapsulated in the transparent plastic 60. Encapsulating the inorganic particles 65 in the transparent plastic 60 may increase the volume of the transparent plastic 60. In this case, the die pad portion 52AB that is inclined with respect to the horizontal direction can provide the space for accommodating the increased volume.

(1-12) The die pad portion 42CB of the first lead frame 40C is inclined toward the plastic rear surface 80r as it extends in the direction from the first plastic side surface 81 toward the second plastic side surface 82.

This configuration allows the height positions of the terminals 41A to 41D extending from the first plastic side surface 81 of the sealing plastic 80 to be the specified height positions, and also allows thick inorganic particles 65 to be encapsulated in the transparent plastic 60. Encapsulating the inorganic particles 65 in the transparent plastic 60 may increase the volume of the transparent plastic 60. In this case, the die pad portion 42CB that is inclined with respect to the horizontal direction can provide the space for accommodating the increased volume.

Second Embodiment

Figure 11:
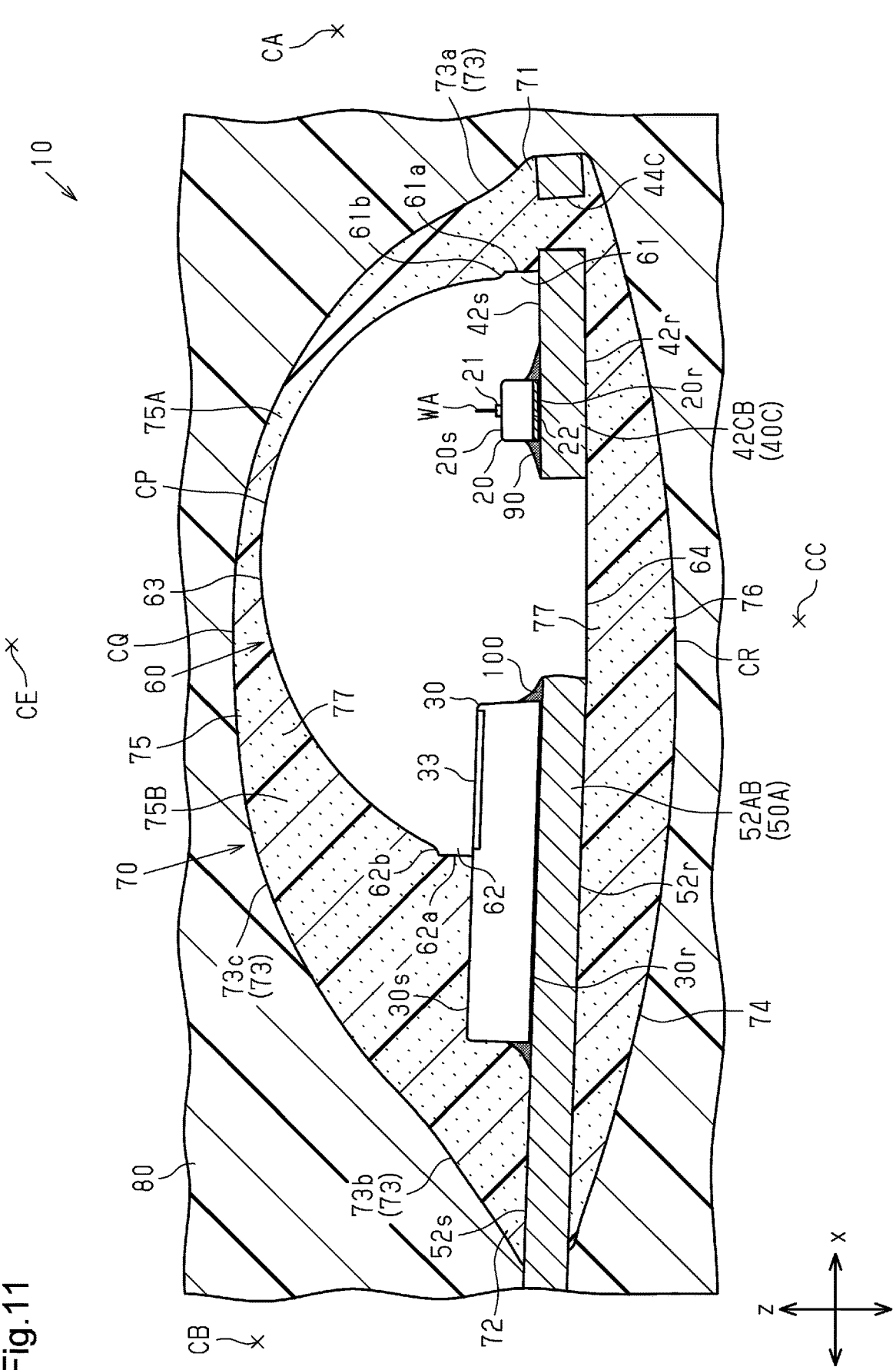
FIG. 11 is a cross-sectional view showing the cross-sectional structure of a part of an insulation module of a second embodiment.

Referring to FIG. 11, an insulation module 10 of a second embodiment is now described. The insulation module 10 of the present embodiment differs from the insulation module 10 of the first embodiment mainly in the configuration of the transparent plastic 60 and the reflection member 70. In the following description, same reference numerals are given to those components that are the same as the corresponding components of the insulation module 10 of the first embodiment. Such components will not be described.

As shown in FIG. 11, unlike the first embodiment, the transparent plastic 60 does not include inorganic particles 65 (see FIG. 4). As shown in FIG. 11, the shapes of the transparent plastic 60 and the reflection member 70 of the present embodiment are the same as the shapes of the transparent plastic 60 and the reflection member 70 of the first embodiment.

Unlike the first embodiment, the reflection member 70 includes inorganic particles 77 that reflect light from the light emitting element 20. An example of the inorganic particles 77 is a filler. The inorganic particles 77 are located in the entire reflection member 70.

The content of the inorganic particles 77 in the reflection member 70 may be freely modified. The content of the inorganic particles 77 in the reflection member 70 may be set such that the amount of light received by the light receiving element 30 from the light emitting element 20 is within a predetermined range.

As in the first embodiment, the reflection member 70 and the transparent plastic 60 of the present embodiment are configured so that the light from the light emitting element 20 is not totally reflected off the interface between the reflection member 70 and the transparent plastic 60.

When the light from the light emitting element 20 is not totally reflected off the interface between the reflection member 70 and the transparent plastic 60, the light is partially transmitted through the reflection member 70. When the reflection member 70 includes inorganic particles 77, the inorganic particles 77 reflect the light traveling through the reflection member 70. As a result, the light in the reflection member 70 may reflect off the inorganic particles 77 and enter the light receiving element 30.

Advantages of Second Embodiment

The insulation module 10 of the present embodiment has the following advantages, as well as the same advantages as the first embodiment.

(2-1) The reflection member 70 includes the inorganic particles 77 that absorb or reflect light from the light emitting element 20.

According to this configuration, when the light from the light emitting element 20 is refracted at the interface between the reflection member 70 and the transparent plastic 60 and travels within the reflection member 70, the light traveling in the reflection member 70 may reflect off the inorganic particles 77 in the reflection member 70 and be incident on the light receiving element 30. As a result, the light from the light emitting element 20 is more likely to be incident on the light receiving element 30, so that the amount of light received by the light receiving element 30 is increased.

Third Embodiment

Figure 12:
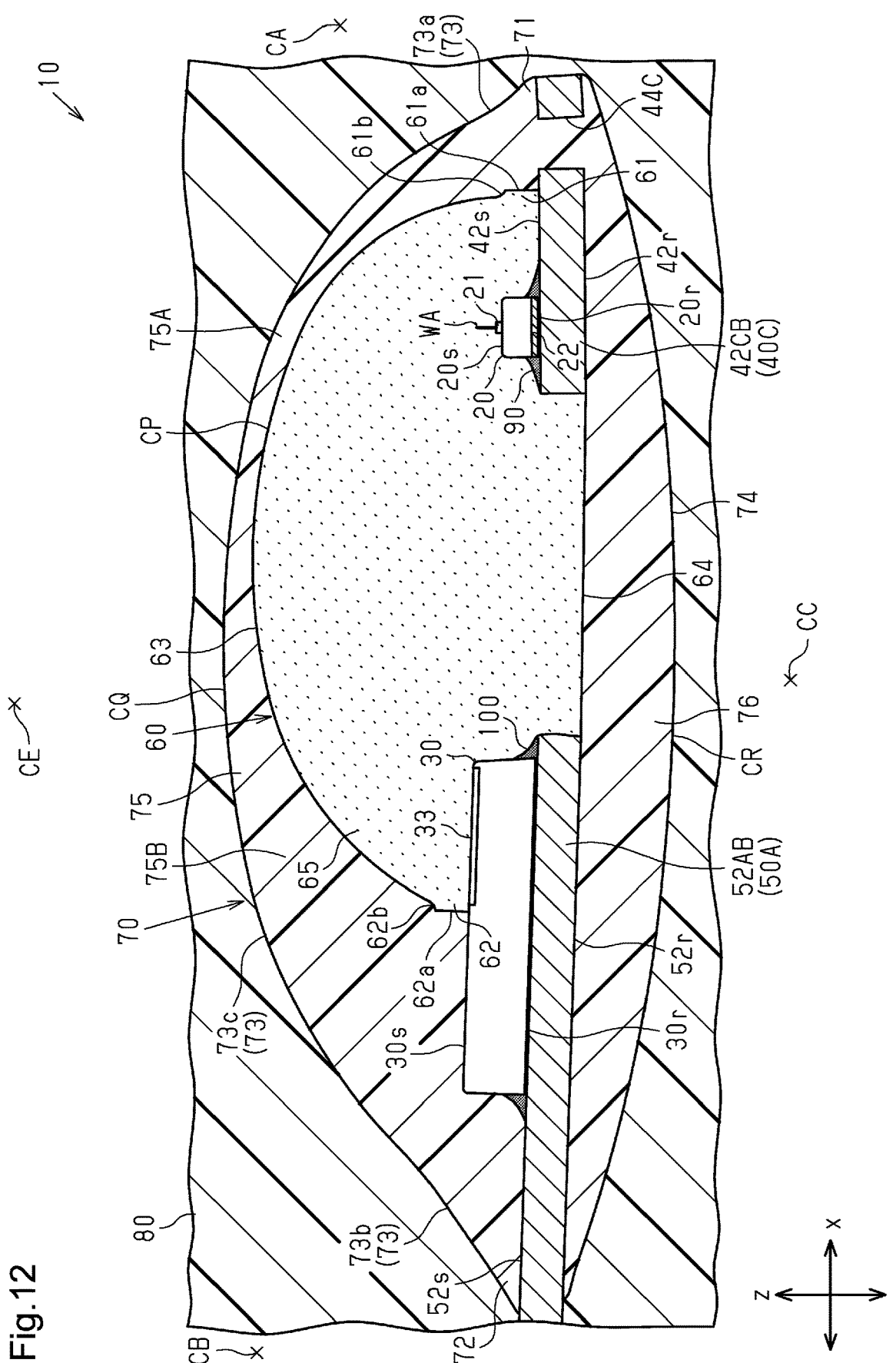
FIG. 12 is a cross-sectional view showing the cross-sectional structure of a part of an insulation module of a third embodiment.

Referring to FIG. 12, an insulation module 10 of a third embodiment is now described. The insulation module 10 of the present embodiment differs from the insulation module 10 of the first embodiment mainly in the shape of the die pad portion 42CB and the relative positions of the light emitting element 20 and the light receiving element 30. In the following description, same reference numerals are given to those components that are the same as the corresponding components of the insulation module 10 of the first embodiment. Such components will not be described.

As shown in FIG. 12, in this embodiment, the distance between the die pad portion 42CB of the first lead frame 40C and the die pad portion 52AB of the second lead frame 50A in the x-direction is greater than that in the first embodiment. The arrangement position of the light emitting element 20 relative to the die pad portion 42CB and the arrangement position of the light receiving element 30 relative to the die pad portion 52AB are the same as in the first embodiment. As such, the present embodiment has a longer distance between the light emitting element 20 and the light receiving element 30 in the x-direction than the first embodiment.

Also, in the same manner as the first embodiment, the die pad portion 52AB is longer than the die pad portion 42CB in the x-direction, which is the arrangement direction of the die pad portions 42CB and 52AB. The distance between the die pad portions 42CB and 52AB in the x-direction is greater than the length of the die pad portion 42AB in the x-direction. The length of the die pad portion 42CB in the x-direction may be the length of the die pad portion 42CB in the x-direction at the center in the y-direction of the die pad portion 42CB, for example. The distance between the die pad portions 42CB and 52AB in the x-direction is less than the length of the die pad portion 52AB in the x-direction. The length of the die pad portion 52AB in the x-direction may be the length of the die pad portion 52AB in the x-direction at the center in the y-direction of the die pad portion 52AB, for example.

Advantages of Third Embodiment

The insulation module 10 of the present embodiment has the following advantages, as well as the same advantages as the first embodiment.

(3-1) In the x-direction, the die pad portion 52AB of the second lead frame 50A is longer than the die pad portion 42CB of the first lead frame 40C. The distance in the x-direction between the die pad portions 42CB and 52AB is longer than the length of the die pad portion 42CB in the x-direction.

This configuration has a longer distance in the x-direction between the light emitting element 20 and the light receiving element 30. In other words, the distance of the optical path of the light emitting from the light emitting element 20 and entering the light receiving element 30 is lengthened. This reduces the amount of light received by the light receiving element 30.

Fourth Embodiment

Figure 13:
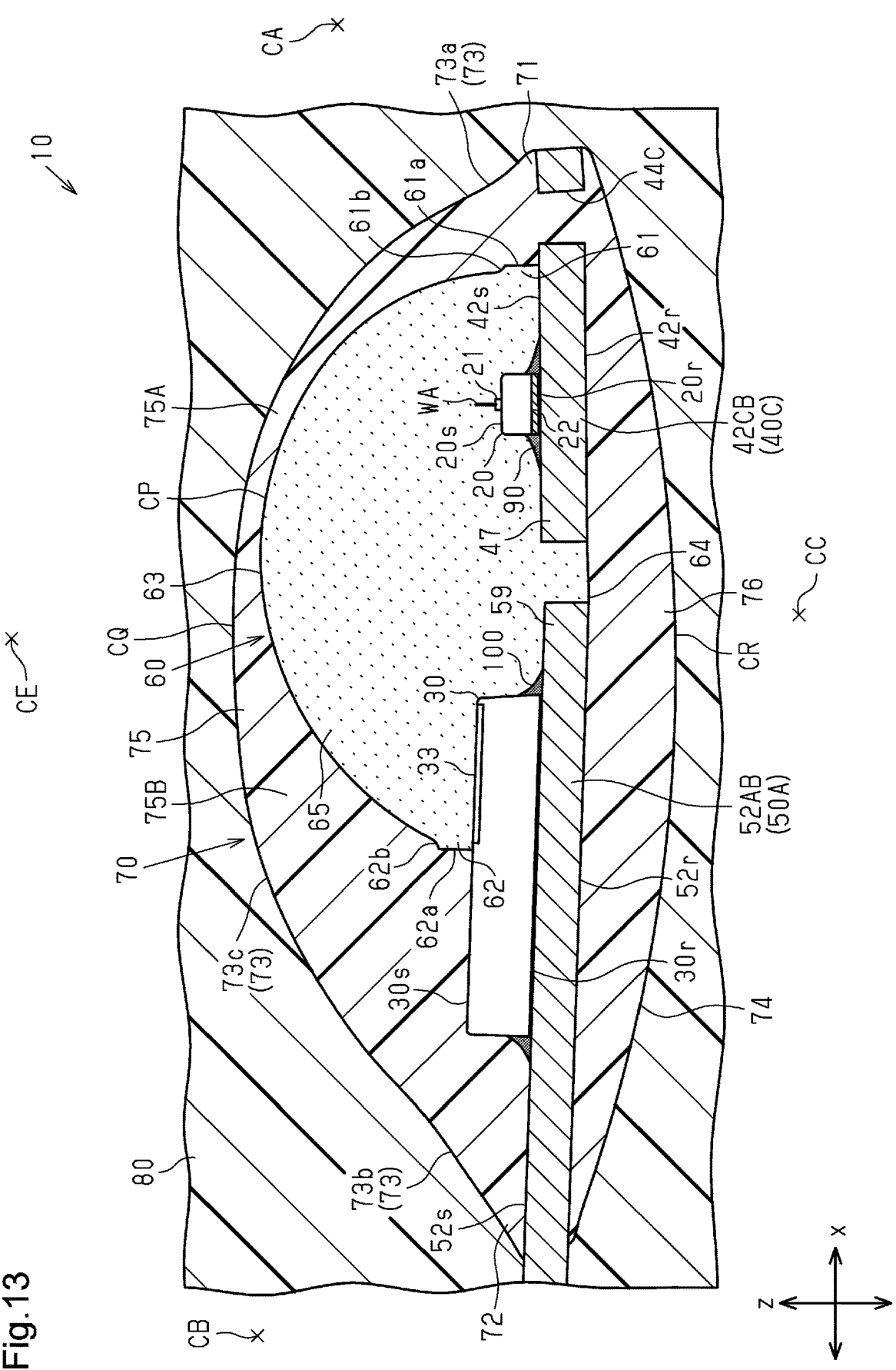
FIG. 13 is a cross-sectional view showing the cross-sectional structure of a part of an insulation module of a fourth embodiment.

Referring to FIG. 13, an insulation module 10 of a fourth embodiment is now described. The insulation module 10 of this embodiment differs from the insulation module 10 of the first embodiment mainly in the shapes of both the die pad portion 42CB of the first lead frame 40C and the die pad portion 52AB of the second lead frame 50A. In the following description, same reference numerals are given to those components that are the same as the corresponding components of the insulation module 10 of the first embodiment. Such components will not be described.

As shown in FIG. 13, the length in the x-direction of the die pad portion 42CB of the present embodiment is greater than the length in the x-direction of the die pad portion 42CB in the first embodiment. The length in the x-direction of the die pad portion 52AB is greater than the length in the x-direction of the die pad portion 52AB of the first embodiment. The die pad portion 52AB is longer than the die pad portion 42CB in the x-direction, which is the arrangement direction of the die pad portions 42CB and 52AB. The length in the x-direction of the die pad portion 42CB may be the length of the die pad portion 42CB at the center in the y-direction of the die pad portion 42CB, for example. The length of the die pad portion 52AB in the x-direction may be the length of the die pad portion 52AB in the x-direction at the center in the y-direction of the die pad portion 52AB, for example.

In the present embodiment, as compared to the first embodiment, one of the opposite end portions in the x-direction of the die pad portion 42CB that is closer to the die pad portion 52AB and one of the opposite end portions in the x-direction of the die pad portion 52AB that is closer to the die pad portion 42CB extend toward each other. As such, in this embodiment, the distance between the die pad portions 42CB and 52AB in the x-direction is less than the length of the die pad portion 42CB in the x-direction. It may also be considered that the distance between the die pad portions 42CB and 52AB in the x-direction is less than the length of the light receiving element 30 in the x-direction.

In this embodiment, the positions of the light emitting element 20 and the light receiving element 30 relative to the sealing plastic 80 are the same as in the first embodiment. Thus, the light emitting element 20 is farther from the die pad portion 52AB than the one of the end portions in the x-direction of the die pad portion 42CB that is closer to the die pad portion 52AB. That is, one of the end portions in the x-direction of the die pad portion 42CB that is closer to the die pad portion 52AB is closer to the die pad portion 52AB than the second bonding region 92 of the conductive bonding material 90. Also, the light receiving element 30 is farther from the die pad portion 42CB than one of the end portions in the x-direction of the die pad portion 52AB that is closer to the die pad portion 42CB. That is, one of the end portions in the x-direction of the die pad portion 52AB that is closer to the die pad portion 42CB is closer to the die pad portion 42CB than the second bonding region 102 of the conductive bonding material 100. In this manner, the die pad portion 42CB includes a protruding portion 47 that protrudes from the conductive bonding material 90 toward the die pad portion 52AB. The die pad portion 52AB includes a protruding portion 59 that protrudes from the conductive bonding material 100 toward the die pad portion 42CB. In this case, the projection 58A may be omitted from the die pad portion 52AB. The protruding portions 47 and 59 are in contact with the transparent plastic 60. In this embodiment, the protruding portion 47 corresponds to a first protruding portion, and the protruding portion 59 corresponds to a second protruding portion.

In this embodiment, the length in the x-direction of the protruding portion 47 of the die pad portion 42CB is longer than the distance between the die pad portions 42CB and 52AB in the x-direction. The length in the x-direction of the protruding portion 47 is longer than the length in the x-direction of the region of the second bonding region 92 of the conductive bonding material 90 that is adjacent to the protruding portion 47 in the x-direction. The length of the protruding portion 47 in the x-direction is longer than the length of the light emitting element 20 in the x-direction.

The length in the x-direction of the protruding portion 59 of the die pad portion 52AB is longer than the length in the x-direction of the region of the second bonding region 102 of the conductive bonding material 100 that is adjacent to the protruding portion 59 in the x-direction. The length of the protruding portion 59 of the die pad portion 52AB in the x-direction is longer than the distance between the die pad portions 42CB and 52AB in the x-direction. The length of the protruding portion 59 in the x-direction may be equal to the length of the protruding portion 47 in the x-direction. For example, when the difference between the length of the protruding portion 59 in the x-direction and the length of the protruding portion 47 in the x-direction is within 10% of the length of the protruding portion 59 in the x-direction, the length of the protruding portion 59 in the x-direction is considered equal to the length of the protruding portion 47 in the x-direction.

The protruding portions 47 and 59 can have any length in the x-direction. The lengths of the protruding portions 47 and 59 in the x-direction may be adjusted to adjust the amount of light reflecting off the protruding portions 47 and 59. That is, the lengths in the x-direction of the protruding portions 47 and 59 may be set such that the amount of light received by the light receiving element 30 is within a predetermined range by performing tests, for example.

Advantages of Fourth Embodiment

The insulation module 10 of the present embodiment has the following advantages, as well as the same advantages as the first embodiment.

(4-1) The die pad portion 42CB of the first lead frame 40C includes the protruding portion 47, which extends toward the die pad portion 52AB of the second lead frame 50A beyond the conductive bonding material 90. The die pad portion 52AB includes the protruding portion 59, which protrudes toward the die pad portion 42CB beyond the conductive bonding material 100.

According to this configuration, the light reflecting off the interface between the transparent plastic 60 and the reflection member 70 then reflects off the protruding portions 47 and 59 of the die pad portions 42CB and 52AB. The die pad portions 42CB and 52AB, which are made of a metal material and have a higher reflectance than a resin material, for example, can efficiently reflect the light incident on the die pad portions 42CB and 52AB. This increases the amount of light received by the light receiving element 30.

Fifth Embodiment

Figure 14:
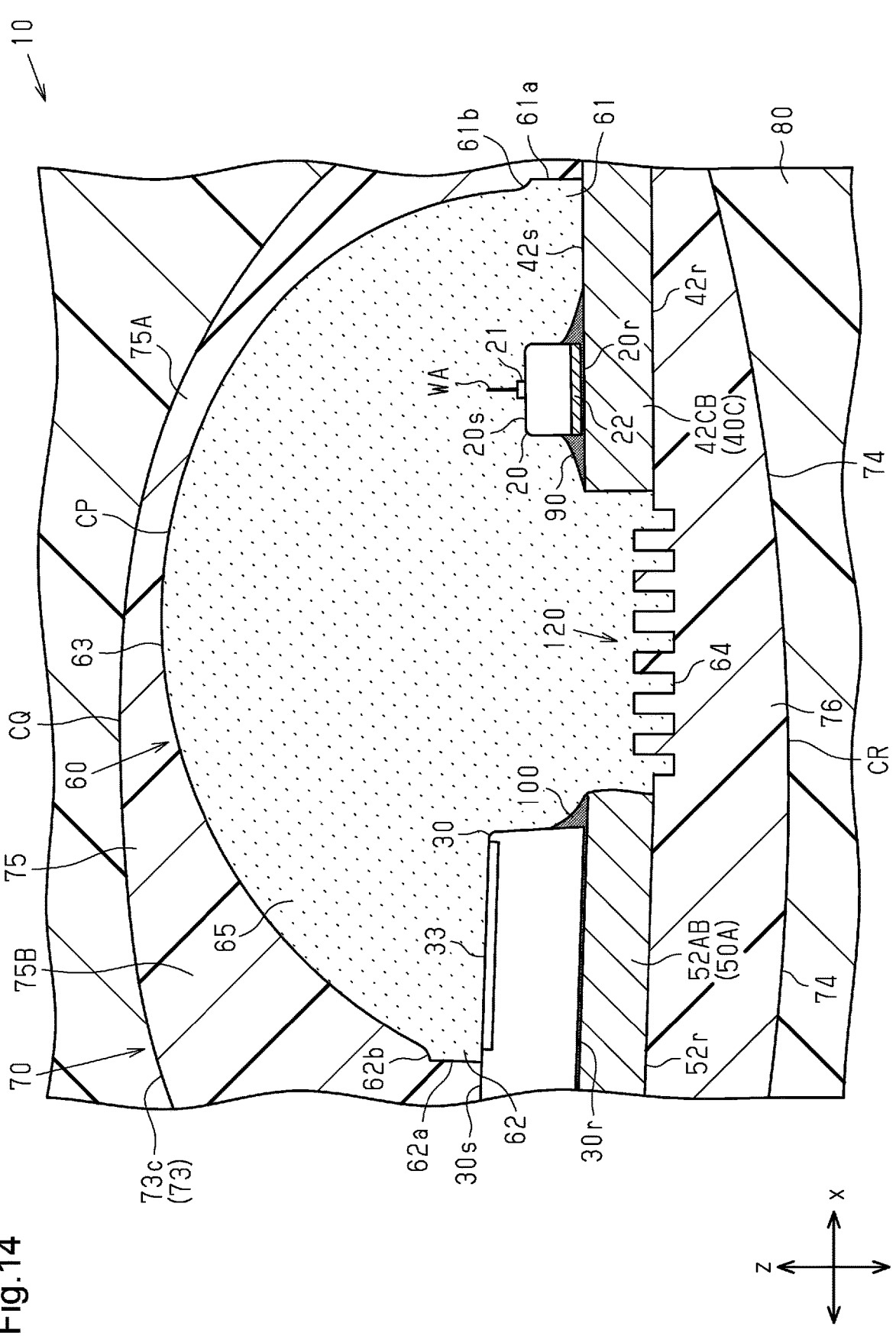
FIG. 14 is a cross-sectional view showing the cross-sectional structure of a part of an insulation module of a fifth embodiment.

Referring to FIG. 14, an insulation module 10 of a fifth embodiment is now described. The insulation module 10 of the present embodiment differs from the insulation module 10 of the first embodiment mainly in the shape of the lower end surface 64 of the transparent plastic 60. In the following description, same reference numerals are given to those components that are the same as the corresponding components of the insulation module 10 of the first embodiment. Such components will not be described.

As shown in FIG. 14, the present embodiment includes an uneven portion 120 at the interface between the lower end surface 64 of the transparent plastic 60 and the lower section 76 of the reflection member 70. It may be considered that the uneven portion 120 is provided at the interface between the reflection member 70 and the transparent plastic 60 that is located in the section between the die pad portion 42CB of the first lead frame 40C and the die pad portion 52AB of the second lead frame 50A in the x-direction. The uneven portion 120 may be provided in at least a part of the interface between the lower end surface 64 of the transparent plastic 60 and the lower section 76 of the reflection member 70. In the present embodiment, the uneven portion 120 is formed over the entire interface between the lower end surface 64 of the transparent plastic 60 and the lower section 76 of the reflection member 70 in the x-direction.

In this embodiment, the transparent plastic 60 forming the lower end surface 64 includes sections that are lower than the pad rear surface 42r of the die pad portion 42CB of the first lead frame 40C and the pad rear surface 52r of the die pad portion 52AB of the second lead frame 50A. Also, the lower section 76 includes sections that are higher than the pad rear surfaces 42r and 52r of the die pad portions 42CB and 52AB. The uneven portion 120 may be provided over the entire transparent plastic 60 in the y-direction, for example. The number of projections and depressions in the uneven portion 120 may be freely modified.

Advantages of Fifth Embodiment

The insulation module 10 of the present embodiment has the following advantages, as well as the same advantages as the first embodiment.

(5-1) The uneven portion 120 is provided at the interface between the lower end surface 64 of the transparent plastic 60 and the lower section 76 of the reflection member 70.

According to this configuration, the uneven portion 120 increases the creepage distance between the die pad portions 42CB and 52AB. This allows the dielectric strength voltage between the die pad portions 42CB and 52AB to be improved.

Modification of Fifth Embodiment

The insulation module 10 of the fifth embodiment may be modified as follows, for example.

In the present embodiment, the uneven portion 120 is provided such that the lower section 76 is above the pad rear surfaces 42r and 52r of the die pad portions 42CB and 52AB, but the present disclosure is not limited to this. For example, the lower section 76 may be formed at the same position in the z-direction as the pad rear surfaces 42r and 52r of the die pad portions 42CB and 52AB, and the uneven portion 120 may be provided such that the transparent plastic 60 is lower than the pad rear surfaces 42$r$ and 52$r$ of the die pad portions 42CB and 52AB.

In the present embodiment, the uneven portion 120 is provided such that the transparent plastic 60 is lower than the pad rear surfaces 42$r$ and 52$r$ of the die pad portions 42CB and 52AB, but the present disclosure is not limited to this. For example, the lower end surface 64 of the transparent plastic 60 may be formed at the same position in the z-direction as the pad rear surfaces 42$r$ and 52$r$ of the die pad portions 42CB and 52AB, and the uneven portion 120 may be provided such that the lower section 76 is higher than the pad rear surfaces 42$r$ and 52$r$ of the die pad portions 42CB and 52AB.

In the fifth embodiment and the modifications, the formation range of the uneven portion 120 may be freely modified. In one example, the uneven portion 120 may be provided in a part in the x-direction of the lower end surface 64 of the transparent plastic 60, that is, a part in the x-direction of the interface between the transparent plastic 60 and the lower section 76 of the reflection member 70. In short, the uneven portion 120 may be provided in at least a part in the x-direction of the interface between the transparent plastic 60 and the lower section 76 of the reflection member 70.

Sixth Embodiment

Figure 15:
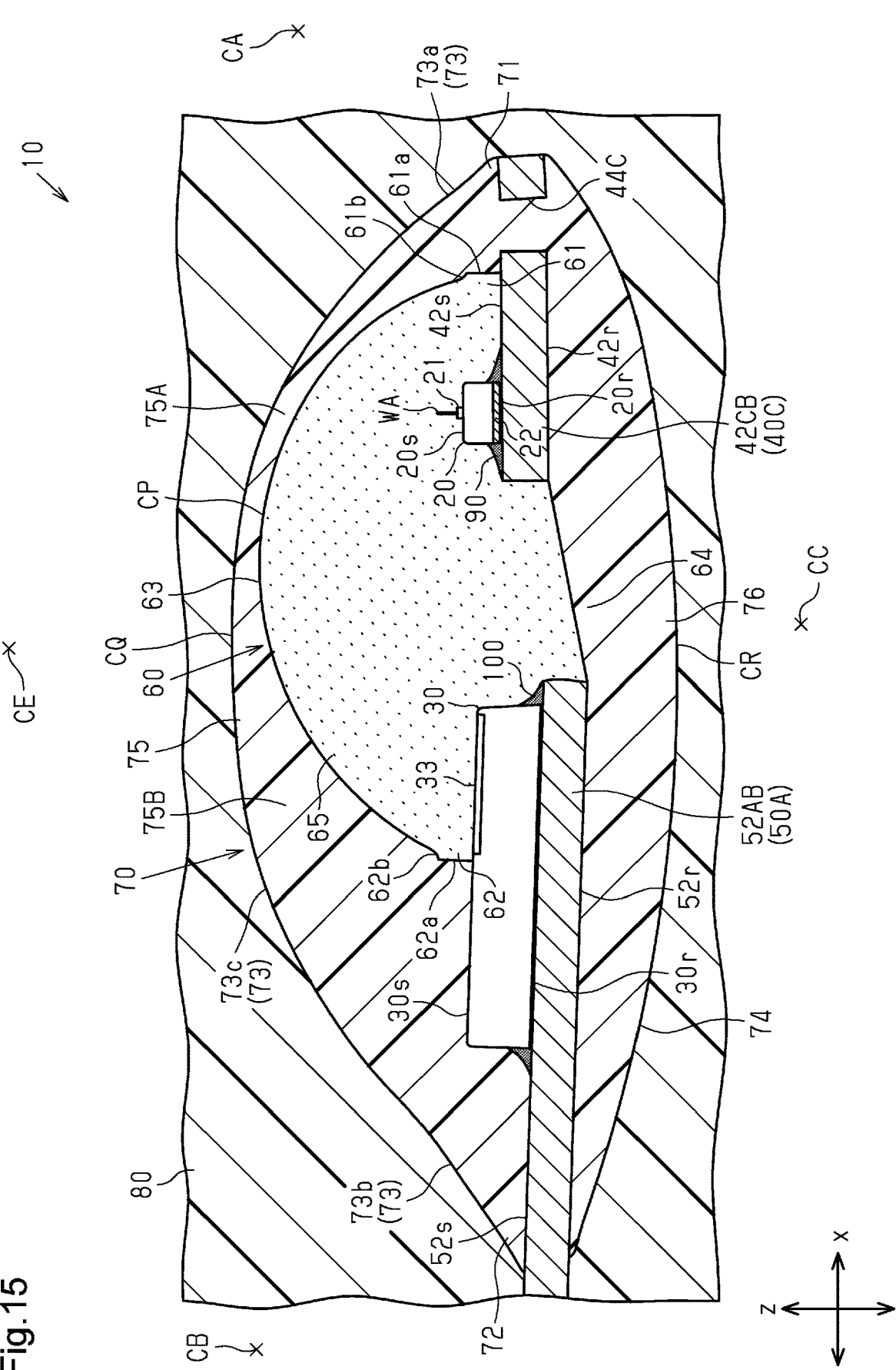
FIG. 15 is a cross-sectional view showing the cross-sectional structure of a part of an insulation module of a sixth embodiment.

Referring to FIG. 15, an insulation module 10 of a sixth embodiment is now described. The insulation module 10 of this embodiment differs from the insulation module 10 of the first embodiment mainly in the shape of the first lead frame 40C. In the following description, same reference numerals are given to those components that are the same as the corresponding components of the insulation module 10 of the first embodiment. Such components will not be described.

As shown in FIG. 15, in the present embodiment, the position of the die pad portion 42CB of the first lead frame 40C in the z-direction is higher than in the first embodiment. Accordingly, the position of the light emitting element 20 in the z-direction is higher than in the first embodiment. The position of the die pad portion 42CB is set such that the position in the z-direction of the element main surface 20$s$ of the light emitting element 20 is the same as the position in the z-direction of the element main surface 30$s$ of the light receiving element 30 or higher than the position in the z-direction of the element main surface 30$s$. In other words, the position in the z-direction of the die pad portion 42CB is set such that the position in the z-direction of the element main surface 20$s$ of the light emitting element 20 is the same as the position in the z-direction of the light receiving surface 33 (element main surface 30$s$) or higher than the position in the z-direction of the light receiving surface 33. In the present embodiment, the position of the die pad portion 42CB is set such that the position in the z-direction of the element main surface 20$s$ of the light emitting element 20 is higher than the position in the z-direction of the element main surface 30$s$ of the light receiving element 30. The pad rear surface 42$r$ of the die pad portion 42CB is higher than the pad rear surface 52$r$ of the die pad portion 52AB in the z-direction. In the present embodiment, the die pad portion 42CB is arranged such that its pad rear surface 42$r$ is at the same position in the z-direction as the pad surface 52$s$ of the die pad portion 52AB.

Although not shown, the lead portion 42CA (see FIG. 2) of the inner lead 42C of the first lead frame 40C is bent upward and connected to the die pad portion 42CB. As such, the position of the terminal 41C (see FIG. 2) in the z-direction is the same as in the first embodiment.

The shape of the transparent plastic 60 is changed because the position of the die pad portion 42CB in the z-direction is changed to a higher position. Specifically, the first end portion 61 of the transparent plastic 60 is higher than in the first embodiment. Also, the lower end surface 64 of the transparent plastic 60 is inclined upward as it extends from the die pad portion 52AB to the die pad portion 42CB.

The shape of the reflection member 70 is changed because the position of the die pad portion 42CB in the z-direction is changed to a higher position. Specifically, the first end portion 71 of the reflection member 70 is higher than in the first embodiment. The lower section 76 of the reflection member 70 includes a section formed along the lower end surface 64 of the transparent plastic 60. That is, the lower section 76 has a section that is inclined upward as it extends from the die pad portion 52AB to the die pad portion 42CB so as to be higher than the pad rear surface 52$r$ of the die pad portion 52AB.

Advantages of Sixth Embodiment

The insulation module 10 of the present embodiment has the following advantages, as well as the same advantages as the first embodiment.

(6-1) The height position of the element main surface 20$s$ forming the light emitting surface of the light emitting element 20 is higher than the height position of the element main surface 30$s$ including the light receiving surface 33 of the light receiving element 30. According to this configuration, by changing the relative position in the z-direction between the element main surface 20$s$ of the light emitting element 20 and the element main surface 30$s$ of the light receiving element 30, the amount of light received by the light receiving element 30 from the light emitting element 20 can be adjusted.

Seventh Embodiment

Referring to FIGS. 16 to 19, an insulation module 10 of a sixth embodiment is now described. The insulation module 10 of this embodiment differs from the insulation module 10 of the first embodiment mainly in that two light emitting elements 20 and two light receiving elements 30 are provided. In the following description, same reference numerals are given to those components that are the same as the corresponding components of the insulation module 10 of the first embodiment. Such components will not be described. In the present embodiment, the x-direction corresponds to a second direction, and the y-direction corresponds to a first direction.

Figure 16:
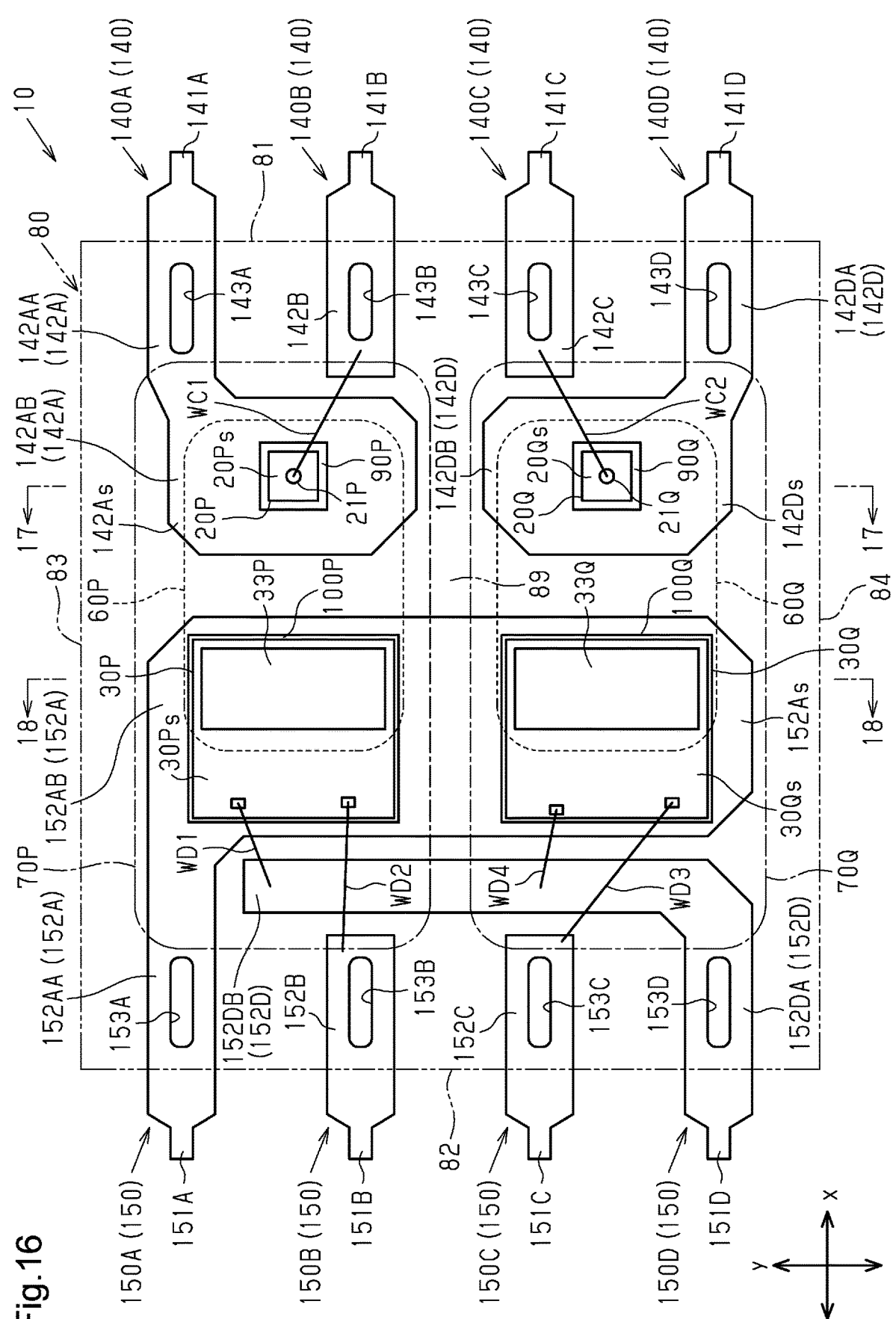
FIG. 16 is a plan view schematically showing the internal structure of an insulation module of a seventh embodiment.
Figure 17:
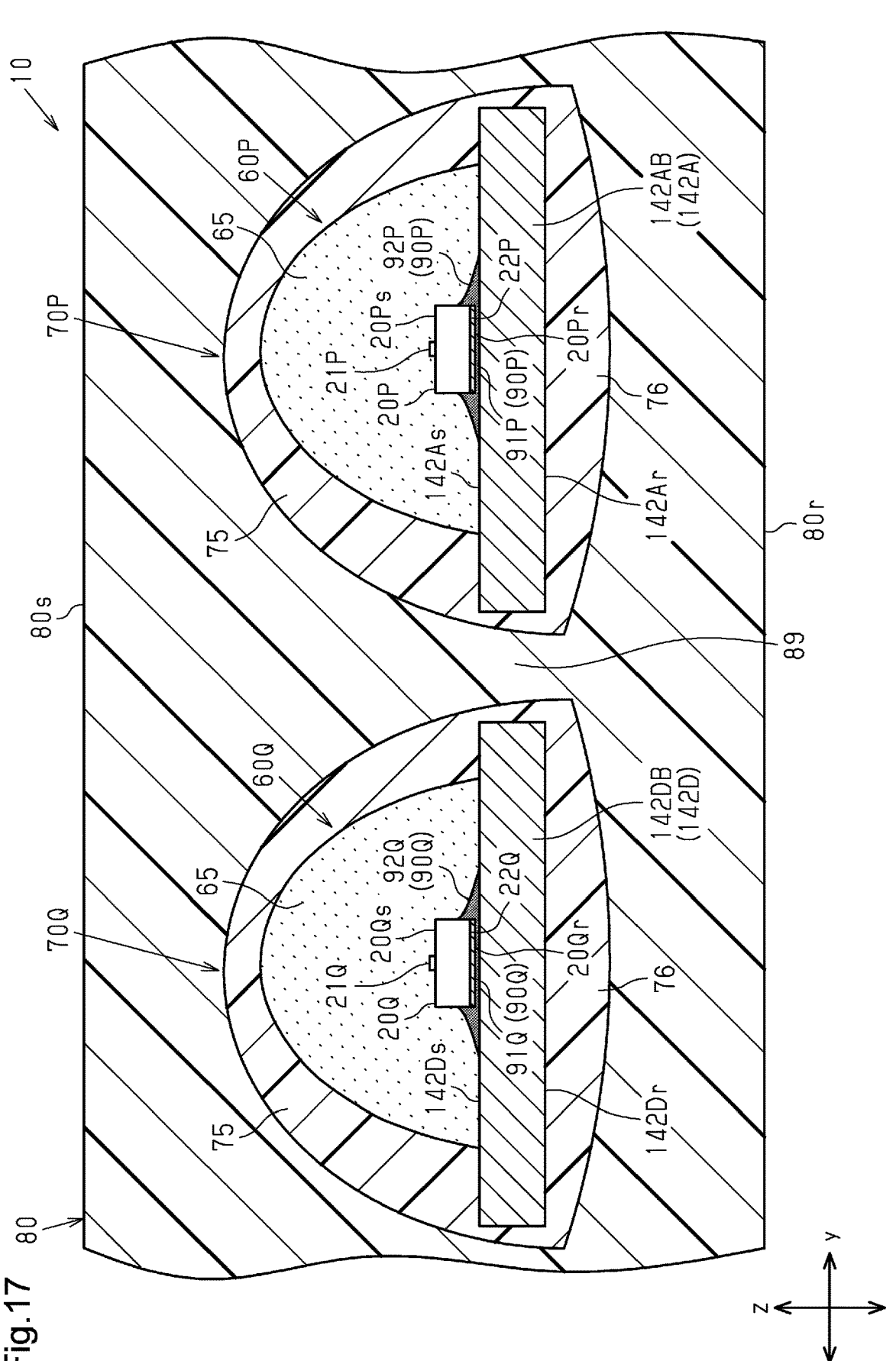
FIG. 17 is a cross-sectional view of the insulation module of FIG. 16 taken along line 17-17.
Figure 18:
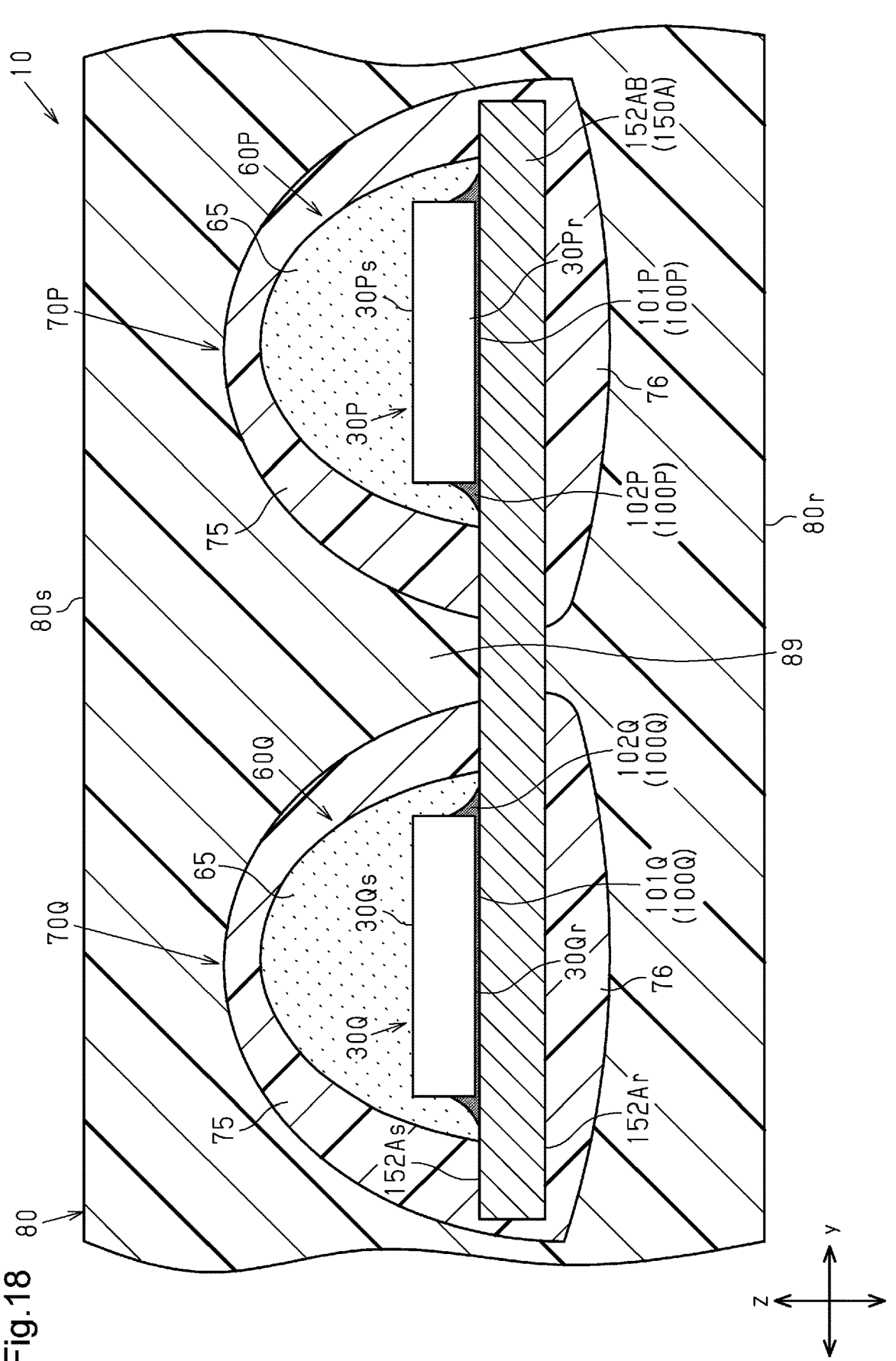
FIG. 18 is a cross-sectional view of the insulation module of FIG. 16 taken along line 18-18.

FIG. 16 is a plan view schematically showing the internal configuration of the insulation module 10 of this embodiment. FIG. 17 is a cross-sectional view of the insulation module 10 taken along line 17-17 in FIG. 16. FIG. 18 is a cross-sectional view of the insulation module 10 taken along line 18-18 in FIG. 16.

As shown in FIG. 16, the insulation module 10 includes a first lead frame 140, a second lead frame 150, a first light emitting element 20P, a second light emitting element 20Q, a first light receiving element 30P, and a second light receiving element 30Q. The first light emitting element 20P and the first light receiving element 30P form a first photocoupler. The second light emitting element 20Q and the second light receiving element 30Q form a second photocoupler.

The lead frames 140 and 150 are made of the same material as the lead frames 40 and 50 of the first embodiment, for example. Also, the lead frames 140 and 150 have plating layers in the same manner as the lead frames 40 and 50 of the first embodiment, for example.

The first lead frame 140 includes first lead frames 140A to 140D as four first lead frames. The first light emitting element 20P is mounted on the first lead frame 140A, and the second light emitting element 20Q is mounted on the first lead frame 140D. As viewed in the z-direction, the first lead frames 140A to 140D are arranged at the side of the center in the x-direction of the sealing plastic 80 corresponding to the first plastic side surface 81. As viewed in the z-direction, the second lead frames 140A to 140D are spaced apart from each other in the y-direction.

The first lead frames 140A to 140D include terminals 141A to 141D in the same manner as the terminals 41A to 41D of the first lead frames 40A to 40D of the first embodiment. The manner in which the terminals 141A to 141D are arranged is the same as the manner in which the terminals 41A to 41D are arranged.

The first lead frames 140A to 140D include inner leads 142A to 142D in the same manner as the first lead frames 40A to 40D of the first embodiment.

The inner lead 142A of the first lead frame 140A includes a lead portion 142AA and a die pad portion 142AB. In this embodiment, the die pad portion 142AB corresponds to a first light emitting die pad.

The first lead portion 142AA is continuous with the terminal 141A and extends from the first plastic side surface 81 in the x-direction. The lead portion 142AA includes a through-hole 143A. The sealing plastic 80 in the through-hole 143A limits movement of the first lead frame 140A relative to the sealing plastic 80 in directions perpendicular to the z-direction.

The die pad portion 142AB is closer to the second plastic side surface 82 than the lead portion 142AA in the x-direction. In the present embodiment, the die pad portion 142AB is closer to the first plastic side surface 81 than the center in the x-direction of the sealing plastic 80. As viewed in the z-direction, the die pad portion 142AB substantially has the shape of a rectangle with shorter sides extending in the x-direction and longer sides extending in the y-direction. As viewed in the z-direction, the die pad portion 142AB extends in the y-direction toward the fourth plastic side surface 84 beyond the lead portion 142AA.

The die pad portion 142AB is opposed to the first lead frame 140B in the x-direction. The inner lead 142B of the first lead frame 140B is closer to the first plastic side surface 81 than the die pad portion 142AB. In the same manner as the die pad portion 42CB of the first embodiment, the die pad portion 142AB is formed to be inclined with respect to the direction (horizontal direction) perpendicular to the z-direction.

The die pad portion 142AB includes a pad surface 142As and a pad rear surface 142Ar (see FIG. 17) facing away from the pad surface 142As in the z-direction. The pad surface 142As faces the same side as the plastic main surface 80s of the sealing plastic 80 (see FIG. 17), and the pad rear surface 142Ar faces the same side as the plastic rear surface 80r (see FIG. 17).

The inner lead 142B of the first lead frame 140B is continuous with the terminals 141B and extends in the x-direction. The inner lead 142B includes a through-hole 143B. In the same manner as the first embodiment, the sealing plastic 80 in the through-hole 143B limits movement of the first lead frame 140B relative to the sealing plastic 80 in directions perpendicular to the z-direction.

The inner lead 142C of the first lead frame 140C is continuous with the terminal 141C and extends in the x-direction. The inner lead 142C includes a through-hole 143C. The sealing plastic 80 in the through-hole 143C limits movement of the first lead frame 140C relative to the sealing plastic 80 in directions perpendicular to the z-direction.

The inner lead 142D of the first lead frame 140D includes a lead portion 142DA and a die pad portion 142DB. In this embodiment, the die pad portion 142DB corresponds to a second light emitting die pad.

The first lead portion 142DA is continuous with the terminal 141D and extends from the first plastic side surface 81 in the x-direction. The lead portion 142DA includes a through-hole 143D. The sealing plastic 80 in the through-hole 143D limits movement of the first lead frame 140D relative to the sealing plastic 80 in directions perpendicular to the z-direction.

The die pad portion 142DB is closer to the second plastic side surface 82 than the lead portion 142DA in the x-direction. In the present embodiment, the die pad portion 142DB is closer to the first plastic side surface 81 than the center in the x-direction of the sealing plastic 80. As viewed in the z-direction, the die pad portion 142DB substantially has the shape of a rectangle with shorter sides extending in the x-direction and longer sides extending in the y-direction. As viewed in the z-direction, the die pad portion 142DB extends in the y-direction toward the third plastic side surface 83 beyond the lead portion 142DA. The die pad portion 142DB is opposed to the inner lead 142C in the x-direction and is closer to the second plastic side surface 82 than the inner lead 142C. In the same manner as the die pad portion 42CB of the first embodiment, the die pad portion 142DB is formed to be inclined with respect to the direction (horizontal direction) perpendicular to the z-direction.

The die pad portion 142DB includes a pad surface 142Ds and a pad rear surface 142Dr (see FIG. 17) facing away from the pad surface 142Ds in the z-direction. The pad surface 142Ds faces the same side as the plastic main surface 80s of the sealing plastic 80, and the pad rear surface 142Dr faces the same side as the plastic rear surface 80r.

As shown in FIG. 16, the light emitting element 20P is mounted on a die pad portion 142AB of the first lead frame 140A. In this embodiment, the first light emitting element 20P is located at the center of the die pad portion 142AB in the x-direction and also in the y-direction. As viewed in the z-direction, the first light emitting element 20P is closer to the first plastic side surface 81 than the center in the x-direction of the sealing plastic 80 and closer to the third plastic side surface 83 than the center in the y-direction of the sealing plastic 80.

The first light emitting element 20P emits light of a first wavelength. An example of the light of the first wavelength is light of a wavelength of infrared light. As with the light emitting element 20 of the first embodiment, the first light emitting element 20P emits light upward. The shape and size of the first light emitting element 20P are the same as those of the light emitting element 20 of the first embodiment.

As shown in FIG. 17, the first light emitting element 20P includes an element main surface 20Ps and an element rear surface 20Pr facing away from the element main surface 20Ps in the z-direction. The element main surface 20Ps faces the same side as the pad surface 142As of the die pad portion 142AB, and the element rear surface 20Pr faces the same side as the pad rear surface 142Ar of the die pad portion 142AB.

The first light emitting element 20P includes a first electrode 21P and a second electrode 22P. In this embodiment, the first electrode 21P is provided on the element main surface 20Ps, and the second electrode 22P is provided on the element rear surface 20Pr. The first electrode 21P may be located at the center of the element main surface 20Ps in both the x-direction and the y-direction, for example. The second electrode 22P may be provided over the entire element rear surface 20Pr, for example.

As shown in FIG. 17, the first light emitting element 20P is bonded to the pad surface 142As of the die pad portion 142AB with a conductive bonding material 90P such as solder or Ag paste. The manner in which the conductive bonding material 90P and the first light emitting element 20P are bonded to each other is the same as the conductive bonding material 90 and the light emitting element 20 are bonded to each other in the first embodiment. In this embodiment, the conductive bonding material 90P corresponds to a first bonding material.

As with the conductive bonding material 90 of the first embodiment, the conductive bonding material 90P includes a first bonding region 91P and a second bonding region 92P. The shape of the second bonding region 92P is similar to the shape of the second bonding region 92 of the conductive bonding material 90.

The first light emitting element 20P is electrically connected to the first lead frames 140A and 140B. Specifically, as shown in FIG. 16, the first electrode 21P of the first light emitting element 20P is electrically connected to the first lead frame 140B by a wire WC1. The wire WC1 connects the first electrode 21P to the inner lead 142B of the first lead frame 140B. The wire WC1 is connected to a section of the inner lead 142B on the distal end side of the through-hole 143B. As shown in FIG. 17, the second electrode 22P of the first light emitting element 20P is electrically connected to the first lead frame 140A with the conductive bonding material 90P. In one example, the first electrode 21P is a cathode electrode, and the second electrode 22P is an anode electrode. Thus, as shown in FIG. 16, the terminal 141A forms a cathode terminal, and the terminal 141B forms an anode terminal.

The second light emitting element 20Q is mounted on the die pad portion 142DB of the first lead frame 140D. In this embodiment, the second light emitting element 20Q is located at the center of the die pad portion 142DB in the x-direction and also in the y-direction. As viewed in the z-direction, the second light emitting element 20Q is closer to the first plastic side surface 81 than the center in the x-direction of the sealing plastic 80 and closer to the fourth plastic side surface 84 than the center in the y-direction of the sealing plastic 80.

The second light emitting element 20Q emits light of a second wavelength different from the first wavelength of the first light emitting element 20P. An example of the light of the second wavelength is light of a wavelength of red light. As with the light emitting element 20 of the first embodiment, the second light emitting element 20Q emits light upward. In this embodiment, the shape and size of the first light emitting element 20P are the same as the shape and size of the second light emitting element 20Q.

The first wavelength light of the first light emitting element 20P and the second wavelength light of the second light emitting element 20Q may be freely modified. In one example, both of the first and second light emitting elements 20P and 20Q may be configured to emit visible light. For example, the first light emitting element 20P may be configured to emit light with a wavelength of blue light, and the second light emitting element 20Q may be configured to emit light with a wavelength of red light. In the present embodiment, the first wavelength light of the first light emitting element 20P and the second wavelength light of the second light emitting element 20Q have different wavelengths, but the present disclosure is not limited to this. The first and second light emitting elements 20P and 20Q may be configured to emit light of the same wavelength. In one example, both of the first and second light emitting elements 20P and 20Q are configured to emit light with a wavelength of red light. In another example, both of the first and second light emitting elements 20P and 20Q are configured to emit light with a wavelength of infrared light.

As shown in FIG. 17, the second light emitting element 20Q has an element main surface 20Qs and an element rear surface 20Qr as with the first light emitting element 20P. The element main surface 20Qs faces the same side as the pad surface 142Ds of the die pad portion 142DB, and the element rear surface 20Qr faces the same side as the pad rear surface 142Dr of the die pad portion 142DB. As with the first light emitting element 20P, the second light emitting element 20Q includes a first electrode 21Q and a second electrode 22Q. As with the first light emitting element 20P, the first electrode 21Q is provided on the element main surface 20Qs, and the second electrode 22Q is provided on the element rear surface 20Qr.

As shown in FIG. 17, the second light emitting element 20Q is bonded to the pad surface 142Ds of the die pad portion 142DB with a conductive bonding material 90Q such as solder or Ag paste. In this embodiment, the conductive bonding material 90Q corresponds to a first bonding material.

As with the conductive bonding material 90P, the conductive bonding material 90Q includes a first bonding region 91Q and a second bonding region 92Q. The shape of the second bonding region 92Q is the same as the shape of the second bonding region 92P of the conductive bonding material 90P.

The second light emitting element 20Q is electrically connected to the first lead frames 140C and 140D. Specifically, as shown in FIG. 16, the first electrode 21Q of the second light emitting element 20Q is electrically connected to the first lead frame 140C by a wire WC2. The wire WC2 connects the first electrode 21Q to the inner lead 142C of the first lead frame 140C. The wire WC2 is connected to a section of the inner lead 142C on the distal end side of the through-hole 143C. As shown in FIG. 17, the second electrode 22Q of the second light emitting element 20Q is electrically connected to the first lead frame 140D with the conductive bonding material 90Q. In one example, the first electrode 21Q is a cathode electrode and the second electrode 22Q is an anode electrode. Thus, as shown in FIG. 16, the terminal 141C forms a cathode terminal, and the terminal 141D forms an anode terminal.

The wires WC1 and WC2 are bonding wires, which may be formed of wire bonding devices (not shown). The wires WC1 and WC2 are made of a conductive material such as Cu, Al, Au, Ag, or the like. In this embodiment, the wires WC1 and WC2 are each made of a material containing Au.

As shown in FIG. 16, the second lead frame 150 includes second lead frames 150A to 150D as four second lead frames. As viewed in the z-direction, the second lead frames 150A to 150D are arranged at the side of the center in the x-direction of the sealing plastic 80 corresponding to the second plastic side surface 82. As viewed in the z-direction, the second lead frames 150A to 150D are spaced apart from each other in the y-direction.

The second lead frames 150A to 150D include terminals 151A to 151D as with the terminals 51A to 51D of the second lead frames 50A to 50D of the first embodiment. The manner in which the terminals 151A to 151D are arranged is the same as the manner in which the terminals 51A to 51D are arranged.

The second lead frames 150A to 150D have inner leads 152A to 152D as with the second lead frames 50A to 50D of the first embodiment.

The inner lead 152A of the second lead frame 150A includes a lead portion 152AA and a die pad portion 152AB. In this embodiment, the die pad portion 152AB corresponds to a second die pad.

The lead portion 152AA is continuous with the terminal 151D and extends from the second plastic side surface 82 in the x-direction. The lead portion 152AA includes a through-hole 153A. In the present embodiment, as viewed in the z-direction, the through-hole 153A has the shape of a rectangle with shorter sides extending in the x-direction and longer sides extending in the y-direction. The through-hole 153A is filled with the sealing plastic 80. The sealing plastic 80 in the through-hole 153A limits movement of the second lead frame 150D relative to the sealing plastic 80 in directions perpendicular to the z-direction.

The die pad portion 152AB is closer to the first plastic side surface 81 than the lead portion 152AA in the x-direction. In the present embodiment, the die pad portion 152AB is closer to the second plastic side surface 82 than the center in the x-direction of the sealing plastic 80. As viewed in the z-direction, the die pad portion 152AB substantially has the shape of a rectangle with shorter sides extending in the x-direction and longer sides extending in the y-direction. As viewed in the z-direction, the die pad portion 152AB extends in the y-direction toward the fourth plastic side surface 84 from the distal end portion of the lead portion 152AA.

As viewed in the z-direction, the die pad portion 152AB is opposed to both the die pad portion 142AB of the first lead frame 140A and the die pad portion 142DB of the first lead frame 140D in the x-direction. Thus, the x-direction may be considered as the arrangement direction of the die pad portions 152AB and 142AB (142DB). As viewed in the z-direction, the area of the die pad portion 152AB is larger than both the area of the die pad portion 142AB and the area of the die pad portion 142DB as viewed in the z-direction. The die pad portion 152AB is longer than the die pad portions 142AB and 142DB in the x-direction.

As shown in FIG. 16, the die pad portion 152AB is opposed to the second lead frames 150B to 150D in the x-direction. The die pad portion 152AB is closer to the first plastic side surface 81 than the second lead frames 150B to 150D in the x-direction. In the same manner as the die pad portion 52AB of the first embodiment, the die pad portion 152AB is formed to be inclined with respect to the direction (horizontal direction) perpendicular to the z-direction.

As shown in FIG. 18, the die pad portion 152AB includes a pad surface 152As and a pad rear surface 152Ar facing away from the pad surface 152As in the z-direction. The pad surface 152As faces the same side as the plastic main surface 80s of the sealing plastic 80, and the pad rear surface 152Ar faces the same side as the plastic rear surface 80r.

The inner lead 152B of the second lead frame 150B is continuous with the terminal 151B and extends in the x-direction.

The inner lead 152B includes a through-hole 153B. The sealing plastic 80 in the through-hole 153B limits movement of the second lead frame 150B relative to the sealing plastic 80 in directions perpendicular to the z-direction.

The inner lead 152C of the second lead frame 150C is continuous with the terminal 151C and extends in the x-direction.

The inner lead 152C includes a through-hole 153C. The sealing plastic 80 in the through-hole 153C limits movement of the second lead frame 150C relative to the sealing plastic 80 in directions perpendicular to the z-direction.

The inner lead 152D of the second lead frame 150D includes a lead portion 152DA and a wire connection portion 152DB.

The lead portion 152DA is continuous with the terminal 151D and extends from the second plastic side surface 82 in the x-direction. The lead portion 152DA includes a through-hole 153D. The sealing plastic 80 in the through-hole 153D limits movement of the second lead frame 150D relative to the sealing plastic 80 in directions perpendicular to the z-direction.

The wire connection portion 152DB is closer to the first plastic side surface 81 than the lead portion 152DA in the x-direction. In the present embodiment, the wire connection portion 152DB is closer to the second plastic side surface 82 than the center in the x-direction of the sealing plastic 80. As viewed in the z-direction, the wire connection portion 152DB extends in the y-direction toward the third plastic side surface 83 from the distal end portion of the lead portion 152DA. The distal end portion of the wire connection portion 152DB is closer to the third plastic side surface 83 than the center in the y-direction of the sealing plastic 80, and opposed to the lead portion 152AA in the y-direction.

The wire connection portion 152DB is opposed to the inner leads 152B and 152C in the x-direction and is closer to the second plastic side surface 82 than the inner leads 152B and 152C. Also, the wire connection portion 152DB is opposed to the die pad portion 152AB in the x-direction, and is closer to the first plastic side surface 81 than the die pad portion 152AB. That is, the wire connection portion 152DB is located between the inner leads 152B and 152C and the die pad portion 152AB in the x-direction.

As shown in FIG. 16, the first and second light receiving elements 30P and 30Q are both mounted on the die pad portion 152AB of the second lead frame 150A. As viewed in the z-direction, the first light receiving element 30P and the second light receiving element 30Q are at the same position in the x-direction and spaced apart from each other in the y-direction. In this embodiment, the first light receiving element 30P is closer to the third plastic side surface 83 than the center in the y-direction of the die pad portion 152AB, and the second light receiving element 30Q is closer to the fourth plastic side surface 84 than the center in the y-direction of the die pad portion 152AB.

The first light receiving element 30P is opposed to the first light emitting element 20P in the x-direction. The first light receiving element 30P is configured to receive light (light of the first wavelength) from the first light emitting element 20P. In one example, the shape and size of the first light receiving element 30P are the same as the shape and size of the light receiving element 30 of the first embodiment. The first light receiving element 30P includes a first semiconductor region, which receives light from the first light emitting element 20P, and a second semiconductor region, which generates a signal based on the received light. The first semiconductor region may be formed by a photodiode, for example. The second semiconductor region may be formed by an LSI, for example. That is, in the same manner as the light receiving element 30 of the first embodiment, the first light receiving element 30P of the present embodiment is an element in which the function of receiving light from the first light emitting element 20P and the function of generating a signal from the received light are integrated. As viewed in the z-direction, the first semiconductor region is formed in a section of the first light receiving element 30P that is closer to the first light emitting element 20P. The second semiconductor region is formed in a section of the first light receiving element 30P that is closer to the second lead frame 150B. The area of the first semiconductor region as viewed in the z-direction is smaller than the area of the second semiconductor region as viewed in the z-direction. As viewed in the z-direction, the dimension of the first semiconductor region in the x-direction is smaller than the dimension of the second semiconductor region in the x-direction.

The first light receiving element 30P includes an element main surface 30Ps and an element rear surface 30Pr facing away from the element main surface 30Ps in the z-direction. The element main surface 30Ps faces the same side as the pad surface 152As of the die pad portion 152AB, and the element rear surface 30Pr faces the same side as the pad rear surface 152Ar of the die pad portion 152AB. The first semiconductor region of the element main surface 30Ps includes the light receiving surface 33P.

As shown in FIG. 18, the first light receiving element 30P is bonded to the pad surface 152As of the die pad portion 152AB with a conductive bonding material 100P such as solder or Ag paste. In this embodiment, the conductive bonding material 100P corresponds to a second bonding material.

The conductive bonding material 100P includes a first bonding region 101P, which is interposed between the element rear surface 30Pr of the first light receiving element 30P and the pad surface 152As of the die pad portion 152AB, and a second bonding region 102P, which protrudes from the first light receiving element 30P as viewed in the z-direction and is bonded to the outer side surface of the first light receiving element 30P.

The second bonding region 102P is provided such that its thickness is smaller at locations farther from the section at which the second bonding region 102P is bonded to the outer side surface of the first light receiving element 30P. The second bonding region 102P is formed around the entire periphery of the first light receiving element 30P as viewed in the z-direction.

The first light receiving element 30P is electrically connected to the second lead frames 150A, 150B, and 150D. Specifically, as shown in FIG. 16, the first light receiving element 30P is electrically connected to the second lead frame 150D by one wire WD1, for example. The wire WD1 connects the first light receiving element 30P to the wire connection portion 152DB of the second lead frame 150D. The wire WD1 is connected to one of the end portions in the y-direction of the wire connection portion 152DB that is closer to the lead portion 152AA. Also, the first light receiving element 30P is electrically connected to the second lead frame 150B by one wire WD2, for example. The wire WD2 connects the first light receiving element 30P to the inner lead 152B of the second lead frame 150B. The wire WD2 is connected to a section of the inner lead 152B on the distal end side of the through-hole 153B. The first light receiving element 30P is electrically connected to the die pad portion 152AB of the second lead frame 150A with a conductive bonding material 100P.

The second light receiving element 30Q is opposed to the second light emitting element 20Q in the x-direction. The second light receiving element 30Q is configured to receive light (light of the second wavelength) from the second light emitting element 20Q. In this embodiment, the shape of the second light receiving element 30Q as viewed in the z-direction is the same as the shape of the first light receiving element 30P as viewed in the z-direction. The second light receiving element 30Q includes a first semiconductor region, which receives light from the second light emitting element 20Q, and a second semiconductor region, which generates a signal based on the received light. The first semiconductor region may be formed by a photodiode, for example. The second semiconductor region may be formed by an LSI, for example. That is, in the same manner as the first light receiving element 30P, the second light receiving element 30Q of the present embodiment is an element in which the function of receiving light from the second light emitting element 20Q and the function of generating a signal from the received light are integrated. As viewed in the z-direction, the first semiconductor region is formed in a section of the second light receiving element 30Q that is closer to the second light emitting element 20Q. The second semiconductor region is formed in a section of the second light receiving element 30Q that is closer to the second lead frame 150C. The area of the first semiconductor region as viewed in the z-direction is smaller than the area of the second semiconductor region as viewed in the z-direction. As viewed in the z-direction, the dimension of the first semiconductor region in the x-direction is smaller than the dimension of the second semiconductor region in the x-direction. The area relationship between the second light receiving element 30Q and the second light emitting element 20Q is the same as the area relationship between the first light receiving element 30P and the first light emitting element 20P.

As with the first light receiving element 30P, the second light receiving element 30Q includes an element main surface 30Qs and an element rear surface 30Qr. The element main surface 30Qs faces the same side as the pad surface 152As of the die pad portion 152AB, and the element rear surface 30Qr faces the same side as the pad rear surface 152Ar of the die pad portion 152AB. The first semiconductor region of the element main surface 30Qs includes a light receiving surface 33Q.

As shown in FIG. 18, the second light receiving element 30Q is bonded to the pad surface 152As of the die pad portion 152AB with a conductive bonding material 100Q such as solder or Ag paste. In this embodiment, the conductive bonding material 100Q corresponds to a second bonding material.

As with the conductive bonding material 100P, the conductive bonding material 100Q includes a first bonding region 101Q and a second bonding region 102Q. The shape of the second bonding region 102Q is the same as the shape of the second bonding region 102P.

The second light receiving element 30Q is electrically connected to the second lead frames 150A, 150C, and 150D. Specifically, as shown in FIG. 16, the second light receiving element 30Q is electrically connected to the second lead frame 150C by one wire WD3, for example. The wire WD3 connects the second light receiving element 30Q to the inner lead 152C of the second lead frame 150C. The wire WD3 is connected to a section of the inner lead 152C on the distal end side of the through-hole 153C. Also, the second light receiving element 30Q is electrically connected to the second lead frame 150D by two wires WD4, for example. Each wire WD4 connects the second light receiving element 30Q and the wire connection portion 152DB of the second lead frame 150D. Each wire WD4 is connected to a section of the wire connection portion 152DB that overlaps with the second lead frame 150C as viewed in the x-direction. The second light receiving element 30Q is electrically connected to the die pad portion 152AB of the second lead frame 150A by a conductive bonding material 100Q.

The wires WD1 to WD4 are bonding wires, which may be formed of wire bonding devices (not shown). The wires WD1 to WD4 are made of a conductive material such as Cu, Al, Au, Ag, or the like. In this embodiment, the wires WD1 to WD4 are made of a material containing Au.

As shown in FIG. 16, the insulation module 10 includes a first transparent plastic 60P, a second transparent plastic 60Q, a first reflection member 70P, a second reflection member 70Q, and a sealing plastic 80. To clarify the illustration, each transparent plastic 60P, 60Q is indicated by dashed line, and each reflection member 70P, 70Q is indicated by dashed dotted line.

The first transparent plastic 60P at least covers both the first light emitting element 20P and the first light receiving element 30P. Specifically, as viewed in the z-direction, the first transparent plastic 60P covers the entire first light emitting element 20P and a part of the first light receiving element 30P.

The first transparent plastic 60P covers a section of the first light receiving element 30P that is closer to the light emitting element 20P than the center of the first light receiving element 30P in the x-direction. In this embodiment, the first transparent plastic 60P covers the first semiconductor region of the first light receiving element 30P. That is, the first transparent plastic 60P does not cover the second semiconductor region of the first light receiving element 30P. As such, each of the wires WD1 and WD2 connected to the first light receiving element 30P is located outside the first transparent plastic 60P. The wires WD1 and WD2 are arranged within the first reflection member 70P.

Also, since the first transparent plastic 60P covers the entire first light emitting element 20P, a part of the wire WC1 connected to the first light emitting element 20P is located within the first transparent plastic 60P. The remaining part of the wire WC1 is located outside the first transparent plastic 60P, that is, within the first reflection member 70P. In other words, the wire WC1 extends from the first transparent plastic 60P to the first reflection member 70P. In this embodiment, the part of the wire WC1 that is connected to the first lead frame 140B is located outside the first reflection member 70P, that is, inside the sealing plastic 80.

As shown in FIG. 16, the first transparent plastic 60P is in contact with the second bonding region 92P of the conductive bonding material 90P in the same manner as the transparent plastic 60. As shown in FIG. 17, the first transparent plastic 60P is in contact with the second bonding region 102P of the conductive bonding material 100P in the same manner as the transparent plastic 60.

The first transparent plastic 60P is made of insulating plastic that transmits light from the first light emitting element 20P. Preferably, the first transparent plastic 60P is made of insulating plastic that blocks light from the second light emitting element 20Q. The first transparent plastic 60P is formed by potting, for example.

The first reflection member 70P covers the first transparent plastic 60P. In this embodiment, the first reflection member 70P covers the first light emitting element 20P, the die pad portion 142AB, the first light receiving element 30P, the die pad portion 152AB, and the first transparent plastic 60P. For example, the material of the first reflection member 70P is the same as the transparent plastic 60 of the first embodiment. The relationship in refractive index between the first reflection member 70P and the first transparent plastic 60P is the same as the relationship in refractive index between the transparent plastic 60 and the reflection member 70 in the first embodiment.

Although not shown, the shape of the cross-sectional structure of the first transparent plastic 60P taken along an xz plane is the same as the shape of the cross-sectional structure of the transparent plastic 60 taken along an xz plane (see FIG. 4). The shape of the cross-sectional structure of the first reflection member 70P taken along an xz plane is the same as the shape of the cross-sectional structure of the reflection member 70P taken along an xz plane.

The second transparent plastic 60Q covers at least both the second light emitting element 20Q and the second light receiving element 30Q. Specifically, as viewed in the z-direction, the second transparent plastic 60Q covers the entire second light emitting element 20Q and a part of the second light receiving element 30Q. The manner in which the second transparent plastic 60Q covers the second light receiving element 30Q is the same as the manner in which the first transparent plastic 60P covers the first light receiving element 30P, and is thus not described in detail. Also, the relationship between the second transparent plastic 60Q and the wires WC2, WD3, and WD4 is the same as the relationship between the first transparent plastic 60P and the wires WC1, WD1, and WD2, and is thus not described in detail. Furthermore, the relationship between the second transparent plastic 60Q and the conductive bonding materials 90Q and 100Q is the same as the relationship between the first transparent plastic 60P and the conductive bonding materials 90P and 100P, and is thus not described in detail.

The second transparent plastic 60Q is made of insulating plastic that transmits light from the second light emitting element 20Q. Preferably, the second transparent plastic 60Q is made of insulating plastic that blocks light from the first light emitting element 20P. The second transparent plastic 60Q is formed by potting, for example.

The second reflection member 70Q covers the second transparent plastic 60Q. In this embodiment, the second reflection member 70Q covers the second light emitting element 20Q, the die pad portion 142DB, the second light receiving element 30Q, the die pad portion 152AB, and the second transparent plastic 60Q.

The shape of the second transparent plastic 60Q is the same as the shape of the first transparent plastic 60P, and the shape of the second reflection member 70Q is the same as the first reflection member 70P. The material of the second reflection member 70Q is the same as the material of the first reflection member 70P. The relationship in refractive index between the second reflection member 70Q and the second transparent plastic 60Q is the same as the relationship in refractive index between the transparent plastic 60 and the reflection member 70 in the first embodiment. In the same manner as the first embodiment, the present embodiment is configured such that the light emitted from the first light emitting element 20P is not totally reflected off the interface between the first transparent plastic 60P and the first reflection member 70P. The present embodiment is also configured such that the light emitted from the second light emitting element 20Q is not totally reflected off the interface between the second transparent plastic 60Q and the second reflection member 70Q.

In the present embodiment, both the first transparent plastic 60P and the second transparent plastic 60Q include inorganic particles 65, as in the first embodiment. The inorganic particles 65 are the same as in the first embodiment.

As shown in FIGS. 16 to 18, the first reflection member 70P and the second reflection member 70Q are at the same position in the x-direction and spaced apart from each other in the y-direction. The sealing plastic 80 is interposed between the first and second reflection members 70P and 70Q. That is, the sealing plastic 80 includes a separation wall portion 89, which separates the first reflection member 70P from the second reflection member 70Q. The separation wall portion 89 is formed entirely over both of the first and second reflection members 70P and 70Q in the z-direction. That is, the separation wall portion 89 extends in the y-direction through a section between the first and second reflection members 70P and 70Q in the x-direction. The separation wall portion 89 is formed entirely over both of the first and second reflection members 70P and 70Q in the x-direction.

Electrical Configuration

Figure 19:
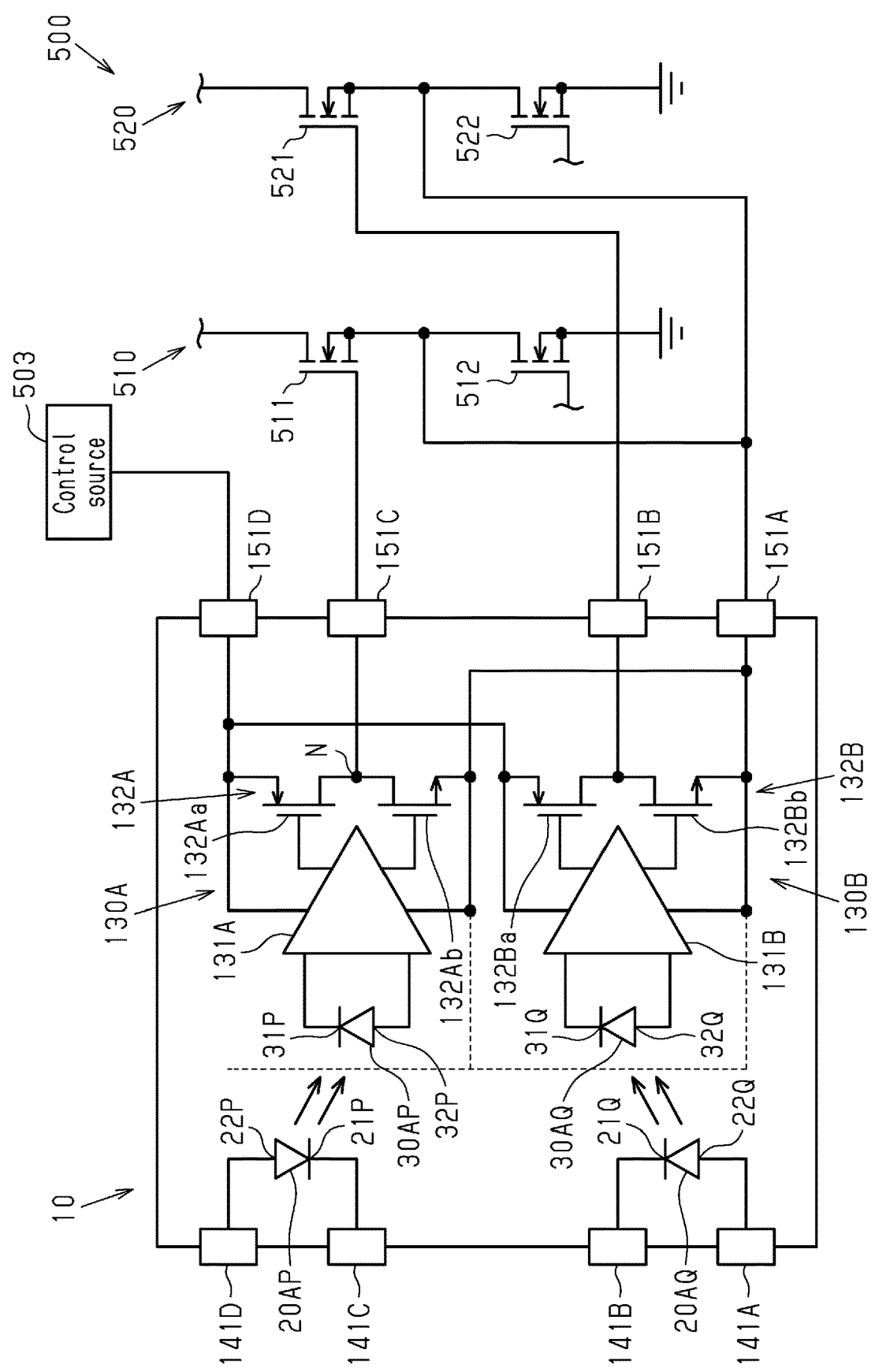
FIG. 19 is a circuit diagram schematically showing the electrical configuration of the insulation module of FIG. 16.

The electrical configuration of the insulation module 10 is now described. FIG. 19 is a circuit diagram schematically showing the circuit configuration of the insulation module 10 and the connection configuration between the insulation module 10 and an inverter circuit 500.

The inverter circuit 500 of this embodiment is a full-bridge inverter circuit and includes a first inverter circuit 510 and a second inverter circuit 520, which is connected in parallel with the first inverter circuit 510. The first inverter circuit 510 includes a first switching element 511 and a second switching element 512, which are connected in series. The second inverter circuit 520 includes a first switching element 521 and a second switching element 522, which are connected in series. For example, the first switching elements 511 and 521 may be the same as the first switching element 501 of the first embodiment, and the second switching elements 512 and 522 may be the same as the second switching element 502 of the first embodiment.

In this embodiment, the insulation module 10 applies a driving voltage signal to the gate of the first switching element 511 and the gate of the first switching element 521. That is, the insulation module 10 is a gate driver that drives the first switching elements 511 and 521.

The positive electrode of a control source 503 is electrically connected to the terminal 151D of the insulation module 10. The terminal 151A of the insulation module 10 is electrically connected to both the source of the first switching element 511 of the first inverter circuit 510 and the source of the first switching element 521 of the second inverter circuit 520.

As shown in FIG. 19, the insulation module 10 includes a first light emitting diode 20AP, a second light emitting diode 20AQ, a first light receiving diode 30AP, a second light receiving diode 30AQ, a first control circuit 130A, and a second control circuit 130B.

The first light emitting diode 20AP includes a first electrode 21P (cathode electrode) and a second electrode 22P (anode electrode) of the first light emitting element 20P. The first electrode 21P of the first light emitting diode 20AP is electrically connected to the terminal 141C, and the second electrode 22P is electrically connected to the terminal 141D.

The first light receiving diode 30AP receives light from the first light emitting diode 20AP. The first light receiving diode 30AP is electrically connected to the first control circuit 130A and insulated from the first light emitting diode 20AP. In other words, the first light emitting diode 20AP is insulated from the first control circuit 130A. The first light receiving diode 30AP includes a first electrode 31P and a second electrode 32P. In one example, the first electrode 31P is a cathode electrode, and the second electrode 32P is an anode electrode. Both the first electrode 31P and the second electrode 32P are electrically connected to the first control circuit 130A.

The first control circuit 130A includes a first Schmitt trigger 131A and a first output portion 132A. The first control circuit 130A generates an output signal based on a change in the voltage of the first light receiving diode 30AP caused by the first light receiving diode 30AP receiving light from the first light emitting diode 20AP.

The first Schmitt trigger 131A is electrically connected to both the first and second electrodes 31P and 32P of the first light receiving diode 30AP. Also, the first Schmitt trigger 131A is electrically connected to terminals 151A and 151D. That is, the control source 503 supplies power to the first Schmitt trigger 131A. The first Schmitt trigger 131A transmits the voltage of the first light receiving diode 30AP to the first output portion 132A. A predetermined hysteresis is set for the threshold voltage of the first Schmitt trigger 131A. This configuration increases the resistance to noise.

The first output portion 132A includes a first switching element 132Aa and a second switching element 132Ab, which are connected in series. In the example shown in FIG. 19, a p-type MOSFET is used for the first switching element 132Aa, and an n-type MOSFET is used for the second switching element 132Ab.

The source of the first switching element 132Aa is electrically connected to the terminal 151D. The source of the second switching element 132Ab is electrically connected to the terminal 151A. A node N between the drain of the first switching element 132Aa and the drain of the second switching element 132Ab is electrically connected to the terminal 151C.

Both the gate of the first switching element 132Aa and the gate of the second switching element 132Ab are electrically connected to the first Schmitt trigger 131A. That is, the signal from the first Schmitt trigger 131A is applied to both the gate of the first switching element 132Aa and the gate of the second switching element 132Ab.

The first and second switching elements 132Aa and 132Ab complementarily perform on/off operation according to the signal from the first Schmitt trigger 131A so that the first output portion 132A generates an output signal. The first output portion 132A outputs the output signal through the terminal 151C.

The second light emitting diode 20AQ includes a first electrode 21Q (cathode electrode) and a second electrode 22Q (anode electrode) of the second light emitting element 20Q. The first electrode 21Q of the second light emitting diode 20AQ is electrically connected to the terminal 141B, and the second electrode 22Q is electrically connected to the terminal 141A.

The second light receiving diode 30AQ receives light from the second light emitting diode 20AQ. The second light receiving diode 30AQ is electrically connected to the second control circuit 130B and insulated from the second light emitting diode 20AQ. In other words, the second light emitting diode 20AQ is insulated from the second control circuit 130B. The second light receiving diode 30AQ includes a first electrode 31Q and a second electrode 32Q. In one example, the first electrode 31Q is a cathode electrode, and the second electrode 32Q is an anode electrode. Both the first electrode 31Q and the second electrode 32Q are electrically connected to the second control circuit 130B.

The second control circuit 130B includes a second Schmitt trigger 131B and a second output portion 132B. The second control circuit 130B generates a driving voltage signal based on a change in the voltage of the second light receiving diode 30AQ caused by the second light receiving diode 30AQ receiving light from the second light emitting diode 20AQ.

The second Schmitt trigger 131B is electrically connected to both the first and second electrodes 31Q and 32Q of the second light receiving diode 30AQ. Also, the second Schmitt trigger 131B is electrically connected to terminals 151A and 151D. That is, the control source 503 supplies power to the second Schmitt trigger 131B. The second Schmitt trigger 131B transmits the voltage of the second light receiving diode 30AQ to the second output portion 132B. A predetermined hysteresis is set for the threshold voltage of the second Schmitt trigger 131B. This configuration increases the resistance to noise.

The second output portion 132B includes a first switching element 132Ba and a second switching element 132Bb, which are connected in series. In the example shown in FIG. 19, a p-type MOSFET is used as the first switching element 132Ba, and an n-type MOSFET is used as the second switching element 132Bb. The manner of electrical connection between the first switching element 132Ba and the second switching element 132Bb is the same as the manner of electrical connection between the first switching element 132Aa and the second switching element 132Ab. A detailed description is therefore omitted.

As described above, the first photocoupler, which includes the first light emitting diode 20AP (first light emitting element 20P) and the first light receiving diode 30AP (first light receiving element 30P), and the second photocoupler, which includes the second light emitting diode 20AQ (second light emitting element 20Q) and the second light receiving diode 30AQ (second light receiving element 30Q), insulate the terminals 141A to 141D from the terminals 151A to 151D. The terminals 141A and 141B are electrically connected via the second light emitting diode 20AQ, and the terminals 141C and 141D are electrically connected via the first light emitting diode 20AP. However, the terminals 141A and 141B are not electrically connected to the terminals 141C and 141C.

Advantages of Seventh Embodiment

The insulation module 10 of the present embodiment has the following advantages, as well as the same advantages as the first embodiment.

(7-1) The insulation module 10 includes the first photocoupler, which includes the first light emitting element 20P and the first light receiving element 30P, and the second photocoupler, which includes the second light emitting element 20Q and the second light receiving element 30Q. The light emitting elements 20P and 20Q are electrically connected to the first lead frame 140, and the light receiving elements 30P and 30Q are electrically connected to the second lead frame 150.

According to this configuration, both the signal communicated by the first photocoupler and the signal communicated by the second photocoupler are transmitted from the first lead frame 140 to the second lead frame 150. That is, the insulation module 10 can output two types of signals in the same transmission direction.

(7-2) The insulation module 10 includes the first transparent plastic 60P, which covers the first light emitting element 20P and the first light receiving element 30P, the first reflection member 70P, which covers the first transparent plastic 60P, the second transparent plastic 60Q, which covers the second light emitting element 20Q and the second light receiving element 30Q, and the second reflection member 70Q, which covers the second transparent plastic 60Q. The sealing plastic 80 seals both of the first and second reflection members 70P and 70Q, and includes the separation wall portion 89, which separates the first reflection member 70P from the second reflection member 70Q.

According to this configuration, even if the light from the first light emitting element 20P is transmitted through both the first transparent plastic 60P and the first reflection member 70P, the separation wall portion 89 blocks this light. Thus, the light from the light emitting element 20P is unlikely to be incident on the second light receiving element 30Q. Likewise, even if the light from the second light emitting element 20Q is transmitted through both the second transparent plastic 60Q and the second reflection member 70Q, the separation wall portion 89 blocks this light. Thus, the light from the second light emitting element 20Q is unlikely to be incident on the first light receiving element 30P.

(7-3) The first light emitting element 20P emits light of a first wavelength, and the second light emitting element 20Q emits light of a second wavelength different from the first wavelength. The first transparent plastic 60P is made of a resin material that transmits light of the first wavelength and does not transmit light of the second wavelength. The second transparent plastic 60Q is made of a resin material that transmits light of the second wavelength and does not transmit light of the first wavelength.

This configuration reduces the possibility of the light of the first wavelength traveling through the second transparent plastic 60Q, so that the light from the first light emitting element 20P is unlikely to be incident on the second light receiving element 30Q. Thus, the second light receiving element 30Q is unlikely to receive the light of the first wavelength. Also, the possibility that the light of the second wavelength travels through the first transparent plastic 60P is reduced, so that the light from the second light emitting element 20Q is unlikely to be incident on the first light receiving element 30P. Thus, the first light receiving element 30P is unlikely to receive the light of the second wavelength.

Eighth Embodiment

Referring to FIGS. 20 to 23, an insulation module 10 of an eighth embodiment is now described. The insulation module 10 of this embodiment differs from the insulation module 10 of the first embodiment mainly in that two light emitting elements 20 and two light receiving elements 30 are provided. In the following description, same reference numerals are given to those components that are the same as the corresponding components of the insulation module 10 of the first embodiment. Such components will not be described.

Figure 20:
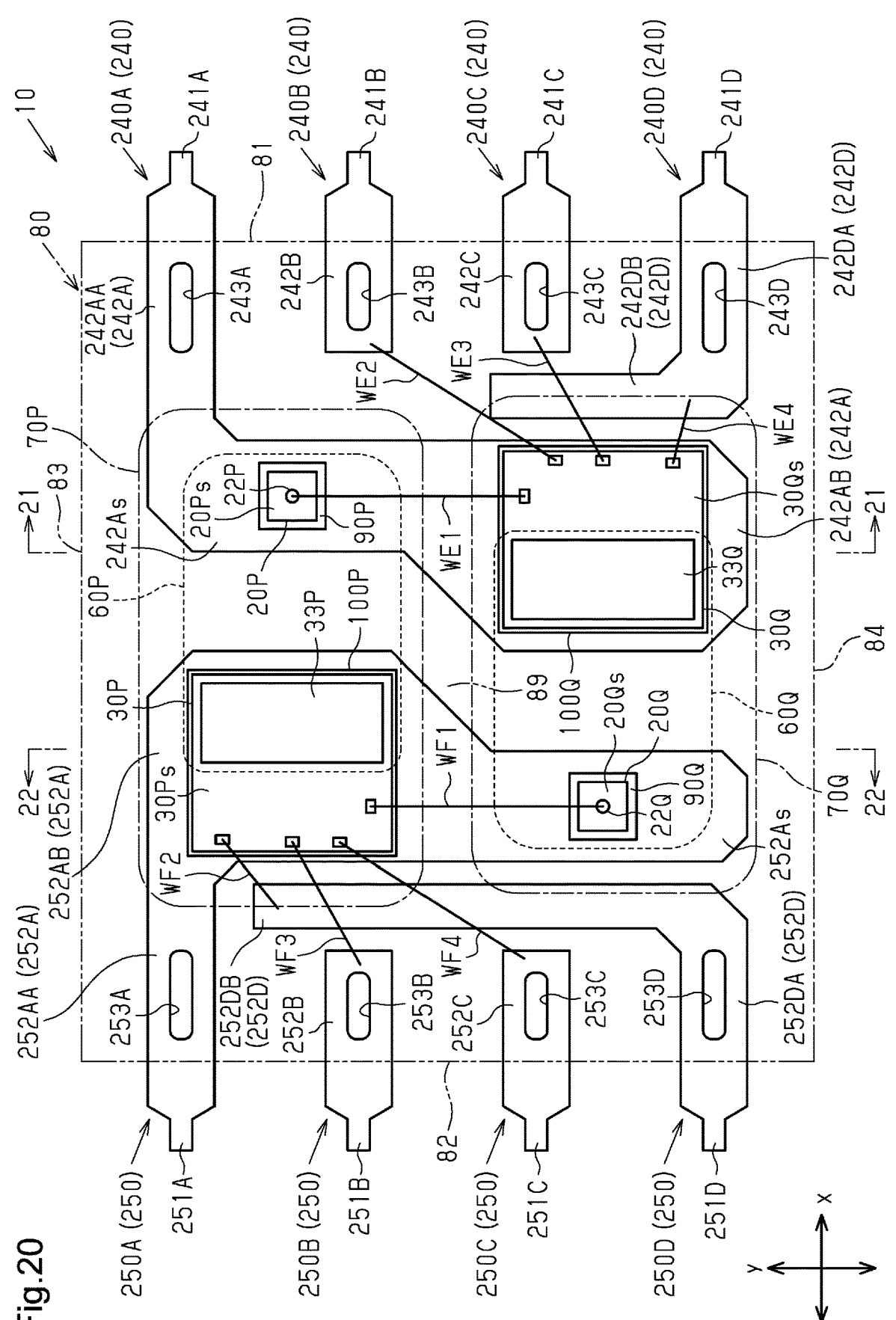
FIG. 20 is a plan view schematically showing the internal structure of the insulation module of an eighth embodiment.
Figure 21:
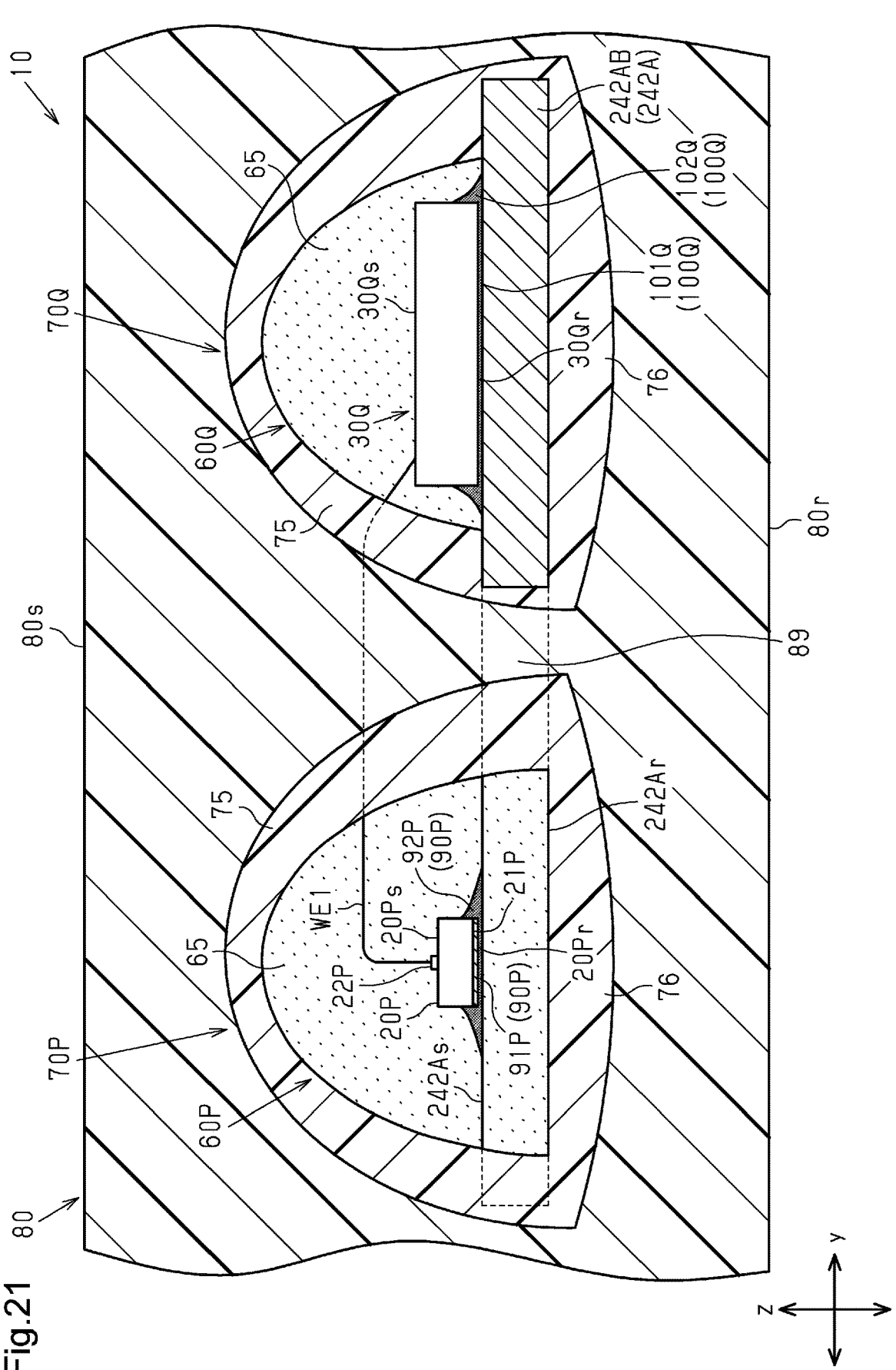
FIG. 21 is a cross-sectional view of the insulation module of FIG. 20 taken along line 21-21.
Figure 22:
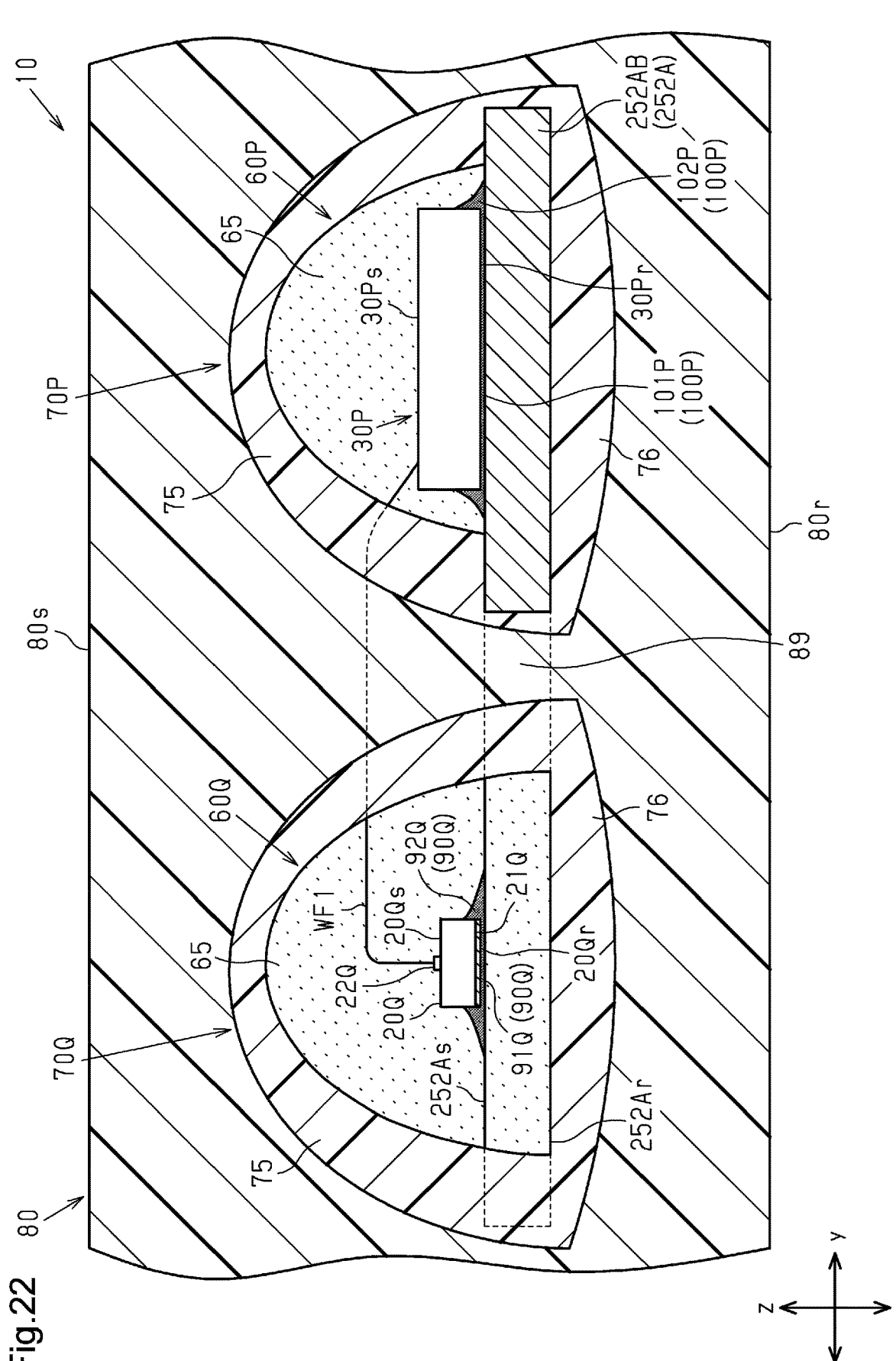
FIG. 22 is a cross-sectional view of the insulation module of FIG. 20 taken along line 22-22.

FIG. 20 is a plan view schematically showing the internal configuration of the insulation module 10 of this embodiment. FIG. 21 is a cross-sectional view of the insulation module 10 taken along line 21-21 in FIG. 20. FIG. 22 is a cross-sectional view of the insulation module 10 taken along line 22-22 in FIG. 20.

As shown in FIG. 20, the insulation module 10 includes a first lead frame 240, a second lead frame 250, a first light emitting element 20P, a second light emitting element 20Q, a first light receiving element 30P, and a second light receiving element 30Q. The configurations of the light receiving elements 30P and 30Q of this embodiment are the same as the configurations of the seventh embodiment.

The configuration of the light emitting elements 20P and 20Q of this embodiment differs from the configuration of the seventh embodiment in the formation positions of the first electrodes 21P and 21Q and the second electrodes 22P and 22Q. Specifically, in this embodiment, as shown in FIG. 21, the first electrode 21P of the first light emitting element 20P is provided on the element rear surface 20Pr, and the second electrode 22P is provided on the element main surface 20Ps. As shown in FIG. 22, the first electrode 21Q of the second light emitting element 20Q is provided on the element rear surface 20Qr, and the second electrode 22Q is provided on the element main surface 20Qs.

The lead frames 240 and 250 are made of the same material as the lead frames 40 and 50 of the first embodiment, for example. As with the lead frames 40 and 50 of the first embodiment for example, the lead frames 240 and 250 each include a main metal layer and a plating layer.

The first lead frame 240 includes first lead frames 240A to 240D as four first lead frames. The second lead frame 250 includes second lead frames 250A to 250D as four second lead frames. As viewed in the z-direction, the first lead frames 240A to 240D are arranged at the side of the center in the x-direction of the sealing plastic 80 corresponding to the first plastic side surface 81. As viewed in the z-direction, the first lead frames 240A to 240D are spaced apart from each other in the y-direction. As viewed in the z-direction, the second lead frames 250A to 250D are arranged at the side of the center in the x-direction of the sealing plastic 80 corresponding to the second plastic side surface 82. As viewed in the z-direction, the second lead frames 250A to 250D are spaced apart from each other in the y-direction. The first light emitting element 20P is mounted on the first lead frame 240A, and the second light emitting element 20Q is mounted on the second lead frame 250D. The first light receiving element 30P is mounted on the second lead frame 250A, and the second light receiving element 30Q is mounted on the first lead frame 240A.

First, the configuration of the first lead frames 240A to 240D is described.

The first lead frames 240A to 240D include terminals 241A to 241D in the same manner as the terminals 41A to 41D of the first lead frames 40A to 40D of the first embodiment. The manner in which the terminals 241A to 241D are arranged is the same as the manner in which the terminals 41A to 41D are arranged.

The first lead frames 240A to 240D include inner leads 242A to 242D as with the first lead frames 40A to 40D of the first embodiment.

The inner lead 242A of the first lead frame 240A includes a lead portion 242AA and a die pad portion 242AB. In this embodiment, the die pad portion 242AB corresponds to a first light receiving and emitting die pad.

The first lead portion 242AA is continuous with the terminal 241A and extends from the first plastic side surface 81 in the x-direction. The lead portion 242AA includes a through-hole 243A. The sealing plastic 80 in the through-hole 243A limits movement of the first lead frame 240A relative to the sealing plastic 80 in directions perpendicular to the z-direction.

The die pad portion 242AB is closer to the second plastic side surface 82 than the lead portion 242AA in the x-direction. In the present embodiment, the die pad portion 242AB is closer to the first plastic side surface 81 than the center in the x-direction of the sealing plastic 80. As viewed in the z-direction, the die pad portion 242AB extends in the y-direction toward the fourth plastic side surface 84 from the distal end portion of the lead portion 242AA. The die pad portion 242AB is formed over most of the sealing plastic 80 in the y-direction. In the same manner as the die pad portion 42CB of the first embodiment, the die pad portion 242AB is formed to be inclined with respect to the direction (horizontal direction) perpendicular to the z-direction.

The dimension in the x-direction of the second section of the die pad portion 242AB that is closer to the fourth plastic side surface 84 than the center in the y-direction is greater than the dimension in the x-direction of the first section of the die pad portion 242AB that is closer to the third plastic side surface 83 than the center in the y-direction. In this embodiment, the second section protrudes beyond the first section toward the second plastic side surface 82 in the x-direction.

The die pad portion 242AB includes a pad surface 242As and a pad rear surface 242Ar (see FIG. 21) facing away from the pad surface 242As in the z-direction. The pad surface 242As faces the same side as the plastic main surface 80s of the sealing plastic 80, and the pad rear surface 242Ar faces the same side as the plastic rear surface 80r (see FIG. 21).

The inner lead 242B of the first lead frame 240B is continuous with the terminal 241B and extends in the x-direction. The inner lead 242B is opposed to the die pad portion 242AB in the x-direction, and is closer to the first plastic side surface 81 than the die pad portion 242AB. In other words, the die pad portion 242AB is closer to the second plastic side surface 82 than the inner lead 242B. The length of the inner lead 242B in the x-direction is shorter than the length of the lead portion 242AA in the x-direction.

The inner lead 242B includes a through-hole 243B. The sealing plastic 80 in the through-hole 243B limits movement of the first lead frame 240B relative to the sealing plastic 80 in directions perpendicular to the z-direction.

The inner lead 242C of the first lead frame 240C is continuous with the terminal 241C and extends in the x-direction. The inner lead 242C is opposed to the die pad portion 242AB in the x-direction, and is closer to the first plastic side surface 81 than the die pad portion 242AB. In other words, the die pad portion 242AB is closer to the second plastic side surface 82 than the inner lead 242C. The length of the inner lead 242C in the x-direction is shorter than the length of the lead portion 242AA in the x-direction. The length of the inner lead 242B in the x-direction is longer than the length of the inner lead 242C in the x-direction.

The inner lead 242C includes a through-hole 243C. The sealing plastic 80 in the through-hole 243C limits movement of the first lead frame 240C relative to the sealing plastic 80 in directions perpendicular to the z-direction.

The inner lead 242D of the first lead frame 240D includes a lead portion 242DA and a wire connection portion 242DB.

The first lead portion 242DA is continuous with the terminal 241D and extends from the first plastic side surface 81 in the x-direction. The lead portion 242DA includes a through-hole 243D. The sealing plastic 80 in the through-hole 243D limits movement of the first lead frame 240D relative to the sealing plastic 80 in directions perpendicular to the z-direction.

The wire connection portion 242DB is closer to the second plastic side surface 82 than the lead portion 242DA in the x-direction. In the present embodiment, the wire connection portion 242DB is closer to the first plastic side surface 81 than the center in the x-direction of the sealing plastic 80. As viewed in the z-direction, the wire connection portion 242DB substantially has the shape of a rectangle with shorter sides extending in the x-direction and longer sides extending in the y-direction. As viewed in the z-direction, the wire connection portion 242DB extends in the y-direction toward the third plastic side surface 83 from the distal end portion of the lead portion 242DA. The wire connection portion 242DB is opposed to the inner lead 242C of the first lead frame 240C in the y-direction, and is closer to the second plastic side surface 82 than the inner lead 242C. The distal end of the wire connection portion 242DB is closer to the third plastic side surface 83 than the inner lead 242C, and is closer to the fourth plastic side surface 84 than the inner lead 242B.

The length of the wire connection portion 242DB in the y-direction may be freely modified. In one example, the distal end of the wire connection portion 242DB may be closer to the fourth plastic side surface 84 than the inner lead 242C.

As shown in FIG. 20, both the first light emitting element 20P and the second light receiving element 30Q are mounted on the die pad portion 242AB of the first lead frame 240A. In the present embodiment, the first light emitting element 20P is arranged on a section (first section) closer to the third plastic side surface 83 than the center in the y-direction of the die pad portion 242AB. As viewed in the z-direction, the first light emitting element 20P is closer to the first plastic side surface 81 than the center in the x-direction of the sealing plastic 80 and closer to the third plastic side surface 83 than the center in the y-direction of the sealing plastic 80. The second light receiving element 30Q is arranged on a section (second section) closer to the fourth plastic side surface 84 than the center in the y-direction of the die pad portion 242AB. As viewed in the z-direction, the second light receiving element 30Q is closer to the first plastic side surface 81 than the center in the x-direction of the sealing plastic 80 and closer to the fourth plastic side surface 84 than the center in the y-direction of the sealing plastic 80. As viewed in the y-direction, the first light emitting element 20P overlaps with the second light receiving element 30Q.

As shown in FIG. 21, the first light emitting element 20P is bonded to the pad surface 242As of the die pad portion 242AB with a conductive bonding material 90P such as solder or Ag paste. The manner of bonding between the first light emitting element 20P and the die pad portion 242AB with the conductive bonding material 90P is the same as in the seventh embodiment. In this embodiment, the conductive bonding material 90P corresponds to a first bonding material.

As shown in FIG. 21, the second light receiving element 30Q is bonded to the pad surface 242As of the die pad portion 242AB with a conductive bonding material 100Q such as solder or Ag paste. The manner of bonding between the second light receiving element 30Q and the die pad portion 242AB with the conductive bonding material 100Q is the same as in the seventh embodiment. In this embodiment, the conductive bonding material 100Q corresponds to a second bonding material.

The first light emitting element 20P is electrically connected to each of the first lead frame 240A and the second light receiving element 30Q. Specifically, as shown in FIG. 20, the second electrode 22P of the first light emitting element 20P is electrically connected to the second light receiving element 30Q by a wire WE1. The wire WE1 connects the second electrode 22P to one of the end portions in the y-direction of the second light receiving element 30Q that is closer to the first light emitting element 20P. As shown in FIG. 21, the first electrode 21P of the first light emitting element 20P is electrically connected to the first lead frame 240A by the conductive bonding material 90P. In this embodiment, the first electrode 21P is an anode electrode and the second electrode 22P is a cathode electrode.

The second light receiving element 30Q is electrically connected to each of the first lead frames 240A to 240D. Specifically, as shown in FIG. 20, the second light receiving element 30Q is electrically connected to the first lead frames 240B to 240 D by wires WE2 to WE4, for example. The wire WE2 is connected to a section of the inner lead 242B of the first lead frame 240B on the distal end side of the through-hole 243B. The wire WE3 is connected to a section of the inner lead 242C of the first lead frame 240C on the distal end side of the through-hole 243C. The wire WE4 is connected to one of the end portions in the y-direction of the wire connection portion 242DB of the first lead frame 240D that is closer to the lead portion 242DA. The second light receiving element 30Q is electrically connected to the first lead frame 240A by the conductive bonding material 100Q. The wires WE1 to WE4 are bonding wires, which may be formed of wire bonding devices (not shown). The wires WE1 to WE4 are made of a conductive material such as Cu, Al, Au, Ag, or the like. In this embodiment, the wires WE1 to WE4 are made of a material containing Au.

The second lead frames 250A to 250D are now described.

As shown in FIG. 20, the second lead frames 250A to 250D include terminals 251A to 251D in the same manner as the terminals 51A to 51D of the second lead frames 50A to 50D of the first embodiment. The manner in which the terminals 251A to 251D are arranged is the same as the manner in which the terminals 51A to 51D are arranged.

The second lead frames 250A to 250D include inner leads 252A to 252D as with the second lead frames 50A to 50D of the first embodiment.

The inner lead 252A of the second lead frame 250A includes a lead portion 252AA and a die pad portion 252AB. In this embodiment, the die pad portion 252AB corresponds to a second light receiving and emitting die pad.

The first lead portion 252AA is continuous with the terminal 251A and extends from the second plastic side surface 82 in the x-direction. The lead portion 252AA includes a through-hole 253A. The sealing plastic 80 in the through-hole 253A limits movement of the second lead frame 250A relative to the sealing plastic 80 in directions perpendicular to the z-direction.

The die pad portion 252AB is closer to the first plastic side surface 81 than the lead portion 252AA in the x-direction. In the present embodiment, the die pad portion 252AB is closer to the second plastic side surface 82 than the center in the x-direction of the sealing plastic 80. As viewed in the z-direction, the die pad portion 252AB substantially has the shape of a rectangle with shorter sides extending in the x-direction and longer sides extending in the y-direction. As viewed in the z-direction, the die pad portion 252AB extends in the y-direction toward the fourth plastic side surface 84 from the distal end portion of the lead portion 252AA. The die pad portion 252AB is formed over most of the sealing plastic 80 in the y-direction. In the same manner as the die pad portion 52AB of the first embodiment, the die pad portion 252AB is formed to be inclined with respect to the direction (horizontal direction) perpendicular to the z-direction.

The dimension in the x-direction of the second section of the die pad portion 252AB that is closer to the third plastic side surface 83 than the center in the y-direction is greater than the dimension in the x-direction of the first section of the die pad portion 252AB that is closer to the fourth plastic side surface 84 than the center in the y-direction. In this embodiment, the second section protrudes beyond the first section toward the first plastic side surface 81 in the x-direction.

As viewed in the z-direction, the die pad portion 252AB is opposed to the die pad portion 242AB of the first lead frame 240A in the x-direction. Thus, it may be considered that the x-direction is the arrangement direction of the die pad portions 252AB and 242AB. In this embodiment, the area of the die pad portion 252AB as viewed in the z-direction is equal to the area of the die pad portion 242AB as viewed in the z-direction.

The die pad portion 252AB is opposed to the inner lead 252D of the second lead frame 250D in the x-direction, and is closer to the first plastic side surface 81 than the inner leads 252B to 252D.

As shown in FIG. 22, the die pad portion 252AB includes a pad surface 252As and a pad rear surface 252Ar facing away from the pad surface 252As in the z-direction. The pad surface 252As faces the same side as the plastic main surface 80s of the sealing plastic 80, and the pad rear surface 252Ar faces the same side as the plastic rear surface 80r.

As shown in FIG. 20, the inner lead 252B of the second lead frame 250B is continuous with the terminal 251B and extends in the x-direction. The length of the inner lead 252B in the x-direction is shorter than the length of the lead portion 252AA in the x-direction. The inner lead 252B is opposed to the die pad portion 252AB in the x-direction, and is closer to the second plastic side surface 82 than the die pad portion 252AB.

The inner lead 252B includes a through-hole 253B. The sealing plastic 80 in the through-hole 253B limits movement of the second lead frame 250B relative to the sealing plastic 80 in directions perpendicular to the z-direction.

The inner lead 252C of the second lead frame 250C is continuous with the terminal 251C and extends in the x-direction. As viewed in the z-direction, the shape of the inner lead 252C is the same as the shape of the inner lead 252B. The inner lead 252C is opposed to the die pad portion 252AB in the x-direction, and is closer to the second plastic side surface 82 than the die pad portion 252AB.

The inner lead 252C includes a through-hole 253C. The sealing plastic 80 in the through-hole 253C limits movement of the second lead frame 250C relative to the sealing plastic 80 in directions perpendicular to the z-direction.

The inner lead 252D of the second lead frame 250D includes a lead portion 252DA and a wire connection portion 252DB.

The lead portion 252DA is continuous with the terminal 251D and extends from the second plastic side surface 82 in the x-direction. The lead portion 252DA includes a through-hole 253D. The sealing plastic 80 in the through-hole 253D limits movement of the second lead frame 250D relative to the sealing plastic 80 in directions perpendicular to the z-direction.

The wire connection portion 252DB is closer to the first plastic side surface 81 than the lead portion 252DA in the x-direction. In the present embodiment, the wire connection portion 252DB is closer to the second plastic side surface 82 than the center in the x-direction of the sealing plastic 80. As viewed in the z-direction, the wire connection portion 252DB substantially has the shape of a rectangle with shorter sides extending in the x-direction and longer sides extending in the y-direction. As viewed in the z-direction, the wire connection portion 252DB extends in the y-direction beyond the lead portion 252DA.

The wire connection portion 252DB is opposed to the die pad portion 252AB in the x-direction. The distal end of the wire connection portion 252DB is located closer to the third plastic side surface 83 than the inner lead 252B, and is opposed to the lead portion 252AA in the y-direction. That is, the wire connection portion 252DB is opposed to the inner leads 252B and 252C in the x-direction. The wire connection portion 252DB is closer to the first plastic side surface 81 than the inner leads 252B and 252C in the x-direction. Thus, it may be considered that the wire connection portion 252DB is arranged between the die pad portion 252AB and the inner leads 252B and 252C in the x-direction. The length of the wire connection portion 252DB in the y-direction may be freely modified. In one example, the distal end of the wire connection portion 252DB may be closer to the fourth plastic side surface 84 than the inner lead 252B.

As shown in FIG. 20, both the first light receiving element 30P and the second light emitting element 20Q are mounted on the die pad portion 252AB of the second lead frame 250A. In this embodiment, the first light receiving element 30P is mounted on a section (first section) closer to the third plastic side surface 83 than the center in the y-direction of the die pad portion 252AB, and the second light emitting element 20Q is mounted on a section (second section) closer to the fourth plastic side surface 84 than the center in the y-direction of the die pad portion 252AB. As viewed in the y-direction, the second light emitting element 20Q overlaps with the first light receiving element 30P.

As viewed in the z-direction, the first light receiving element 30P is closer to the second plastic side surface 82 than the center in the x-direction of the sealing plastic 80 and closer to the third plastic side surface 83 than the center in the y-direction of the sealing plastic 80. The first light receiving element 30P is opposed to the first light emitting element 20P in the x-direction. As viewed in the z-direction, the second light emitting element 20Q is closer to the second plastic side surface 82 than the center in the x-direction of the sealing plastic 80 and closer to the fourth plastic side surface 84 than the center in the y-direction of the sealing plastic 80. The second light emitting element 20Q is opposed to the second light receiving element 30Q in the x-direction.

As shown in FIG. 22, the first light receiving element 30P is bonded to the pad surface 252As of the die pad portion 252AB with a conductive bonding material 100P such as solder or Ag paste. The second light emitting element 20Q is bonded to the pad surface 252As of the die pad portion 252AB with a conductive bonding material 90Q such as solder or Ag paste. In this embodiment, the conductive bonding material 100P corresponds to a second bonding material, and the conductive bonding material 90Q corresponds to a first bonding material.

The second light emitting element 20Q is electrically connected to the second lead frame 250A and the first light receiving element 30P. Specifically, as shown in FIG. 20, the second electrode 22Q of the second light emitting element 20Q is electrically connected to the first light receiving element 30P by a wire WF1. The wire WF1 connects the second electrode 22Q to one of the end portions in the y-direction of the first light receiving element 30P that is closer to the second light emitting element 20Q. As shown in FIG. 22, the first electrode 21Q of the second light emitting element 20Q is electrically connected to the second lead frame 250A through the conductive bonding material 90Q. In this embodiment, the first electrode 21Q is an anode electrode, and the second electrode 22Q is a cathode electrode.

The first light receiving element 30P is electrically connected to the second lead frames 250A to 250D. Specifically, as shown in FIG. 20, the first light receiving element 30P is electrically connected to the second lead frames 250A to 250C by wires WF2 to WF4, for example. The wire WF2 is connected to one of the end portions in the y-direction of the wire connection portion 252DB of the second lead frame 250D that is closer to the lead portion 252AA. The wire WF3 is connected to a section of the inner lead 252B of the second lead frame 250B on the distal end side of the through-hole 253B. The wire WF4 is connected to a section of the inner lead 252C of the second lead frame 250C on the distal end side of the through-hole 253C. The second light receiving element 30Q is electrically connected to the second lead frame 250A with the conductive bonding material 100Q. The wires WF1 to WF4 are bonding wires, which may be formed of wire bonding devices (not shown). The wires WF1 to WF4 are made of a conductive material such as Cu, Al, Au, or Ag. In this embodiment, the wires WF1 to WF4 are made of a material containing Au.

As shown in FIG. 20, the insulation module 10 includes a first transparent plastic 60P, a second transparent plastic 60Q, a first reflection member 70P, a second reflection member 70Q, and a sealing plastic 80.

The first transparent plastic 60P at least covers both the first light emitting element 20P and the first light receiving element 30P. Specifically, as viewed in the z-direction, the first transparent plastic 60P covers the entire first light emitting element 20P and a part of the first light receiving element 30P.

The first transparent plastic 60P covers a section of the first light receiving element 30P that is closer to the first light emitting element 20P than the center in the x-direction of the first light receiving element 30P. In this embodiment, the first transparent plastic 60P covers the first semiconductor region of the first light receiving element 30P. That is, the first transparent plastic 60P does not cover the second semiconductor region of the first light receiving element 30P. As such, the wires WF1 to WF4 connected to the first light receiving element 30P are located outside the first transparent plastic 60P. The wire WF2 is arranged within the first reflection member 70P. A part of each of the wires WF3 and WF4 is arranged inside the first reflection member 70P, and the remaining part is arranged outside the first reflection member 70P, that is, inside the sealing plastic 80. The wire WF1 is arranged across the first reflection member 70P, the sealing plastic 80, the second reflection member 70Q, and the second transparent plastic 60Q.

Also, since the first transparent plastic 60P covers the entire first light emitting element 20P, a part of the wire WE1 connected to the first light emitting element 20P is located within the first transparent plastic 60P. The remaining part of the wire WE1 is located outside the first transparent plastic 60P, that is, within the first reflection member 70P. In other words, the wire WE1 extends from the first transparent plastic 60P to the first reflection member 70P. Specifically, the wire WE1 is arranged across the first transparent plastic 60P, the first reflection member 70P, the sealing plastic 80, and the second reflection member 70Q.

As shown in FIG. 21, the first transparent plastic 60P is in contact with the second bonding region 92P of the conductive bonding material 90P in the same manner as the transparent plastic 60. As shown in FIG. 22, the first transparent plastic 60P is in contact with the second bonding region 102P of the conductive bonding material 100P in the same manner as the transparent plastic 60.

The first transparent plastic 60P is made of a material that transmits light from the first light emitting element 20P. Preferably, the first transparent plastic 60P is made of a material that blocks light from the second light emitting element 20Q.

The first reflection member 70P covers the first transparent plastic 60P. In this embodiment, the first reflection member 70P covers the first light emitting element 20P, a part of the die pad portion 242AB, the first light receiving element 30P, a part of the die pad portion 252AB, and the first transparent plastic 60P. For example, the material of the first reflection member 70P is the same as the transparent plastic 60 of the first embodiment. The relationship in refractive index between the first reflection member 70P and the first transparent plastic 60P is the same as the relationship in refractive index between the transparent plastic 60 and the reflection member 70 in the first embodiment.

Although not shown, the shape of the cross-sectional structure of the first transparent plastic 60P taken along an xz plane is the same as the shape of the cross-sectional structure of the transparent plastic 60 taken along an xz plane (see FIG. 4). The shape of the cross-sectional structure of the first reflection member 70P taken along an xz plane is the same as the shape of the cross-sectional structure of the reflection member 70P taken along an xz plane.

The second transparent plastic 60Q covers at least both the second light emitting element 20Q and the second light receiving element 30Q. Specifically, as viewed in the z-direction, the second transparent plastic 60Q covers the entire second light emitting element 20Q and a part of the second light receiving element 30Q. The manner in which the second transparent plastic 60Q covers the second light receiving element 30Q is the same as the manner in which the first transparent plastic 60P covers the first light receiving element 30P, and is thus not described in detail. Also, the relationship of the second transparent plastic 60Q and the wires WE1 to WE4 and WF1 to WF4 is the same as the relationship between the first transparent plastic 60P and the wires WE1 to WE4 and WF1 to WF4, and is thus not described in detail. Furthermore, the relationship between the second transparent plastic 60Q and the conductive bonding materials 90Q and 100Q is the same as the relationship between the first transparent plastic 60P and the conductive bonding materials 90P and 100P, and is thus not described in detail.

The second transparent plastic 60Q is made of a material that transmits light from the second light emitting element 20Q. Preferably, the material of the second transparent plastic 60Q is made of a material that blocks light from the first light emitting element 20P.

The second reflection member 70Q covers the second transparent plastic 60Q. In this embodiment, the second reflection member 70Q covers the second light emitting element 20Q, a part of the die pad portion 242AB, the second light receiving element 30Q, a part of the die pad portion 252AB, and the second transparent plastic 60Q.

The shape of the second transparent plastic 60Q is the same as the shape of the first transparent plastic 60P, and the shape of the second reflection member 70Q is the same as the first reflection member 70P. The material of the second reflection member 70Q is the same as the material of the first reflection member 70P. The relationship in refractive index between the second reflection member 70Q and the second transparent plastic 60Q is the same as the relationship in refractive index between the transparent plastic 60 and the reflection member 70 in the first embodiment. In the same manner as the first embodiment, the present embodiment is configured such that the light emitted from the first light emitting element 20P is not totally reflected off the interface between the first transparent plastic 60P and the first reflection member 70P. The present embodiment is also configured such that the light emitted from the second light emitting element 20Q is not totally reflected off the interface between the second transparent plastic 60Q and the second reflection member 70Q.

As shown in FIGS. 20 to 22, the first transparent plastic 60P and the second transparent plastic 60Q are arranged apart from each other in the y-direction. As viewed in the y-direction, the first transparent plastic 60P and the second transparent plastic 60Q include sections that overlap with each other and sections that are not aligned. In other words, the first transparent plastic 60P and the second transparent plastic 60Q are partially offset in the x-direction. The first transparent plastic 60P is offset toward the first plastic side surface 81 with respect to the second transparent plastic 60Q.

The first reflection member 70P and the second reflection member 70Q are at the same position in the x-direction and spaced apart from each other in the y-direction. The sealing plastic 80 is interposed between the first reflection member 70P and the second reflection member 70Q. That is, the sealing plastic 80 includes a separation wall portion 89, which separates the first reflection member 70P from the second reflection member 70Q. The separation wall portion 89 is formed entirely over both of the first and second reflection members 70P and 70Q in the z-direction. The separation wall portion 89 is formed entirely over both the first and second reflection members 70P and 70Q in the x-direction.

Electrical Configuration

Figure 23:
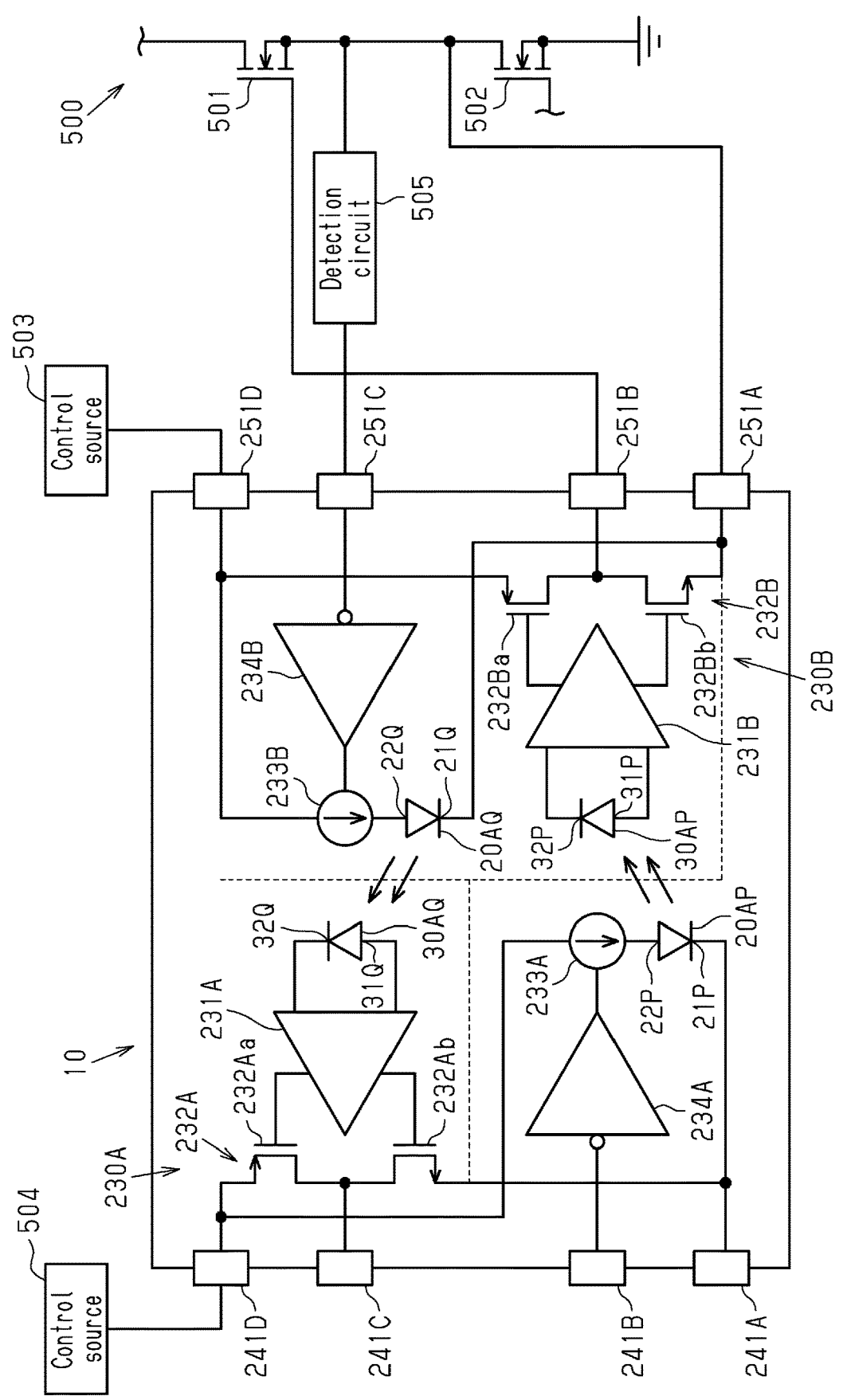
FIG. 23 is a circuit diagram schematically showing the electrical configuration of the insulation module of FIG. 20.

The electrical configuration of the insulation module 10 is now described. FIG. 23 is a circuit diagram schematically showing the circuit configuration of the insulation module 10 and the connection configuration between the insulation module 10 and the inverter circuit 500. The inverter circuit 500 of this embodiment has the same circuit configuration as that of the first embodiment.

The positive electrode of a control source 503 is electrically connected to the terminal 251A of the insulation module 10. The terminal 251D of the insulation module 10 is electrically connected between the source of the first switching element 501 and the drain of the second switching element 502.

As shown in FIG. 23, the insulation module 10 includes a first light emitting diode 20AP, a second light emitting diode 20AQ, a first light receiving diode 30AP, a second light receiving diode 30AQ, a first control circuit 230A, and a second control circuit 230B. The configurations of the light emitting diodes 20AP and 20AQ and the light receiving diodes 30AP and 30AQ are the same as those in the seventh embodiment.

The first light emitting diode 20AP is connected to terminals 241A and 241D. Specifically, the first electrode 21P (cathode electrode) of the first light emitting diode 20AP is electrically connected to the terminal 241A, and the second electrode 22P (anode electrode) is electrically connected to the terminal 241D. A control source 504 is electrically connected to the terminal 241A. The control source 504 supplies a drive voltage to the first light emitting diode 20AP and the first control circuit 230A.

The first light receiving diode 30AP is electrically connected to the second control circuit 230B and insulated from the first light emitting diode 20AP. In other words, the first light emitting diode 20AP is insulated from the second control circuit 230B. The second light emitting diode 20AQ is electrically connected to the second control circuit 230B. Both the first electrode 31P (anode electrode) and the second electrode 32P (cathode electrode) of the first light receiving diode 30AP are electrically connected to the second control circuit 230B. The first control circuit 230A is electrically connected to terminals 241A to 241D.

The second light emitting diode 20AQ is connected to terminals 251A and 251D. Specifically, the first electrode 21Q (cathode electrode) of the second light emitting diode 20AQ is electrically connected to the terminal 251A, and the second electrode 22Q (anode electrode) is electrically connected to the terminal 251D. A control source 503 is electrically connected to the terminal 251D. The control source 503 supplies a drive voltage to the second light emitting diode 20AQ and the second control circuit 230B.

The second light receiving diode 30AQ is electrically connected to the first control circuit 230A and insulated from the second light emitting diode 20AQ. In other words, the second light emitting diode 20AQ is insulated from the first control circuit 230A. The first light emitting diode 20AP is electrically connected to the first control circuit 230A. Both the first electrode 31Q (anode electrode) and the second electrode 32Q (cathode electrode) of the second light receiving diode 30AQ are electrically connected to the first control circuit 230A. The second control circuit 230B is electrically connected to terminals 251A to 251D.

In this manner, the first light emitting diode 20AP and the first light receiving diode 30AP form a first photocoupler that transmits signals from the terminals 251A to 251D, that is, the inverter circuit 500, to the terminals 241A to 241D. The second light emitting diode 20AQ and the second light receiving diode 30AQ form a second photocoupler that transmits signals from the terminals 241A to 241D to the terminals 251A to 251D. That is, the insulation module 10 of this embodiment is configured to transmit signals bidirectionally. The first and second photocouplers insulate the terminals 241A to 241D from the terminals 251A to 251D.

The configuration of the control circuits 230A and 230B is now described.

The first control circuit 230A includes a first Schmitt trigger 231A, a first output portion 232A, a first current source 233A, and a first driver 234A. The first current source 233A and the first driver 234A form a driving portion for driving the second light emitting diode 20AQ.

The configurations of the first Schmitt trigger 231A and the first output portion 232A are the same as those in the seventh embodiment. The manner in which the first Schmitt trigger 231A and the first light receiving diode 30AP are connected to each other and the manner in which the first Schmitt trigger 231A and the first output portion 232A are connected to each other are the same as those in the seventh embodiment. However, the present embodiment differs from the seventh embodiment in that the first output portion 232A is connected to terminals 241A, 241C, and 241D. That is, the first control circuit 230A is connected to the terminals 241A, 241C, and 241D instead of the terminals 251B to 251D, to which the inverter circuit 500 is electrically connected. In the same manner as the seventh embodiment, the first output portion 232A includes a first switching element 232Aa and a second switching element 232Ab, which form a CMOS.

The first current source 233A is electrically connected to the terminal 241D and the second electrode 22P of the first light emitting diode 20AP. Thus, a constant current can be supplied to the first light emitting diode 20AP through the terminal 241D.

The first driver 234A is electrically connected to both the first current source 233A and the terminal 241B. The first driver 234A is a circuit that controls the supply of current to the first light emitting diode 20AP. That is, the first driver 234A controls the supply of current to the first light emitting diode 20AP according to the control signal supplied to the terminal 241B from the outside of the insulation module 10. In one example, when a control signal is input to the first driver 234A, the first driver 234A supplies current to the first light emitting diode 20AP. In contrast, when a control signal is not input to the first driver 234A, the first driver 234A does not supply current to the first light emitting diode 20AP.

The second control circuit 230B includes a second Schmitt trigger 231B, a second output portion 232B, a second current source 233B, and a second driver 234B. The second current source 233B and the second driver 234B form a driving portion that drives the second light emitting diode 20AQ.

The configurations of the second Schmitt trigger 231B and the second output portion 232B are similar to those in the seventh embodiment. The manner in which the second Schmitt trigger 231B and the first light receiving diode 30AP are connected to each other, the manner in which the second Schmitt trigger 231B and the second output portion 232B are connected to each other, and the manner in which the second output portion 232B and the terminals 251A, 251B, and 251D are connected to each other are the same as those in the seventh embodiment. In the same manner as the seventh embodiment, the second output portion 232B includes a first switching element 232Ba and a second switching element 232Bb, which form a CMOS.

The second current source 233B is electrically connected to the terminal 251D and the second electrode 22Q of the second light emitting diode 20AQ. Thus, a constant current can be supplied from the terminal 251D to the second light emitting diode 20AQ.

The second driver 234B is electrically connected to both the second current source 233B and the terminal 251C. The second driver 234B is a circuit that controls the current supply to the second light emitting diode 20AQ. That is, the second driver 234B controls the supply of current to the second light emitting diode 20AQ according to the control signal supplied to the terminal 251C from the outside of the insulation module 10. In one example, when a control signal is input to the second driver 234B, the second driver 234B supplies current to the second light emitting diode 20AQ. In contrast, when a control signal is not input to the second driver 234B, the second driver 234B does not supply current to the second light emitting diode 20AQ.

In this embodiment, the terminal 251C is electrically connected to a detection circuit 505, which detects the voltage between the source of the first switching element 501 and the drain of the second switching element 502 of the inverter circuit 500. Upon detecting an excessively high voltage between the source of the first switching element 501 and the drain of the second switching element 502, the detection circuit 505 supplies an abnormality signal to the terminal 251C as a control signal. In one example, the detection circuit 505 is configured to supply an abnormality signal to the terminal 251C when the voltage between the source of the first switching element 501 and the drain of the second switching element 502 becomes higher than a preset threshold.

As described above, the first photocoupler, which includes the first light emitting diode 20AP (first light emitting element 20P) and the first light receiving diode 30AP (first light receiving element 30P), and the second photocoupler, which includes the second light emitting diode 20AQ (second light emitting element 20Q) and a second light receiving diode 30AQ (second light receiving element 30Q), insulate the terminals 241A to 241D from the terminals 251A to 251D.

In the insulation module 10 of this embodiment, the first control circuit 230A may have a current limiting resistor instead of the first current source 233A. The second control circuit 230B may have a current limiting resistor instead of the second current source 233B.

Also, the first driver 234A and the first current source 233A may be omitted from the first control circuit 230A. In this case, the first electrode 21P of the first light emitting diode 20AP is electrically connected to the terminal 241A, and the second electrode 22P is electrically connected to the terminal 241D. The second driver 234B and the second current source 233B may be omitted from the second control circuit 230B. In this case, the first electrode 21Q of the second light emitting diode 20AQ is electrically connected to the terminal 251A, and the second electrode 22Q is electrically connected to the terminal 251D.

Advantages of Eighth Embodiment

The insulation module 10 of the present embodiment has the following advantages, as well as the same advantages as the first embodiment and advantages (7-2) and (7-3) of the seventh embodiment.

(8-1) The insulation module 10 includes the first photocoupler, which includes the first light emitting element 20P and the first light receiving element 30P, and the second photocoupler, which includes the second light emitting element 20Q and the second light receiving element 30Q. The first light emitting element 20P is electrically connected to the first lead frame 240, and the second light emitting element 20Q is electrically connected to the second lead frame 250. The first light receiving element 30P is electrically connected to the second lead frame 250, and the second light receiving element 30Q is electrically connected to the first lead frame 240.

According to this configuration, the first photocoupler transmits signals from the first lead frame 240 to the second lead frame 250, and the second photocoupler transmits signals from the second lead frame 250 to the first lead frame 240. Thus, the insulation module 10 can bidirectionally transmit signals.

Modifications

The above embodiments illustrate examples of modes of an insulation module according to the present disclosure, and are not intended to limit the modes. The insulation module according to the present disclosure may be embodied in modes different from the modes illustrated in the embodiments. Examples of modes include modes in which a part of the configuration of any of the above embodiments is replaced, changed, or omitted, and modes in which a new structure is added to any of the above embodiments. The following modifications may be combined to the extent that does not cause technical contradiction. In each of the following modifications, portions common to the embodiments are given the same reference numerals as in the embodiments, and a description thereof will be omitted.

The first to seventh embodiments may be combined.

The first to sixth and eighth embodiments may be combined.

In the first to sixth embodiments, the refractive index of the reflection member 70 may be smaller than the refractive index of the transparent plastic 60, and the angle of the interface between the light emitting-side opposed portion 75A of the reflection member 70 and the transparent plastic 60 may be greater than or equal to the critical angle.

According to this configuration, the light emitted from the light emitting element 20 is totally reflected off the interface between the light emitting-side opposed portion 75A of the reflection member 70 and the transparent plastic 60. Thus, the light from the light emitting element 20 is not weakened by reflection, thereby limiting a decrease in the amount of light received by the light receiving element 30 from the light emitting element 20. At least one of the set of the first reflection member 70P and the first transparent plastic 60P and the set of the second reflection member 70Q and the second transparent plastic 60Q in the seventh and eighth embodiments may be changed as the reflection member 70 and the transparent plastic 60 described above.

In the first to sixth embodiments, the refractive index of the reflection member 70 may be equal to the refractive index of the transparent plastic 60. For example, the reflection member 70 may be made of a material having the same refractive index as the refractive index of the transparent plastic 60. In the seventh and eighth embodiments, the refractive index of the first reflection member 70P may be equal to the refractive index of the first transparent plastic 60P, and the refractive index of the second reflection member 70Q may be equal to the refractive index of the second transparent plastic 60Q.

In the first and third to sixth embodiments, the inorganic particles 65 may be omitted from the transparent plastic 60.

In the seventh and eighth embodiments, the inorganic particles 65 may be omitted from the first transparent plastic 60P. The inorganic particles 65 may be omitted from the second transparent plastic 60Q.

In the seventh and eighth embodiments, the first transparent plastic 60P and the second transparent plastic 60Q may be free of inorganic particles 65, and at least one of the first reflection member 70P and the second reflection member 70Q may include inorganic particles 77.

In the seventh and eighth embodiments, at least one of the first transparent plastic 60P and the first reflection member 70P may include inorganic particles that absorb or reflect the light from the first light emitting element 20P. Also, at least one of the second transparent plastic 60Q and the second reflection member 70Q may include inorganic particles that absorb or reflect light from the second light emitting element 20Q.

In each embodiment, the shapes of the reflection member 70, the first reflection member 70P, and the second reflection member 70Q may be freely modified. In one example, the light emitting-side opposed portion 75A of the reflection member 70 may be thicker than the light receiving-side opposed portion 75B.

In each embodiment, at least one of the conductive bonding materials 90 (90P, 90Q) and 100 (100P, 100Q) may be made of a transparent conductive material or a light-absorbing conductive material, for example. That is, at least one of the conductive bonding materials 90 (90P, 90Q) and 100 (100P, 100Q) may be made of a material that does not reflect the light from the light emitting element 20 (20P, 20Q).

In the seventh and eighth embodiments, the materials of the first transparent plastic 60P and the second transparent plastic 60Q may be freely modified. In one example, the first transparent plastic 60P and the second transparent plastic 60Q may be made of the same material. In other words, both the first transparent plastic 60P and the second transparent plastic 60Q may be configured to be capable of transmitting both the first wavelength light from the first light emitting element 20P and the second wavelength light from the second light emitting element 20Q.

Figure 24:
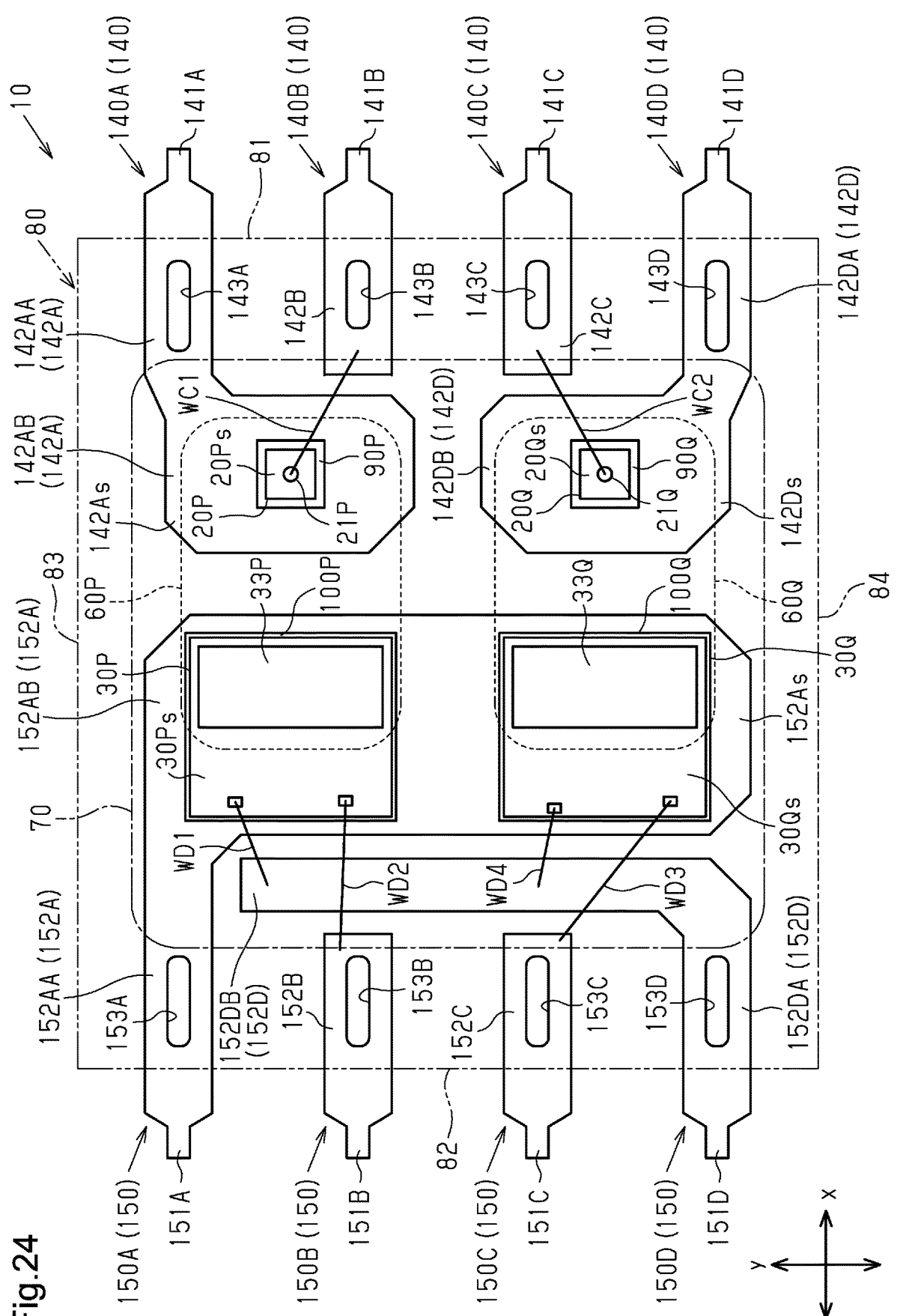
FIG. 24 is a cross-sectional view schematically showing the internal structure of an insulation module of a modification.

In the seventh and eighth embodiments, as shown in FIG. 24, instead of the first and second reflection member 70P and 70Q, the insulation module 10 may include a reflection member 70 that covers both the first transparent plastic 60P and the second transparent plastic 60Q. The reflection member 70 is interposed between the first transparent plastic 60P and the second transparent plastic 60Q in the y-direction. That is, the reflection member 70 separates the transparent plastic that covers the first light emitting element 20P and the first light receiving element 30P from the transparent plastic that covers the second light emitting element 20Q and the second light receiving element 30Q. In the illustrated example, the separation wall portion 89 of the sealing plastic 80 is omitted.

In the first to sixth embodiments, the reflection member 70 covers the entire light receiving element 30, but the disclosure is not limited to this. The reflection member 70 may cover a part of the second semiconductor region of the light receiving element 30. In other words, the volume of the reflection member 70 may be made smaller than the volume in the first to sixth embodiments. This reduces the effect of the difference in thermal expansion between the reflection member 70 and the sealing plastic 80 on the reflection member 70 and the sealing plastic 80.

In each embodiment, the lower section 76 may be omitted from the reflection member 70, the first reflection member 70P, or the second reflection member 70Q.

Figure 25:
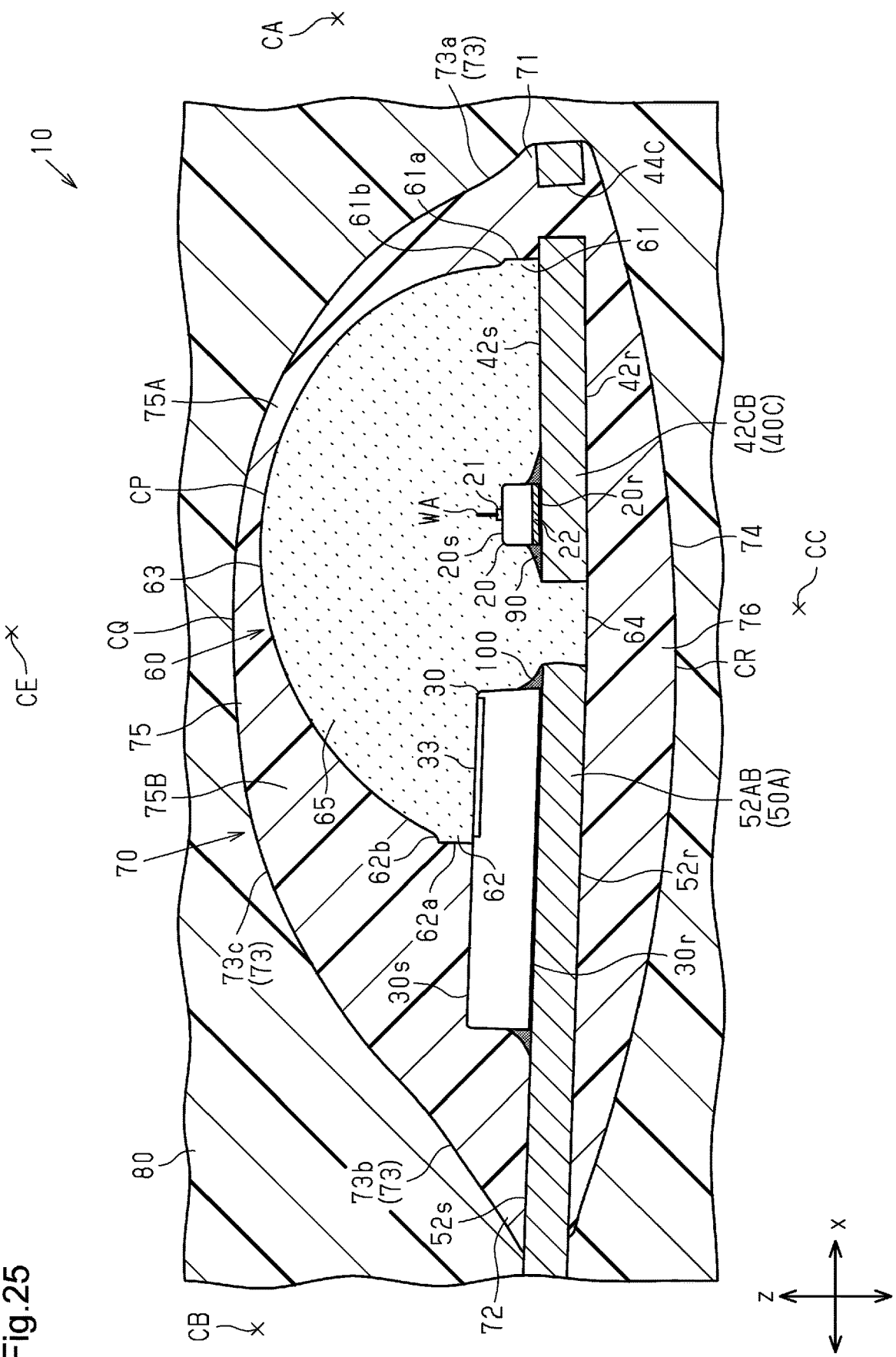
FIG. 25 is a cross-sectional view showing the cross-sectional structure of a part of an insulation module of a modification.

In the first to sixth embodiments, the insulation module 10 may have a shorter distance between the light emitting element 20 and the light receiving element 30. In one example, as shown in FIG. 25, the die pad portion 42CB of the first lead frame 40C and the die pad portion 52AB of the second lead frame 50A are extended toward each other in the x-direction, as in the fourth embodiment. The light emitting element 20 is bonded with the conductive bonding material 90 to one of the two end portions in the x-direction of the die pad portion 42CB that is closer to the die pad portion 52AB. The light receiving element 30 is bonded with the conductive bonding material 100 to one of the two end portions in the x-direction of the die pad portion 52AB that is closer to the die pad portion 42CB. As such, the illustrated example has a shorter distance between the light emitting element 20 and the light receiving element 30 in the x-direction than the first embodiment. In the example shown in FIG. 25, the inorganic particles 65 may be omitted from the transparent plastic 60. Also, the reflection member 70 may include inorganic particles 77.

This configuration shortens the distance in the x-direction between the light emitting element 20 and the light receiving element 30. In other words, the distance of the optical path of the light emitting from the light emitting element 20 and entering the light receiving element 30 is shortened. This increases the amount of light received by the light receiving element 30.

Figure 26:
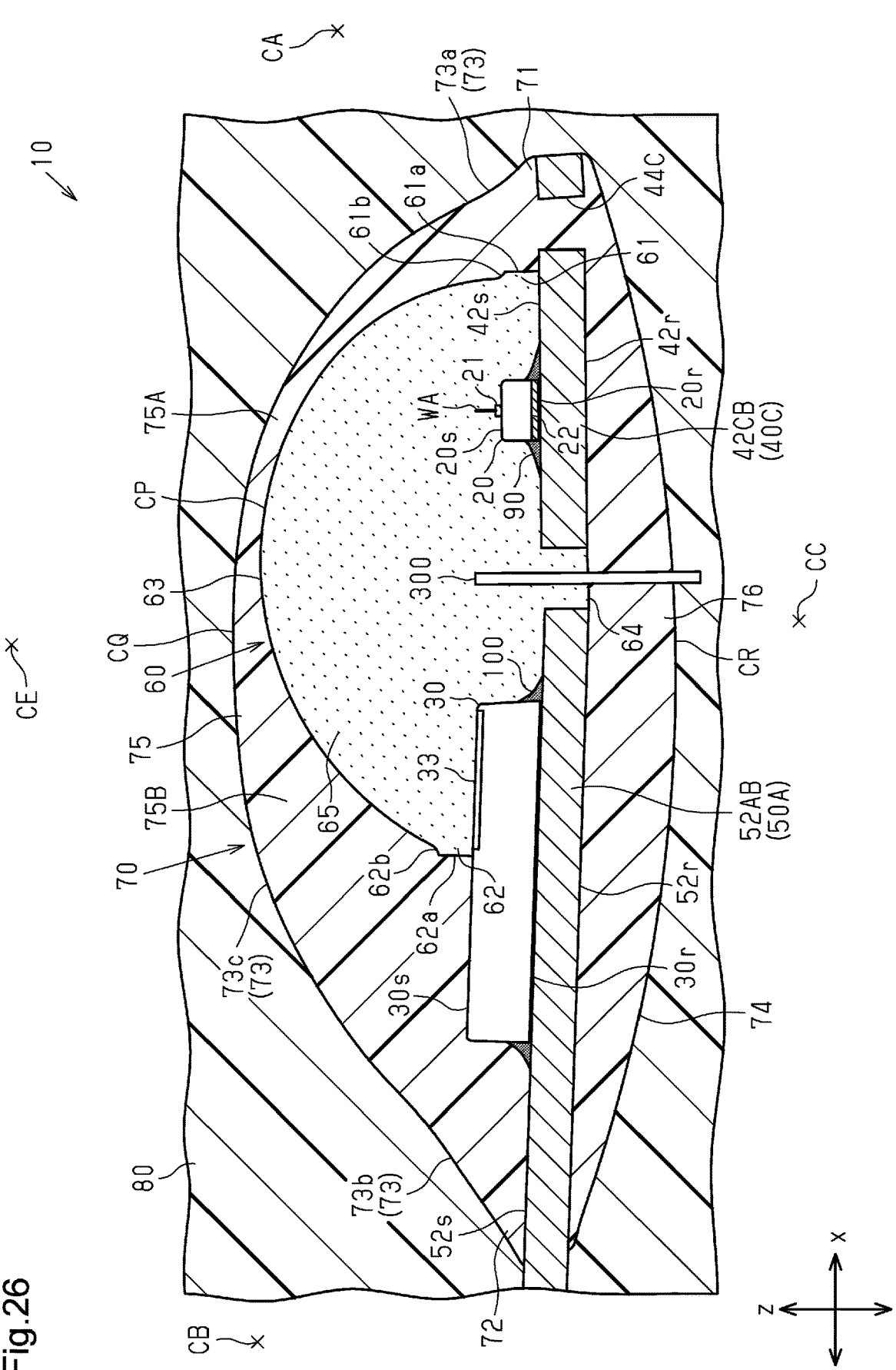
FIG. 26 is a cross-sectional view showing the cross-sectional structure of a part of an insulation module of a modification.

In the modification of FIG. 25, as shown in FIG. 26, a plate-shaped member 300 having both light-transmitting property and insulating property may be provided between the die pad portions 42CB and 52AB in the x-direction. The plate-shaped member 300 extends in the z-direction and has a thickness in the x-direction, which is the direction in which the die pad portions 42CB and 52AB are arranged. In the illustrated example, the plate-shaped member 300 extends to a position higher than the pad surfaces 42s and 52s of the die pad portions 42CB and 52AB. The plate-shaped member 300 is arranged so that its upper end surface is at the same position in the z-direction as the light receiving surface 33 of the light receiving element 30. Preferably, the plate-shaped member 300 does not extend to a position higher than the light receiving surface 33 of the light receiving element 30. In the illustrated example, the plate-shaped member 300 extends through the lower section 76 of the reflection member 70 in the z-direction. The length of the section of the plate-shaped member 300 below the lower end surface 64 of the transparent plastic 60 in the z-direction is longer than the length of the section above the lower end surface 64 of the transparent plastic 60 in the z-direction.

This configuration has a longer creepage distance between the die pad portions 42CB and 52AB in the x-direction. This improves the insulation between the die pad portions 42CB and 52AB.

In the first to sixth embodiments, the die pad portion 42CB of the first lead frame 40C may be arranged so as to have a thickness direction in the z-direction. That is, the die pad portion 42CB may be arranged to extend in a direction perpendicular to the z-direction. The die pad portions 142AB and 142DB of the seventh embodiment and the die pad portion 242AB of the eighth embodiment may be modified in the same manner.

In the first to sixth embodiments, the die pad portion 52AB of the second lead frame 50A may be arranged so as to have a thickness direction in the z-direction. That is, the die pad portion 52AB may be arranged to extend in a direction perpendicular to the z-direction. The die pad portions 152AB of the seventh embodiment and the die pad portion 252AB of the eighth embodiment may be modified in the same manner.

In the first to sixth embodiments, one of the edges in the x-direction of the die pad portion 42CB of the first lead frame 40C that is closer to the die pad portion 52AB of the second lead frame 50A may include a projection similar to the projection 58A of the die pad portion 52AB.

In the first to sixth embodiments, the projection 58A may be omitted from the die pad portion 52AB of the second lead frame 50A.

Figure 27:
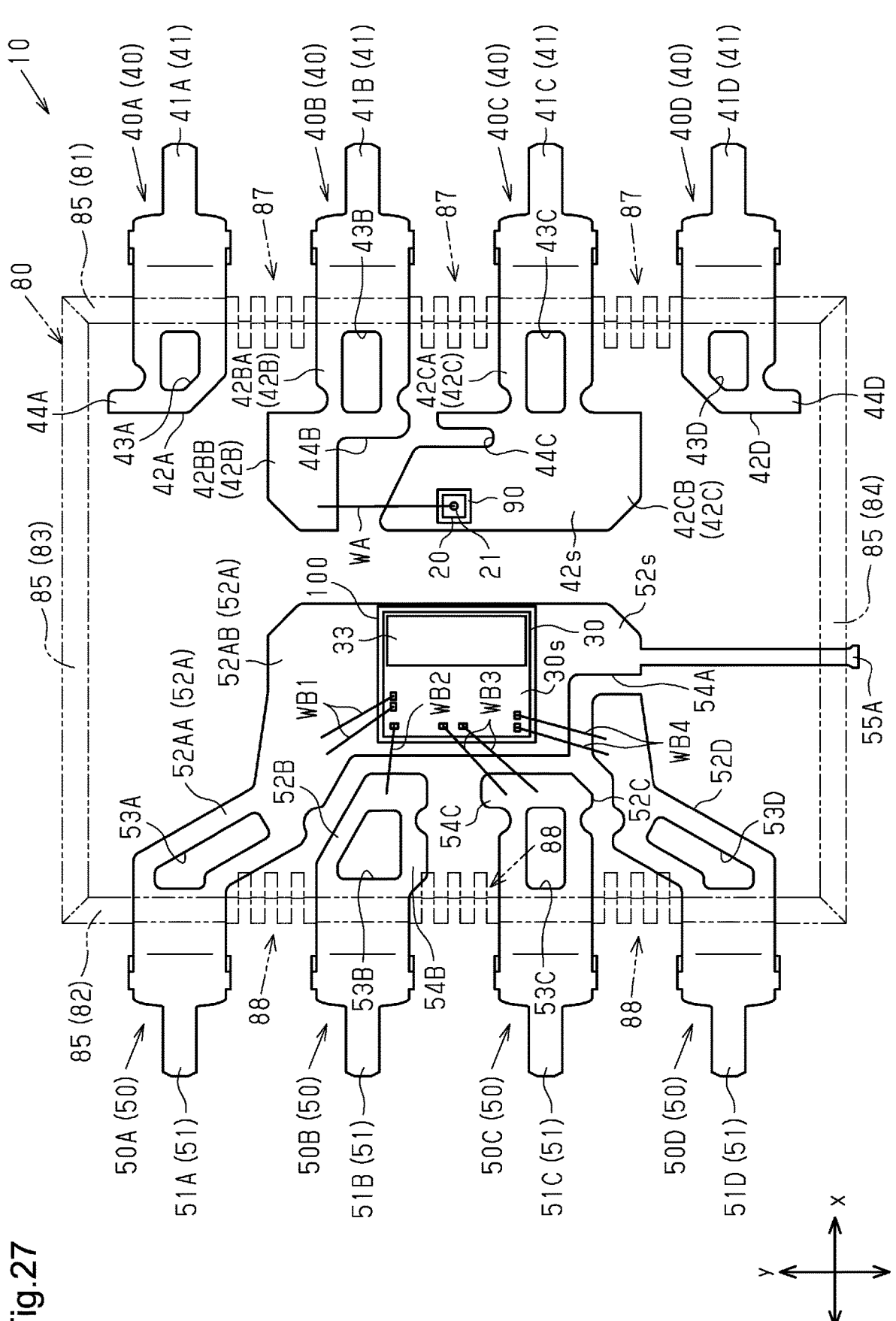
FIG. 27 is a plan view schematically showing the internal structure of an insulation module of a modification.

In the first to sixth embodiments, the arrangement positions of the suspension lead 55A of the die pad portion 52AB of the second lead frame 50A may be freely modified. In one example, as shown in FIG. 27, the suspension lead 55A may extend in the y-direction toward the fourth plastic side surface 84 from one of the end portions in the y-direction the die pad portion 52AB that is closer to the fourth plastic side surface 84. In this case, the suspension lead 55A is exposed from the fourth plastic side surface 84. The fourth plastic side surface 84 serving as the plastic side surface from which the suspension lead 55A extends out from the die pad portion 52AB corresponds to a suspension lead surface, and the first plastic side surface 81 and the second plastic side surface 82 correspond to terminal surfaces.

According to this configuration, the suspension lead 55A is not exposed from between the terminals 51B and 51C in the y-direction on the second plastic side surface 82, so that the number of depressions and projections in the uneven portion 88 between the terminals 51B and 51C can be increased. This allows the insulation between the terminals 51B and 51C to be improved.

In the first to sixth embodiments, the die pad portion 42CB of the first lead frame 40C may be longer than the die pad portion 52AB of the second lead frame 50A in the x-direction. That is, the die pad portion on which the light emitting element is mounted may be longer in the x-direction than the die pad portion on which the light receiving element is mounted. In this case, the distance between the die pad portions 42CB and 52AB in the x-direction may be shorter than the length of the die pad portion 52AB in the x-direction. The distance between the die pad portions 42CB and 52AB in the x-direction can be freely modified, and may be greater than or equal to the length of the die pad portion 52AB in the x-direction.

In the first to sixth embodiments, at least one of the uneven portion 87 in the section between the terminals 41A and 41B, the uneven portion 87 in the section between the terminals 41B and 41C, and the uneven portion 87 in the section between the terminal 41C and terminal 41D of the first plastic side surface 81 may be omitted.

In the first to sixth embodiments, at least one of the uneven portion 88 in the section between the terminal 51A and the terminal 51B, the uneven portion 88 in the section between the terminal 51B and the suspension lead 55A, the uneven portion 88 in the section between the suspension lead 55A and the terminal 51C, and the uneven portion 88 in the section between the terminal 51C and the terminal 51D of the second plastic side surface 82 may be omitted.

In the seventh and eighth embodiments, at least one of the section between the terminal 141A (241A) and the terminal 141B (241B), the section between the terminal 141B (241B) and the terminal 141C (241C), and the section between terminal 141C (241C) and the terminal 141D (241D) of the first plastic side surface 81 may include an uneven portion 87.

In the seventh and eighth embodiments, at least one of the section between the terminal 151A (251A) and the terminal 151B (251B), the section between the terminal 151B (251B) and the terminal 151C (251C), and the section between the terminal 151C (251C) and the terminal 151D (251D) of the second plastic side surface 82 may include an uneven portion 88.

The first to sixth embodiments may include a driver and a current source as in the eighth embodiment. The current source may be provided between the terminal 41C and the light emitting diode 20A. The driver may connect the terminal 41D to the current source, for example. In this case, the current supplied to the light emitting diode 20A is controlled according to the signal input to the terminal 41D.

In the same manner as the eighth embodiment, the seventh embodiment may include a second driver 234B and a second current source 233B, which drive the first light emitting diode 20AP, and a first driver 234A and a first current source 233A, which drive the second light emitting diode 20AQ.

Configuration of Light Receiving Element

Figure 28:
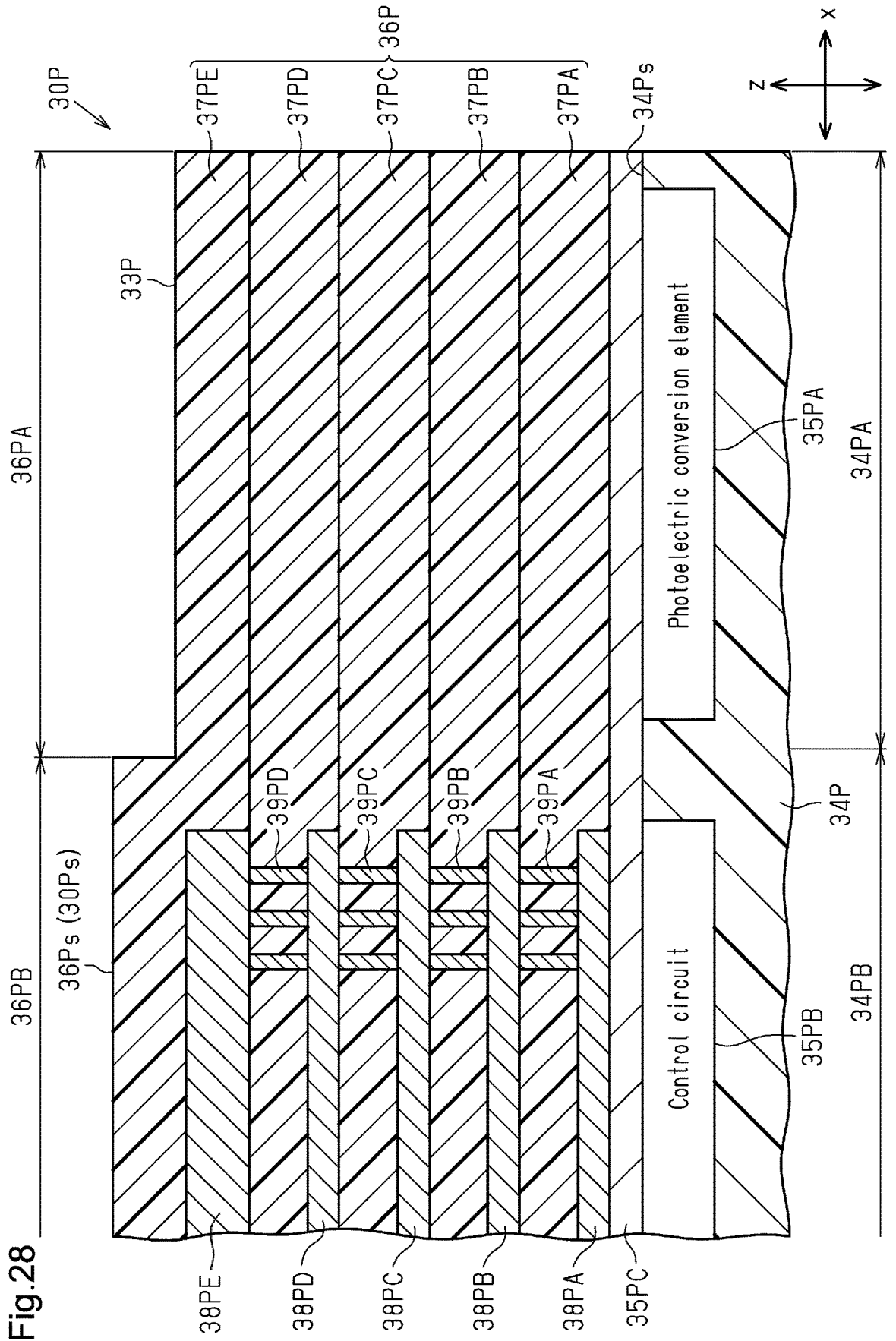
FIG. 28 is a cross-sectional view of a part of a light receiving element of an insulation module of a modification.
Figure 29:
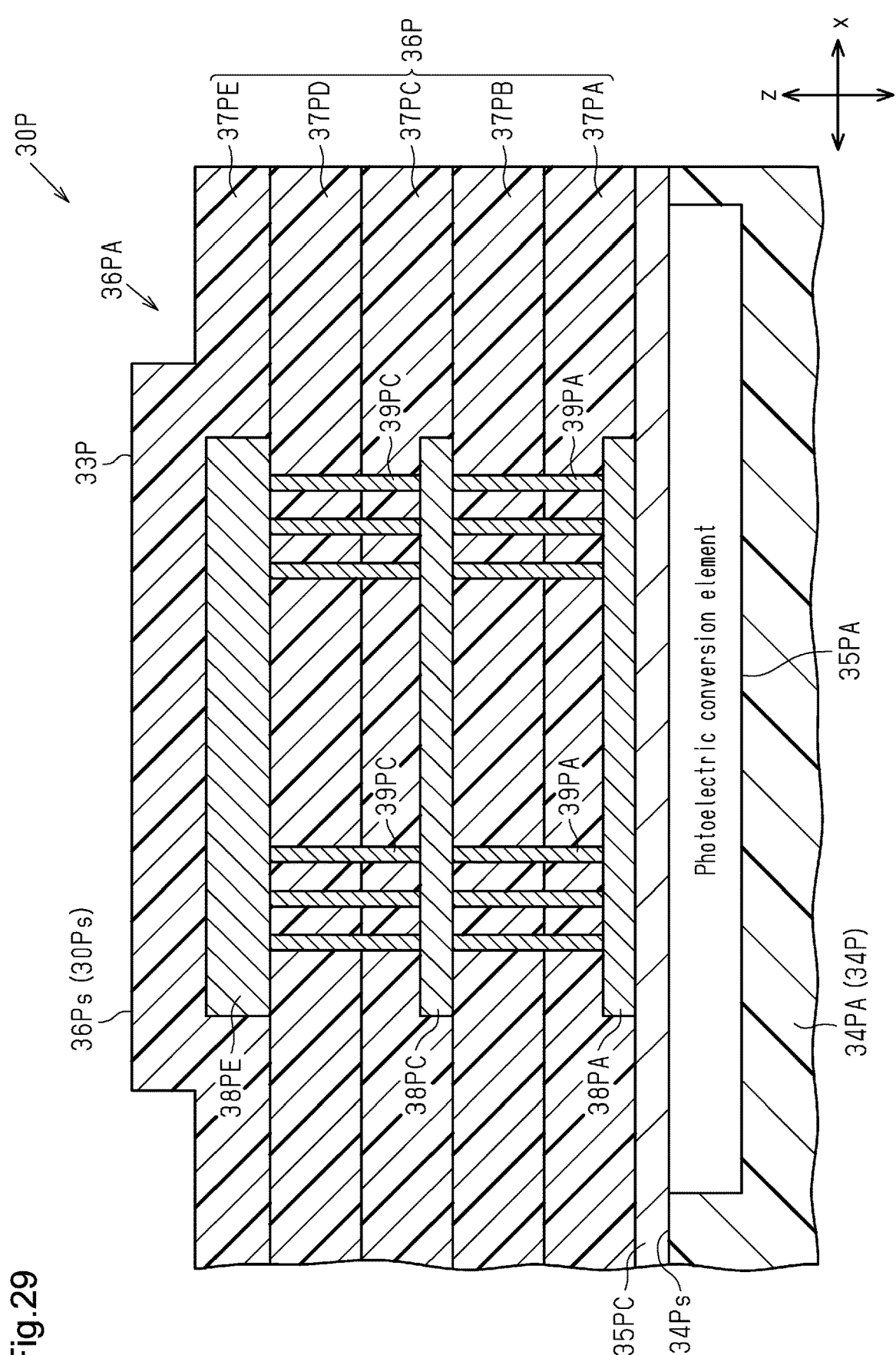
FIG. 29 is a cross-sectional view of a part of a light receiving element of an insulation module of a modification.
Figure 30:
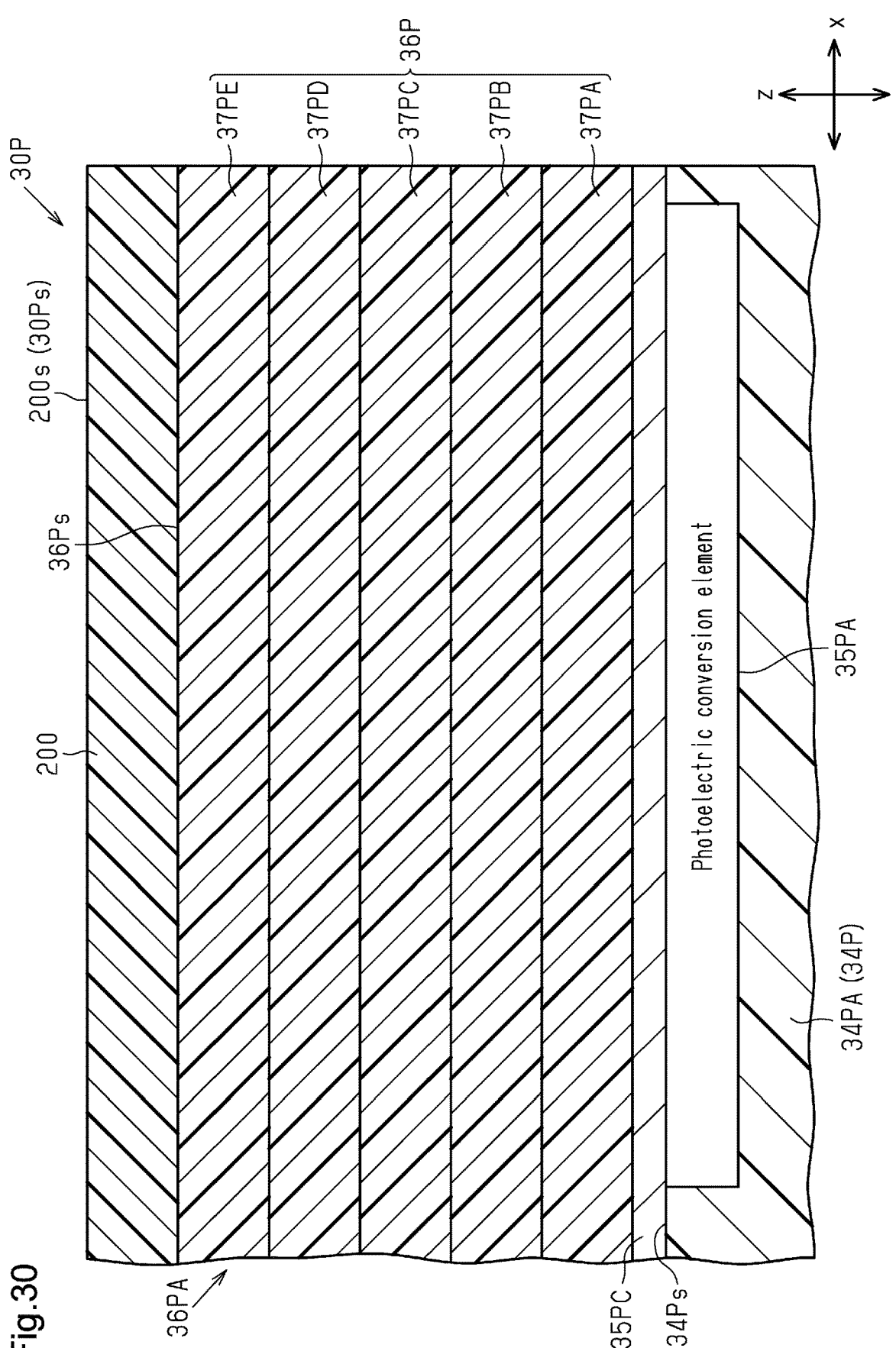
FIG. 30 is a cross-sectional view of a part of a light receiving element of an insulation module of a modification.
Figure 31:
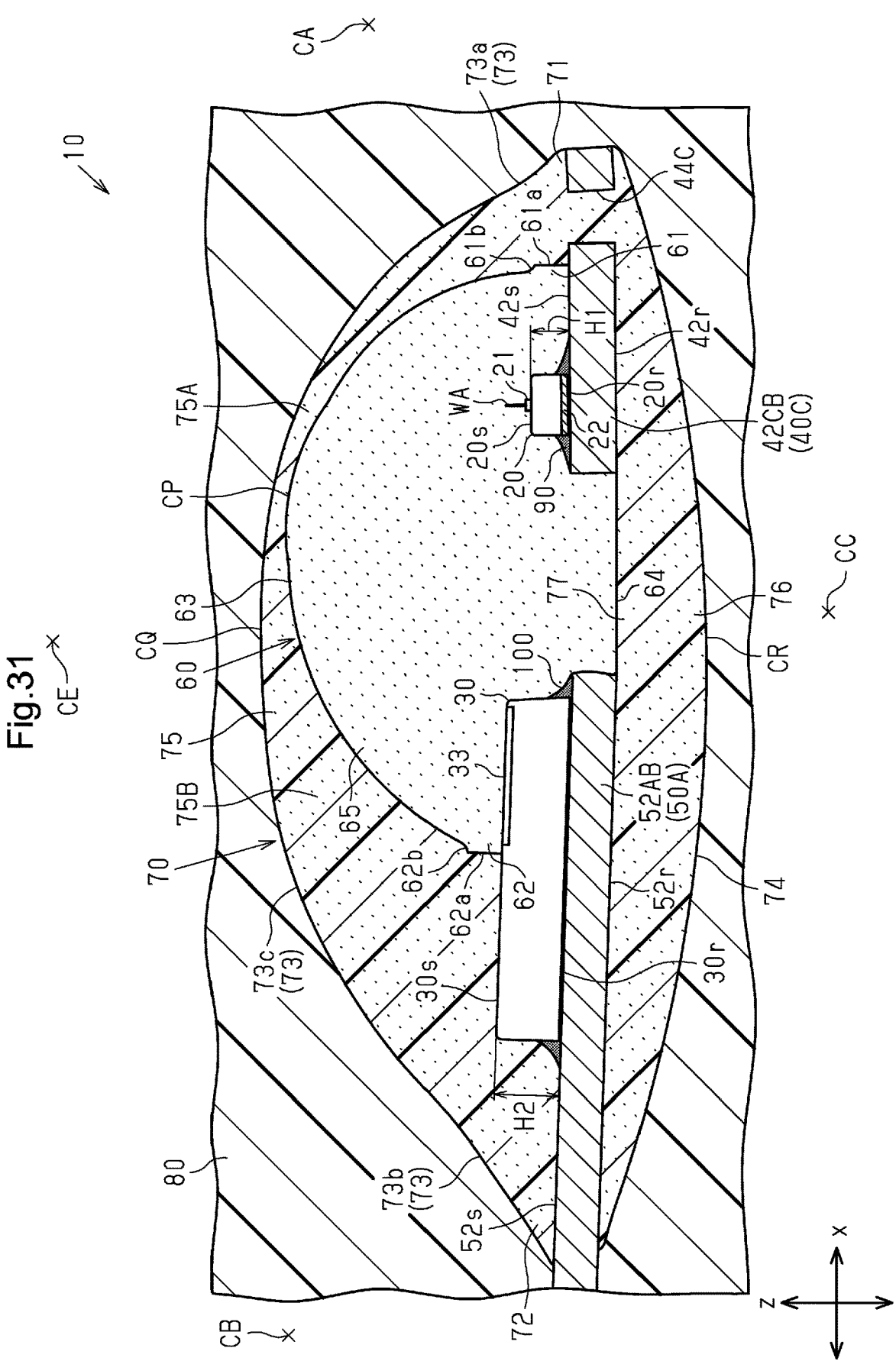

In the above embodiments, the configurations of the light receiving element 30, the first light receiving element 30P, and the second light receiving element 30Q may be freely modified. For example, FIG. 28 shows the configuration of a first modification of the first light receiving element 30P, FIG. 29 shows the configuration of a second modification of the first light receiving element 30P, and FIG. 30 shows a third modification of the first light receiving element 30P. FIGS. 28 to 30 show the cross-sectional structure of the first light receiving element 30P near the element main surface 30Ps. FIGS. 28 to 30 show enlarged views of the cross-sectional structures of the photoelectric conversion element 35PA and its surrounding area of the element main surface 30Ps of the first light receiving element 30P. The cross-sectional structure of the control circuit 35PB and its surrounding area of the element main surface 30Ps of the first light receiving element 30P are the same in the first to third modifications. Thus, same numerals are given to those configurations in the second and third modifications that are common to those of the first modification. Such configurations will not be described in detail.

As shown in FIG. 28, the first light receiving element 30P of the first modification includes a semiconductor substrate 34P, an insulating wiring layer 35PC formed on a surface 34Ps of the semiconductor substrate 34P, and an insulating layer 36P placed on the insulating wiring layer 35PC.

The semiconductor substrate 34P forms the element rear surface 30Pr (see FIG. 22) of the first light receiving element 30P. That is, the rear surface (not shown) of the semiconductor substrate 34P facing away from the surface 34Ps forms the element rear surface 30Pr. The semiconductor substrate 34P is made of a material containing silicon (Si), for example. The first semiconductor region 34PA of the semiconductor substrate 34P includes a photoelectric conversion element 35PA. The second semiconductor region 34PB of the semiconductor substrate 34P includes a control circuit 35PB. The control circuit 35PB receives a signal from the photoelectric conversion element 35PA, for example.

The insulating wiring layer 35PC includes wiring that electrically connects the photoelectric conversion element 35PA to the control circuit 35PB. As viewed in the z-direction, the insulating wiring layer 35PC is formed to overlap with both the photoelectric conversion element 35PA and the control circuit 35PB.

The insulating layer 36P is placed over the photoelectric conversion element 35PA and the control circuit 35PB. That is, the insulating layer 36P is located over both the first semiconductor region 34PA and the second semiconductor region 34PB of the semiconductor substrate 34P. In the first modification, the insulating layer 36P is formed over the entire insulating wiring layer 35PC.

The insulating layer 36P includes a first insulating portion 36PA formed over the photoelectric conversion element 35PA and a second insulating portion 36PB formed over the control circuit 35PB. It may be considered that the first insulating portion 36PA corresponds to the first semiconductor region 34PA, and the second insulating portion 36PB corresponds to the second semiconductor region 34PB. The surface 36Ps of the insulating layer 36P forms the element main surface 30Ps. The section of the surface 36Ps of the insulating layer 36P that corresponds to the first insulating portion 36PA forms the light receiving surface 33P.

The insulating layer 36P includes multiple insulating films 37PA to 37PE, which are stacked on one another in the z-direction, multiple wiring layers 38PA to 38PE, which are provided in the insulating films 37PA to 37PE, and vias 39PA to 39PD, which connect these wiring layers 38PA to 38PE. In the first modification, the wiring layers 38PA to 38PE and the vias 39PA to 39PD are located in the second insulating portion 36PB. In other words, in the first modification, the wiring layers 38PA to 38PE and vias 39PA to 39PD are not provided in the first insulating portion 36PA. In the first modification, the wiring layers 38PA to 38PE provided in the second insulating portion 36PB correspond to a first wiring layer.

As shown in FIG. 28, the insulating films 37PA to 37PE are stacked in that order over the insulating wiring layer 35PC. Each of the insulating films 37PA to 37PE is an interlayer insulating film and made of silicon oxide ($SiO_2$), for example.

In the first modification, each of the wiring layers 38PA to 38PE mainly includes wiring connected to the control circuit 35PB and is located in the second insulating portion 36PB of the insulating layer 36P. In other words, the wiring layers 38PA to 38PE are not provided in the first insulating portion 36PA of the insulating layer 36P. In the illustrated example, the wiring layers 38PA to 38PE are arranged so as to be aligned with one another as viewed in the z-direction. The wiring layers 38PA to 38PE are made of a metal material such as Al or titanium (Ti).

The wiring layer 38PA is embedded in the insulating film 37PA. The wiring layer 38PA may be electrically connected to the semiconductor substrate 34P, for example.

The wiring layer 38PB is embedded in the insulating film 37PB. The vias 39PA connect the wiring layer 38PA to the wiring layer 38PB. The vias 39PA are embedded in the insulating film 37PA and extend in the z-direction.

The wiring layer 38PC is embedded in the insulating film 37PC. The vias 39PB connect the wiring layer 38PB to the wiring layer 38PC. The vias 39PB are embedded in the insulating film 37PB and extend in the z-direction.

The wiring layer 38PD is embedded in the insulating film 37PD. The vias 39PC connect the wiring layer 38PC to the wiring layer 38PD. The vias 39PC are embedded in the insulating film 37PC and extend in the z-direction.

The wiring layer 38PE is embedded in the insulating film 37PE. The vias 39PD connect the wiring layer 38PD to the wiring layer 38PE. The vias 39PD are embedded in the insulating film 37PD and extend in the z-direction.

In the first modification, the wiring layers 38PA to 38PE are arranged to correspond to the insulating films 37PA to 37PE, but the present disclosure is not limited to this. The second insulating portion 36PB may include insulating films that are free of wiring layers. Also, the configuration of the second insulating portion 36PB may be similarly modified in the second and third modifications.

In the first modification, the first insulating portion 36PA may include wiring layers 38PA to 38PE. In this case, the photoelectric conversion element 35PA includes a region protruding from the wiring layers 38PA to 38PE as viewed in the z-direction.

By adjusting the areas of the wiring layers 38PA to 38PE arranged over the photoelectric conversion element 35PA (hereinafter simply referred to as the areas of the wiring layers 38PA to 38PE) as viewed in the z-direction, the amount of light received by the photoelectric conversion element 35PA may be adjusted. That is, when designing the insulation module 10, the areas of the wiring layers 38PA to 38PE may be set such that the amount of light received by the photoelectric conversion element 35PA is within a preset range. In one example, the areas of the wiring layers 38PA to 38PE as viewed in the z-direction are set such that the proportion of the light that enters the photoelectric conversion element 35PA without reflecting off the wiring layers 38PA to 38PE after reflecting off the reflection member 70 and entering the insulating layer 36 is in a range of 60% to 70%. The proportion of the light entering the photoelectric conversion element 35PA without reflecting off the wiring layers 38PA to 38PE is not limited to be in a range of 60% to 70%, and may be in a range of 30% to 40%, in a range of 40% to 50%, in a range of 50% to 60%, in a range of 70% to 80%, or in a range of 80% to 90%, for example. In this manner, the proportion of the light that enters the photoelectric conversion element 35PA without reflecting off the wiring layers 38PA to 38PE may be adjusted by adjusting the wiring pattern of the wiring layers 38PA to 38PE according to the characteristics and the like of the photoelectric conversion element 35PA.

As shown in FIG. 29, in the first light receiving element 30P of the second modification, the first insulating portion 36PA, which corresponds to the first semiconductor region 34PA, of the insulating layer 36P also includes wiring layers.

However, the number of the wiring layers provided in the first insulating portion 36PA differs from the number of the wiring layers 38PA to 38PE of the second insulating portion 36PB. Specifically, the first and second insulating portions 36PA and 36PB include the same number of insulating films (insulating films 37PA to 37PE). However, the number of wiring layers of the first insulating portion 36PA is less than the number of layers (wiring layers 38PA to 38PE) of the second insulating portion 36PB (see FIG. 28). That is, the first insulating portion 36PA has at least one insulating film that does not include a wiring layer. In the second modification, the first insulating portion 36PA does not include the wiring layer 38PB or 38PD. As such, in the first insulating portion 36PA, the insulating films 37PB and 37PD are insulating films in which no wiring layer is formed. In the second modification, the vias 39PA connect the wiring layer 38PA to the wiring layer 38PC, and the vias 39PC connect the wiring layer 38PC to the wiring layer 38PE. In the second modification, the wiring layers 38PA, 38PC, and 38PE of the first insulating portion 36PA correspond to a second wiring layer, and the wiring layers 38PA to 38PE of the second insulating portion 36PB correspond to a first wiring layer.

In this manner, it may be considered that, in the first light receiving element 30P of the second modification, the second insulating portion 36PB includes at least one first wiring layer and the first insulating portion 36PA includes at least one layer that is free of a wiring layer. It may also be considered that, in the first light receiving element 30P of the second modification, the second insulating portion 36PB includes multiple first wiring layers and the first insulating portion 36PA includes second wiring layers that are smaller in number than the second insulating portion 36PB.

As viewed in the Z-direction, the wiring layers 38PA, 38PC, and 38PE in the first insulating portion 36PA are provided at positions aligned with the photoelectric conversion elements 35PA. In the second modification, the photoelectric conversion element 35PA has a region protruding from the wiring layers 38PA, 38PC, and 38PE as viewed in the z-direction. The insulating films 37PA to 37PE are provided over the region of the photoelectric conversion element 35PA protruding from the wiring layers 38PA, 38PC, and 38PE.

By adjusting the areas of the wiring layers 38PA, 38PC, and 38PE arranged over the photoelectric conversion element 35PA (hereinafter simply referred to as the areas of the wiring layers 38PA, 38PC, and 38PE) as viewed in the z-direction, the amount of light received by the photoelectric conversion element 35PA may be adjusted. That is, when designing the insulation module 10, the areas of the wiring layers 38PA, 38PC, and 38PE may be set such that the amount of light received by the photoelectric conversion element 35PA is within a preset range. In one example, the areas of the wiring layers 38PA, 38PC, and 38PE in the z-direction are set such that the proportion of the light that enters the photoelectric conversion element 35PA without reflecting off the wiring layers 38PA, 38PC, and 38PE after reflecting off the reflection member 70 and entering the insulating layer 36 is in a range of 60% to 70%. The proportion of the light entering the photoelectric conversion element 35PA without reflecting off the wiring layers 38PA, 38PC, and 38PE is not limited to in a range of 60% to 70%, and may be in a range of 30% to 40%, in a range of 40% to 50%, in a range of 50% to 60%, in a range of 70% to 80%, or in a range of 80% to 90%, for example. In this manner, the proportion of the light that enters the photoelectric conversion element 35PA without reflecting off the wiring layers 38PA, 38PC, and 38PE may be adjusted by adjusting the wiring pattern of the wiring layers 38PA, 38PC, and 38PE according to the characteristics and the like of the photoelectric conversion element 35PA.

According to this configuration, the first insulating portion 36PA, into which the light from the first light emitting element 20P enters, includes a fewer number of wiring layers that are electrically connected to the control circuit 35PB than the second insulating portion 36PB. This prevents malfunction of the control circuit 35PB, which would otherwise be caused by incident light when the amount of light from the first light emitting element 20P is large, for example. Also, the proportion of the light entering the photoelectric conversion element 35PA without reflecting off the wiring layers 38PA, 38PC, and 38PE can be adjusted according to the characteristics of photoelectric conversion element 35PA by adjusting the areas of the wiring layers 38PA, 38PC, and 38PE.

As shown in FIG. 30, in the first light receiving element 30P of the third modification, the plastic layer 200 is provided on the insulating layer 36P. That is, the plastic layer 200 is formed on the surface 36Ps of the insulating layer 36P. In the third modification, the plastic layer 200 is formed over the entire surface 36Ps of the insulating layer 36P. In other words, the surface 200s of the plastic layer 200 forms the element main surface 30Ps of the first light receiving element 30P.

The plastic layer 200 has insulating properties and is made of a resin material that selectively absorbs or blocks infrared rays. In the third modification, the plastic layer 200 corresponds to an infrared cut layer. The plastic layer 200 may be formed by being applied onto the surface 36Ps of the insulating layer 36P. The plastic layer 200 may be made of a resin material having a lower light transmittance than the first transparent plastic 60P, for example. The plastic layer 200 is made of a material having a lower light transmittance than the first reflection member 70P, for example. Additionally, the insulating layer 36P is made of a material that transmits infrared rays. The material of the insulating layer 36P is not limited to this and may be any material.

The formation range of the plastic layer 200 on the surface 36Ps of the insulating layer 36P may be freely modified. In one example, the plastic layer 200 may be formed only in a region of the surface 36Ps of the insulating layer 36P that corresponds to the first insulating portion 36PA.

The thickness of the plastic layer 200 may be freely modified. In one example, the thickness of the plastic layer 200 may be thicker than the thickness of the insulating layer 36P. In another example, the thickness of the plastic layer 200 may be thinner than the thickness of the insulating layer 36P.

According to this configuration, the plastic layer 200 absorbs or blocks infrared rays, so that the light that is emitted from the first light emitting element 20P and weakened by the plastic layer 200 is supplied to the first light receiving element 30P. Thus, the amount of light received by the first light receiving element 30P from the first light emitting element 20P can be reduced. The second light receiving element 30Q has the same configuration as the first light receiving element 30P and thus has the same advantageous effects.

In each of the above embodiments, the signal processing method of the light receiving element 30 (30P, 30Q) may be freely modified. An example of modification is described using the circuit configuration of the insulation module 10 of FIG. 19. As shown in FIG. 19, a signal including multiple pulses is input from the first light receiving element 30P to the first control circuit 130A. The first control circuit 130A outputs a driving voltage signal as an output signal to the gate of the first switching element 511 based on a portion of the pulses excluding the first pulse. A signal including multiple pulses is pulses of a predetermined pulse period. For example, the interval between a first signal including multiple pulses and a second signal including multiple pulses transmitted after the first signal is longer than the pulse period.

The term "over" as used in this disclosure encompasses the meanings of "on" and "above" unless the context clearly indicates otherwise. Accordingly, the expression "A is formed over B" in each embodiment refers to that A is disposed directly on B in contact with B, but also refers to that A is disposed over B without being in contact with B in a modification. That is, the term "over" does not exclude structures in which any other member is formed between A and B.

As used herein, the phrase "at least one of A and B" should be understood to refer to "only A," "only B," or "both A and B."

CLAUSES

The technical concepts described below may be recognized from the present disclosure. For aid in understanding and not for limitation, the reference numerals of corresponding components in the embodiment are given to components described in the clauses. The reference numerals are given as examples to aid understanding, and the components described in each clause should not be limited to the components indicated by the reference numerals.

Clause A1

An insulating module (10), including:

a light emitting element (20);

a light receiving element (30) configured to receive light from the light emitting element (20);

a first die pad (42CB) on which the light emitting element (20) is mounted;

a second die pad (52AB) that is arranged side by side with the first die pad (42CB) and on which the light receiving element (30) is mounted;

a transparent plastic (60) that covers at least both the light emitting element (20) and the light receiving element (30);

a reflection member (70) that covers at least the transparent plastic (60) and is made of a material that reflects light from the light emitting element (20); and a sealing plastic (80) that seals the reflection member (70) together with the transparent plastic (60) and is made of a material having a light blocking property, wherein at least one of the reflection member (70) and the transparent plastic (60) includes inorganic particles (65) that are configured to absorb or reflect light from the light emitting element (20).

Clause A2

The insulation module according to clause A1, wherein a refractive index of the reflection member (70) differs from a refractive index of the transparent plastic (60).

Clause A3

The insulation module according to clause A2, wherein the refractive index of the reflection member (70) is greater than the refractive index of the transparent plastic (60).

Clause A4

The insulation module according to clause A2, wherein the light emitting element (20) includes a light emitting surface (20s), the reflection member (70) includes a light emitting-side opposed portion (75A) that is opposed to the light emitting surface (20s) and is spaced apart from the light emitting surface (20s) in a direction perpendicular to the light emitting surface (20s), and an angle of an interface between the light emitting-side opposed portion (75A) of the reflection member (70) and the transparent plastic (60) is less than a critical angle.

Clause A5

The insulation module according to clause A2, wherein the refractive index of the reflection member (70) is less than the refractive index of the transparent plastic (60).

Clause A6

The insulation module according to clause A5, wherein the light emitting element (20) includes a light emitting surface (20s), the reflection member (70) includes a light emitting-side opposed portion (75A) that is opposed to the light emitting surface (20s) and is spaced apart from the light emitting surface (20s) in a direction perpendicular to the light emitting surface (20s), and an angle of an interface between the light emitting-side opposed portion (75A) of the reflection member (70) and the transparent plastic (60) is greater than or equal to a critical angle.

Clause A7

The insulation module according to clause A1, wherein the light receiving element (30) includes a light receiving surface (33), the reflection member (70) has a light emitting-side opposed portion (75A) that is opposed to the light emitting surface (33) and is spaced apart from the light emitting surface (33) in a direction perpendicular to the light emitting surface (20s) and a light receiving-side opposed portion (75B) that is opposed to the light receiving surface (33) and is spaced apart from the light receiving surface (33) in a direction perpendicular to the light receiving surface (33), and the light emitting-side opposed portion (75A) has a smaller thickness than the light receiving-side opposed portion (75B).

Clause A8

The insulation module according to any one of clauses A1 to A7, wherein the light emitting element (20) is bonded to a mount surface (42S) of the first die pad (42CB) with a first bonding material (90), the light receiving element (30) is bonded to a mount surface (52S) of the second die pad (52AB) with a second bonding material (100), the first bonding material (90) protrudes from the light emitting element (20) as viewed in a direction perpendicular to the mount surface (42s) of the first die pad (42CB), the second bonding material (100) protrudes from the light receiving element (30) as viewed in a direction perpendicular to the mount surface (52s) of the second die pad (52AB), and at least one of the first bonding material (90) and the second bonding material (100) is made of a material that reflects light from the light emitting element (20).

Clause A9

The insulation module according to any one of clauses A1 to A8, wherein the light emitting element (20) is bonded to a mount surface (42S) of the first die pad (42CB) with a first bonding material (90), the light receiving element (30) is bonded to a mount surface (52S) of the second die pad (52AB) with a second bonding material (100), the first bonding material (90) protrudes from the light emitting element (20) as viewed in a direction perpendicular to the mount surface (42s) of the first die pad (42CB), the second bonding material (100) protrudes from the light receiving element (30) as viewed in a direction perpendicular to the mount surface (52s) of the second die pad (52AB), the first die pad (42CB) includes a first protruding portion (47) that extends toward the second die pad (52AB) beyond the first bonding material (90), and the second die pad (52AB) includes a second protruding portion (59) that extends toward the first die pad (42CB) beyond the second bonding material (100).

Clause A10

The insulation module according to any one of clauses A1 to A9, wherein the reflection member (70) includes a pad cover portion (76) that covers surfaces of the first die pad (42CB) and the second die pad (52AB), the surfaces being opposite to surfaces on which the light emitting element (20) and the light receiving element (30) are mounted, and at least a part of an interface (64) between the pad cover portion (76) and the transparent plastic (60) includes an uneven portion (120).

Clause A11

The insulation module according to any one of clauses A1 to A10, wherein the reflection member (70) includes a first end curved surface (73a) located at one of two end portions in an arrangement direction (x-direction) of the first die pad (42CB) and the second die pad (52AB), the end portion being closer to the first die pad (42CB), a second end curved surface (73b) located at the other end portion that is closer to the second die pad (52AB), and an intermediate curved surface (73c) connecting the first end curved surface (73a) to the second end curved surface (73b), the first end curved surface (73a) has a curved shape having its center of curvature located at an opposite side of the first end curved surface (73a) from the first die pad (42CB), the second end curved surface (73b) has a curved shape having its center of curvature located at an opposite side of the second end curved surface (73b) from the second die pad (52AB), and the intermediate curved surface (73c) has a curved shape having its center of curvature located at a side of the intermediate curved surface (73c) at which the first die pad (42CB) and the second die pad (52AB) are located.

Clause A12

The insulation module according to any one of clauses A1 to A11, wherein the sealing plastic (80) includes a plastic side surface (81/82) on which a plurality of terminals (41A to 41D/51A to 51D) are arranged, and the plastic side surface (81/82) has an uneven portion (87/88) in a section between a first terminal and a second terminal of the terminals (41A to 41D/51A to 51D).

Clause A13

The insulation module according to clause A12, wherein the second die pad (52AB) includes a suspension lead (55A), the suspension lead (55A) is exposed from the section of the plastic side surface (82) between the first terminal and the second terminal, and the uneven portion (88) is disposed in at least one of a section of the plastic side surface (82) between the first terminal (51B) and the suspension lead (55A) as the second terminal, and a section of the plastic side surface (82) between the second terminal (51C) and the suspension lead (55A) as the first terminal.

Clause A14

The insulation module according to clause A12, wherein the second die pad (52AB) includes a suspension lead (55A), and the plastic side surface includes a terminal surface (81/82) on which the terminals (41A to 41D/51A to 51D) are disposed and a suspension lead surface (84) that differs from the terminal surface (81/82) and from which the suspension lead (55A) extends out.

Clause A15

The insulation module according to any one of clauses A1 to A14, wherein the second die pad (52AB) is longer than the first die pad (42CB) in an arrangement direction (x-direction) of the first die pad (42CB) and the second die pad (52AB), and a distance between the first die pad (42CB) and the second die pad (52AB) in the arrangement direction (x-direction) is longer than a length of the first die pad (42CB) in the arrangement direction (x-direction).

Clause A16

The insulation module according to any one of clauses A1 to A14, wherein the second die pad (52AB) is longer than the first die pad (42CB) in an arrangement direction (x-direction) of the first die pad (42CB) and the second die pad (52AB), and a distance between the first die pad (42CB) and the second die pad (52AB) in the arrangement direction (x-direction) is shorter than a length of the first die pad (42CB) in the arrangement direction (x-direction).

Clause A17

The insulation module according to any one of clauses A1 to A16, wherein the transparent plastic (60) covers the entire light emitting element (20) and a part of the light receiving element (30).

Clause A18

The insulation module according to clause A1, wherein the light receiving element (30) is bonded, through a bonding material (90), to a first end portion that is one of two end portions of the second die pad (52AB) in an arrangement direction (x-direction) of the first die pad (42CB) and the second die pad (52AB), the first end portion being closer to the first die pad (42CB), and an edge of the first end portion of the second die pad (52AB), the edge being closer to the first die pad (42CB), includes a projection (58A) extending in a direction perpendicular to a mount surface (52s) of the second die pad (52AB).

Clause A19

The insulation module according to any one of clauses A1 to A18, wherein the light receiving element includes a first light receiving element (30P) and a second light receiving element (30Q), the light emitting element includes a first light emitting element (20P) and a second light emitting element (20Q), the first light emitting element (20P) and the first light receiving element (30P) form a first photocoupler, the second light emitting element (20Q) and the second light receiving element (30Q) form a second photocoupler, the transparent plastic includes:

a first transparent plastic (60P) covering the first light emitting element (20P) and the first light receiving element (30P); and a second transparent plastic (60Q) covering the second light emitting element (20Q) and the second light receiving element (30Q), the reflection member includes:

a first reflection member (70P) covering the first transparent plastic (60P); and a second reflection member (70Q) covering the second transparent plastic (60Q), and the sealing plastic (80) seals both the first reflection member (70P) and the second reflection member (70Q) and includes a separation wall portion (89) separating the first reflection member (70P) from the second reflection member (70Q).

Clause A20

The insulation module according to any one of clauses A1 to A18, wherein the light receiving element includes a first light receiving element (30P) and a second light receiving element (30Q), the light emitting element includes a first light emitting element (20P) and a second light emitting element (20Q), the first light emitting element (20P) and the first light receiving element (30P) form a first photocoupler, the second light emitting element (20Q) and the second light receiving element (30Q) form a second photocoupler, the transparent plastic includes:

a first transparent plastic (60P) covering the first light emitting element (20P) and the first light receiving element (30P); and a second transparent plastic (60Q) covering the second light emitting element (20Q) and the second light receiving element (30Q), the first light emitting element (20P) is configured to emit light of a first wavelength, the second light emitting element (20Q) is configured to emit light of a second wavelength different from the first wavelength, the first transparent plastic (60P) is made of a resin material that transmits light of the first wavelength and does not transmit light of the second wavelength, and the second transparent plastic (60Q) is made of a resin material that transmits light of the second wavelength and does not transmit light of the first wavelength.

Clause A21

The insulation module according to clause A19, wherein the reflection member (70) covers both the first transparent plastic (60P) and the second transparent plastic (60Q).

Clause A22

The insulation module according to any one of clauses A18 to A20, wherein the first die pad includes a first light emitting die pad (142AB) and a second light emitting die pad (142DB) spaced apart from each other, the first light emitting element (20P) is mounted on the first light emitting die pad (142AB), the second light emitting element (20Q) is mounted on the second light emitting die pad (142DB), and both the first light receiving element (30P) and the second light receiving element (30Q) are mounted on the second die pad (152AB).

Clause A23

The insulation module according to clause A22, wherein the first light emitting die pad (142AB) and the second light emitting die pad (142DB) are arranged in a first direction (y-direction), in plan view, the first light emitting die pad (142AB) and the second light emitting die pad (142DB) are arranged side by side with the second die pad (152AB) in a second direction (x-direction) perpendicular to the first direction (y-direction), and the first light receiving element (30P) and the second light receiving element (30Q) are apart from each other in the first direction (y-direction).

Clause A24

An insulation module, including:

a first light emitting element (20P) and a second light emitting element (20Q);

a first light receiving element (30P) that is configured to receive light from the first light emitting element (20P), and a second light receiving element (30Q) that is configured to receive light from the second light emitting element (20Q);

a first light receiving and emitting die pad (242AB) on which both the first light emitting element (20P) and the second light receiving element (30Q) are mounted;

a second light receiving and emitting die pad (252AB) that is arranged side by side with the first light receiving and emitting die pad (242AB) and on which both the second light emitting element (20Q) and the first light receiving element (30P) are mounted;

a first transparent plastic (60P) covering at least both the first light emitting element (20P) and the first light receiving element (30P);

a second transparent plastic (60Q) covering at least both the second light emitting element (20Q) and the second light receiving element (30Q);

a first reflection member (70P) that covers at least the first transparent plastic (60P) and is made of a material that reflects light from the first light emitting element (20P);

a second reflection member (70Q) that covers at least the second transparent plastic (60Q) and is made of a material that reflects light from the second light emitting element (20Q); and a sealing plastic (80) that seals the first reflection member (70P) and the second reflection member (70Q) together with the first transparent plastic (60P) and the second transparent plastic (60Q) and is made of a material having a light blocking property, wherein at least one of the first reflection member (70P) and the first transparent plastic (60P) includes inorganic particles (65/77) that are configured to absorb or reflect light from the first light emitting element (20P).

Clause A25

The insulation module according to clause A24, wherein at least one of the second reflection member (70Q) and the second transparent plastic (60Q) includes inorganic particles (65/77) that are configured to absorb or reflect light from the second light emitting element (20Q).

Clause A26

The insulation module according to clause A24 or A25, wherein the sealing plastic (80) seals both the first reflection member (70P) and the second reflection member (70Q) and includes a separation wall portion (89) separating the first reflection member (70P) from the second reflection member (70Q).

Clause A27

An insulation module, including:

a first light emitting element (20P) and a second light emitting element (20Q);

a first light receiving element (30P) configured to receive light from the first light emitting element (20P), and a second light receiving element (30Q) configured to receive light from the second light emitting element (20Q);

a first light receiving and emitting die pad (242AB) on which both the first light emitting element (20P) and the second light receiving element (30Q) are mounted;

a second light receiving and emitting die pad (252AB) that is arranged side by side with the first light receiving and emitting die pad (242AB) and on which both the second light emitting element (20Q) and the first light receiving element (30P) are mounted;

a first transparent plastic (60P) covering at least both the first light emitting element (20P) and the first light receiving element (30P);

a second transparent plastic (60Q) covering at least both the second light emitting element (20Q) and the second light receiving element (30Q);

a reflection member (70) that covers at least both the first transparent plastic (60P) and the second transparent plastic (60Q) and is made of a material that reflects light from the first light emitting element (20P) and light from the second light emitting element (20Q); and a sealing plastic (80) that seals the reflection member (70) together with the first transparent plastic (60P) and the second transparent plastic (60Q) and is made of a material having a light blocking property, wherein at least one of the reflection member (70) and the first transparent plastic (60P) includes inorganic particles (65/77) that are configured to absorb or reflect light from the first light emitting element (20P).

Clause A28

The insulation module according to clause A27, wherein at least one of the reflection member (70) and the second transparent plastic (60Q) includes inorganic particles (65/77) that are configured to absorb or reflect light from the second light emitting element (20Q).

Clause A29

The insulation module according to any one of clauses A1 to A14, wherein the first die pad (42CB) is longer than the second die pad (52AB) in an arrangement direction of the first die pad (42CB) and the second die pad (52AB), and a distance between the first die pad (42CB) and the second die pad (52AB) in the arrangement direction (x-direction) is longer than a length of the second die pad (52AB) in the arrangement direction (x-direction).

Clause A30

The insulation module according to any one of clauses A1 to A18, wherein the sealing plastic (80) has a plastic main surface (80s) that is closer to the light emitting element (20P) than to the light receiving element (30P) in a thickness direction (z-direction) of the sealing plastic (80), and a plastic rear surface (80r) that is closer to the light receiving element (30P) than to the light emitting element (20P), and the second die pad (52AB) is configured to be inclined toward the plastic rear surface (80r) with respect to a horizontal direction perpendicular to the thickness direction (z-direction) of the sealing plastic (80) as the second die pad (52AB) extends toward the first die pad (42CB).

Clause A31

The insulation module according to clause A30, wherein the first die pad (42CB) is configured to be inclined toward the plastic rear surface (80r) with respect to the horizontal direction perpendicular to the thickness direction (z-direction) of the sealing plastic (80) as the first die pad (42CB) extends toward the second die pad (52AB).

Clause B1

An insulation module, including:

a light emitting element (20);

a light receiving element (30) configured to receive light from the light emitting element (20);

a first die pad (42CB) on which the light emitting element (20) is mounted;

a second die pad (52AB) that is arranged side by side with the first die pad (42CB) and on which the light receiving element (30) is mounted;

a transparent plastic (60) that covers at least both the light emitting element (20) and the light receiving element (30);

a reflection member (70) that covers at least the transparent plastic (60) and is made of a material that reflects light from the light emitting element (20); and a sealing plastic (80) that seals the reflection member (70) together with the transparent plastic (60) and is made of a material having a light blocking property, wherein a height position of the light emitting surface (20s) of the light emitting element (20) is equal to a height position of the light receiving surface (33) of the light receiving element (30) or higher than the height position of the light receiving surface (33).

Clause B2

An insulation module, including:

a light emitting element (20);

a light receiving element (30) configured to receive light from the light emitting element (20);

a first die pad (42CB) on which the light emitting element (20) is mounted through a first bonding material (90);

a second die pad (52AB) that is arranged side by side with the first die pad (42CB) and on which the light receiving element (30) is mounted through a second bonding material (100);

a transparent plastic (60) that covers at least both the light emitting element (20) and the light receiving element (30);

a reflection member (70) that covers at least the transparent plastic (60) and is made of a material that reflects light from the light emitting element (20); and a sealing plastic (80) that seals the reflection member (70) together with the transparent plastic (60) and is made of a material having a light blocking property, wherein the second die pad (52AB) is longer than the first die pad (42CB) in an arrangement direction (x-direction) of the first die pad (42CB) and the second die pad (52AB), the first die pad (42CB) extends toward the second die pad (52AB) beyond the first bonding material (90), the second die pad (52AB) extends beyond the second bonding material (100) toward the first die pad (42CB), and a distance between the first die pad (42CB) and the second die pad (52AB) is shorter than a length of the first die pad (42CB) in the arrangement direction (x-direction).

Clause B3

The insulation module according to clause B2, wherein the light emitting element (20) is mounted on one of two end portions of the first die pad (42CB) that is closer to the second die pad (52AB) in the arrangement direction (x-direction), and the light receiving element (30) is mounted on one of two end portions of the second die pad (52AB) that is closer to the first die pad (42CB) in the arrangement direction (x-direction).

Clause B4

The insulation module according to clause B2, wherein the first die pad (42CB) includes a first protruding portion (47) that protrudes toward the second die pad (52AB) beyond the first bonding material (90) in the arrangement direction (x-direction), and the second die pad (52AB) includes a second protruding portion (59) that protrudes toward the first die pad (42CB) beyond the second bonding material (100) in the arrangement direction (x-direction).

Clause C1

An insulation module, including:

a light emitting element (20);

a light receiving element (30) configured to receive light from the light emitting element (20);

a first die pad (42CB) on which the light emitting element (20) is mounted;

a second die pad (52AB) that is arranged side by side with the first die pad (42CB) and on which the light receiving element (30) is mounted;

a transparent plastic (60) that covers at least both the light emitting element (20) and the light receiving element (30);

a reflection member (70) that covers at least the transparent plastic (60) and is made of a material that reflects light from the light emitting element (20); and a sealing plastic (80) that seals the reflection member (70) together with the transparent plastic (60) and is made of a material having a light blocking property, wherein the sealing plastic (80) includes a plastic side surface (81/82) on which a plurality of terminals (41A to 41D/51A to 51D) are arranged, and the plastic side surface (81/82) has an uneven portion (87/88) in a section between a first terminal and a second terminal of the terminals (41A to 41D/51A to 51D).

Clause C2

The insulation module according to clause C1, wherein the second die pad (52AB) includes a suspension lead (55A), the suspension lead (55A) is exposed from the section of the plastic side surface (82) between the first terminal and the second terminal, and the uneven portion (88) is disposed in at least one of a section of the plastic side surface (82) between the first terminal (51B) and the suspension lead (55A) as the second terminal and a section of the plastic side surface (82) between the second terminal (51C) and the suspension lead (55A) as the first terminal.

Clause C3

The insulation module according to clause C1, wherein the second die pad (52AB) includes a suspension lead (55A), and the plastic side surface includes a terminal surface (81/82) on which the terminals (41A to 41D/51A to 51D) are disposed and a suspension lead surface (84) that differs from the terminal surface (81/82) and from which the suspension lead (55A) extends out.

Clause C4

The insulation module according to any one of clauses C1 to C3, wherein the uneven portion (87/88) is formed over the entire plastic side surface (81/82/84) in a thickness direction (z-direction) of the sealing plastic (80).

Clause C5

An insulation module, including:

a light emitting element (20);

a light receiving element (30) configured to receive light from the light emitting element (20);

a first die pad (42CB) on which the light emitting element (20) is mounted;

a second die pad (52AB) that is arranged side by side with the first die pad (42CB) and on which the light receiving element (30) is mounted;

a transparent plastic (60) that covers at least both the light emitting element (20) and the light receiving element (30);

a reflection member (70) that covers at least the transparent plastic (60) and is made of a material that reflects light from the light emitting element (20); and a sealing plastic (80) that seals the reflection member (70) together with the transparent plastic (60) and is made of a material having a light blocking property, wherein the transparent plastic (60) is interposed between the first die pad (42CB) and the second die pad (52AB), and an uneven portion (120) is disposed in an interface section between the transparent plastic (60) and the reflection member (70) that is interposed between the first die pad (42CB) and the second die pad (52AB).

Clause C6

The insulation module according to clause C5, wherein the transparent plastic (60) includes inorganic particles (65).

Clause C7

The insulation module according to clause C5 or C6, wherein the reflection member (70) includes inorganic particles (77).

Clause D1

An insulation module, including:

a first light emitting element (20P) and a second light emitting element (20Q);

a first light receiving element (30P) configured to receive light from the first light emitting element (20P), and a second light receiving element (30Q) configured to receive light from the second light emitting element (20Q);

a first light receiving and emitting die pad (242AB) on which both the first light emitting element (20P) and the second light receiving element (30Q) are mounted;

a second light receiving and emitting die pad (252AB) that is arranged side by side with the first light receiving and emitting die pad (242AB) and on which both the second light emitting element (20Q) and the first light receiving element (30P) are mounted;

a first transparent plastic (60P) covering at least both the first light emitting element (20P) and the first light receiving element (30P);

a second transparent plastic (60Q) covering at least both the second light emitting element (20Q) and the second light receiving element (30Q);

a first reflection member (70P) that covers at least the first transparent plastic (60P) and is made of a material that reflects light from the first light emitting element (20P);

a second reflection member (70Q) that covers at least the second transparent plastic (60Q) and is made of a material that reflects light from the second light emitting element (20Q); and a sealing plastic (80) that seals the first reflection member (70P) and the second reflection member (70Q) together with the first transparent plastic (60P) and the second transparent plastic (60Q) and is made of a material having a light blocking property, wherein the sealing plastic (80) seals both the first reflection member (70P) and the second reflection member (70Q) and includes a separation wall portion (89) separating the first reflection member (70P) from the second reflection member (80Q).

Clause D2

An insulation module, including:

a first light emitting element (20P) and a second light emitting element (20Q);

a first light receiving element (30P) configured to receive light from the first light emitting element (20P), and a second light receiving element (30Q) configured to receive light from the second light emitting element (20Q);

a first light receiving and emitting die pad (242AB) on which both the first light emitting element (20P) and the second light receiving element (30Q) are mounted;

a second light receiving and emitting die pad (252AB) that is arranged side by side with the first light receiving and emitting die pad (242AB) and on which both the second light emitting element (20Q) and the first light receiving element (30P) are mounted;

a first transparent plastic (60P) covering at least both the first light emitting element (20P) and the first light receiving element (30P); and a second transparent plastic (60Q) covering at least both the second light emitting element (20Q) and the second light receiving element (30Q), wherein the first light emitting element (20P) is configured to emit light of a first wavelength, the second light emitting element (30P) is configured to emit light of a second wavelength different from the first wavelength, the first transparent plastic (60P) is made of a resin material that transmits light of the first wavelength and does not transmit light of the second wavelength, and the second transparent plastic (60Q) is made of a resin material that transmits light of the second wavelength and does not transmit light of the first wavelength.

Clause D3

The insulation module according to clause D2, further including:

a first reflection member (70P) that covers at least the first transparent plastic (60P) and is made of a material that reflects light from the first light emitting element (20P); and a second reflection member (70Q) that covers at least the second transparent plastic (60Q) and is made of a material that reflects light from the second light emitting element (20Q).

Clause D4

The insulation module according to clause D3, wherein the sealing plastic (80) seals both the first reflection member (70P) and the second reflection member (70Q) and includes a separation wall portion (89) separating the first reflection member (70P) from the second reflection member (70Q).

Clause E1

An insulation module, including:

a light emitting element (20);

a light receiving element (30) configured to receive light from the light emitting element (20);

a first die pad (42CB) on which the light emitting element (20) is mounted;

a second die pad (52AB) that is arranged side by side with the first die pad (42CB) and on which the light receiving element (30) is mounted;

a transparent plastic (60) that covers at least both the light emitting element (20) and the light receiving element (30);

a reflection member (70) that covers at least the transparent plastic (60) and is made of a material that reflects light from the light emitting element (20); and a sealing plastic (80) that seals the reflection member (70) together with the transparent plastic (60) and is made of a material having a light blocking property, wherein the light receiving element (30) includes:

a photoelectric conversion element (35PA);

a control circuit (35PB) that is configured to receive a signal from the photoelectric conversion element (35PA); and an insulating layer (36P) disposed over the photoelectric conversion element (35PA) and the control circuit (35PB), the insulating layer (36P) includes:

a first insulating portion (36PA) formed over the photoelectric conversion element (35PA); and a second insulating portion (36PB) formed over the control circuit (35PB), the second insulating portion (36PB) includes at least one first wiring layer, and the first insulating portion (36PA) includes at least one layer that is free of a wiring layer.

Clause E2

An insulation module, including:

a light emitting element (20);

a light receiving element (30) configured to receive light from the light emitting element (20);

a first die pad (42CB) on which the light emitting element (20) is mounted;

a second die pad (52AB) that is arranged side by side with the first die pad (42CB) and on which the light receiving element (30) is mounted;

a transparent plastic (60) that covers at least both the light emitting element (20) and the light receiving element (30);

a reflection member (70) that covers at least the transparent plastic (60) and is made of a material that reflects light from the light emitting element (20); and a sealing plastic (80) that seals the reflection member (70) together with the transparent plastic (60) and is made of a material having a light blocking property, wherein the light receiving element (30) includes:

a photoelectric conversion element (35PA);

a control circuit (35PB) that is configured to receive a signal from the photoelectric conversion element (35PA); and

an insulating layer (36P) disposed over the photoelectric conversion element (35PA) and the control circuit (35PB), the insulating layer (36P) includes:

a first insulating portion (36PA) formed over the photoelectric conversion element (35PA); and a second insulating portion (36PB) formed over the control circuit (35PB), the second insulating portion (36PB) includes a plurality of first wiring layers, and the first insulating portion (36PA) includes a second wiring layer that is smaller in number than the second insulating portion (36PB).

Clause E3

An insulation module, including:

a light emitting element (20);

a light receiving element (30) configured to receive light from the light emitting element (20);

a first die pad (42CB) on which the light emitting element (20) is mounted;

a second die pad (52AB) that is arranged side by side with the first die pad (42CB) and on which the light receiving element (30) is mounted;

a transparent plastic (60) that covers at least both the light emitting element (20) and the light receiving element (30);

a reflection member (70) that covers at least the transparent plastic (60) and is made of a material that reflects light from the light emitting element (20); and a sealing plastic (80) that seals the reflection member (70) together with the transparent plastic (60) and is made of a material having a light blocking property, wherein the light receiving element (30) includes:

a photoelectric conversion element (35P); and a control circuit (35PB) that is configured to receive a signal from the photoelectric conversion element (35PA), and the control circuit (35PB/130A) is configured to, when the light receiving element (30) receives a signal including a plurality of pulses from the light emitting element (20), output an output signal based on a portion of the pulses excluding the first pulse.

The above description is merely exemplary. Those skilled in the art will recognize that various further combinations and permutations are possible in addition to the components and methods (manufacturing process) that are listed for the purpose of describing the techniques of the present disclosure. The present disclosure is intended to cover all alternatives, variations, and modifications falling within the scope of this disclosure, including the claims and clauses.

REFERENCE SIGNS LIST

10 . . . Insulation module
20 . . . Light emitting element
20P . . . First light emitting element
20Q . . . Second light emitting element
20A . . . Light emitting diode
20AP . . . First light emitting diode
20AQ . . . Second light emitting diode
20*s*, 20Ps, 20Qs . . . Element main surface
20*r*, 20Pr, 20Qr . . . Element rear surface
21, 21P, 21Q . . . First electrode
22, 22P, 22Q . . . Second electrode
30 . . . Light receiving element
30P . . . First light receiving element
30Q . . . Second light receiving element
30A . . . Light receiving diode

86

30AP . . . First light receiving diode
30AQ . . . Second light receiving diode
30*s*, 30Ps, 30Qs . . . Element main surface
30*r*, 30Pr, 30Qr . . . Element rear surface
31, 31P, 31Q . . . First electrode
32, 32P, 32Q . . . Second electrode
33, 33P, 33Q . . . Light receiving surface
34P . . . Semiconductor substrate
34Ps . . . Surface
34PA . . . First semiconductor region
34PB . . . Second semiconductor region
35PA . . . Photoelectric conversion element
35PB . . . Control circuit
35PC . . . Insulating wiring layer
36P . . . Insulating layer
36PA . . . First insulating portion
36PB . . . Second insulating portion
37PA to 37PE . . . Insulating film
38PA to 38PE . . . Wiring film
39PA to 39PD . . . Via
40, 40A to 40D . . . First lead frame
41A to 41D . . . Terminals
42A to 42D . . . Inner lead
42BA . . . First lead portion
42BB . . . Second lead portion
42CA . . . Lead portion
42CB . . . Die pad portion (first die pad)
42*s* . . . Pad main surface
42*r* . . . Pad rear surface
43A to 43D . . . Through-hole
44A . . . Projection
44B . . . Recess
44C . . . Recessed section
44D . . . Projection
45C . . . Main metal layer
46C . . . Plating layer
47 . . . Protruding portion (first protruding portion)
50, 50A to 50D . . . Second lead frame
51A to 51D . . . Terminal
52A to 52D . . . Inner lead
53A to 53D . . . Through-hole
52AA . . . Lead portion
52AB . . . Die pad portion (second die pad)
52*s* . . . Pad main surface
52*r* . . . Pad rear surface
54A . . . Recess
54B . . . Protruding portion
54C . . . Projection
55A . . . Suspension lead
56A . . . Main metal layer
57A . . . Plating layer
58A . . . Projection
59 . . . Protruding portion (second protruding portion)
60 . . . Transparent plastic
60P . . . First transparent plastic
60Q . . . Second transparent plastic
61 . . . First end portion
61*a* . . . First section
61*b* . . . Second section
62 . . . Second end portion
62*a* . . . First section
62*b* . . . Second section
63 . . . Curved surface
64 . . . Lower end surface
65 . . . Inorganic particles
70 . . . Reflection member
70P . . . First reflection member 70Q . . . Second reflection member
71 . . . First end portion
72 . . . Second end portion
73 . . . Upper curved surface
73*a* . . . First curved surface (first end curved surface)
73*b* . . . Second curved surface (second end curved surface)
73*c* . . . Third curved surface (intermediate curved surface)
73*d* . . . Fourth curved surface
74 . . . Lower curved surface
75 . . . Lower section
75A . . . Light emitting-side opposed portion
75B . . . Light receiving-side opposed portion
76 . . . Upper section
77 . . . Inorganic particles
80 . . . Sealing plastic
80*s* . . . Plastic surface
80*r* . . . Plastic rear surface
81 . . . First plastic side surface
82 . . . Second plastic side surface
83 . . . Third plastic side surface
84 . . . Fourth plastic side surface
85 . . . First side surface
86 . . . Second side surface
87 . . . Uneven portion
87*a* . . . Depression
88 . . . Uneven portion
88*a* . . . Depression
89 . . . Separation wall portion
90 . . . Conductive bonding material (first bonding material)
100 . . . Conductive bonding material (second bonding material)
91, 101 . . . First bonding region
92, 102 . . . Second bonding region
92*s*, 102*s* . . . Surface
110 . . . Control circuit
111 . . . Schmitt trigger
112 . . . UVLO portion
113 . . . Comparator
114 . . . Output portion
114*a*, 132Aa, 132Ba . . . First switching element
114*b*, 132Ab, 132Bb . . . Second switching element
120 . . . Uneven portion
130A . . . First control circuit
131A . . . First Schmitt trigger
132A . . . First output portion
130B . . . Second control circuit
131B . . . Second Schmitt trigger
132B . . . Second output portion
140, 140A to 140D . . . First lead frame
150, 150A to 150D . . . Second lead frame
141A to 141D . . . Terminal
142A to 142D . . . Inner lead
142AA . . . Lead portion
142AB . . . Die pad portion (first light emitting die pad)
142As . . . Pad main surface
142Ar . . . Pad rear surface
142DA . . . Lead portion
142DB . . . Die pad portion (second light emitting die pad)
142Ds . . . Pad main surface
142Dr . . . Pad rear surface
143A to 143D . . . Through-hole
150, 150A to 150D . . . Second lead frame
151A~151D . . . Terminal
152A to 152D . . . Inner lead 153A to 153D . . . Through-hole
152AA . . . Lead portion
152AB . . . Wire connection portion
152DA . . . Lead portion
152DB . . . Die pad portion (second light receiving die pad)
200 . . . Plastic layer
200 . . . Surface
230A . . . First control circuit
231A . . . First Schmitt trigger
232A . . . First output portion
232Aa, 232Ba . . . First switching element
232Ab, 232Bb . . . Second switching element
233A . . . First current source
234A . . . First driver
230B . . . Second control circuit
231B . . . Second Schmitt trigger
232B . . . Second output portion
233B . . . Second current source
234B . . . Second driver
240, 240A to 240D . . . First lead frame
250, 250A to 250D . . . Second lead frame
241A-241D . . . Terminal
242A to 242D . . . Inner lead
242AA . . . Lead portion
242AB . . . Die pad portion (first light receiving and emitting die pad)
242DA . . . Lead portion
242DB . . . Wire connection portion
243A to 243D . . . Through-hole
250, 250A to 250D . . . Second lead frame
251A-251D . . . Terminal
252A to 252D . . . Inner lead
253A to 253D . . . Through-hole
252AA . . . Lead portion
252AB . . . Die pad portion (second receiving and emitting die pad)
252As . . . Pad surface
252Ar: Pad rear surface
252DA . . . Lead portion
252DB . . . Wire connection portion
300 . . . Plate-shaped member
500 . . . Inverter circuit
501 . . . First switching element
502 . . . Second switching element
503, 504 . . . Control source
505 . . . Detection circuit
510 . . . First inverter circuit
511 . . . First switching element
512 . . . Second switching element
520 . . . Second inverter circuit
521 . . . First switching element
522 . . . Second switching element
WA1, WA2, WB1 to WB4, WC1, WC2, WD1 to WD5, WE1 to WE4, WF1 to WF4 . . . Wire
CP, CQ, CR . . . Inflection position
CA to CG . . . Center of curvature

The invention claimed is:

1. An insulation module, comprising:
a light emitting element;
a light receiving element configured to receive light from the light emitting element;
a first die pad on which the light emitting element is mounted;
a second die pad that is arranged side by side with the first die pad and on which the light receiving element is mounted;

a transparent plastic that covers at least both the light emitting element and the light receiving element;

a reflection member that covers at least the transparent plastic and is made of a material that reflects light from the light emitting element; and a sealing plastic that seals the reflection member together with the transparent plastic and is made of a material having a light blocking property, wherein both of the reflection member and the transparent plastic include inorganic particles that are configured to absorb or reflect light from the light emitting element.

2. The insulation module according to claim 1, wherein a refractive index of the reflection member differs from a refractive index of the transparent plastic.

3. The insulation module according to claim 2, wherein the refractive index of the reflection member is greater than the refractive index of the transparent plastic.

4. The insulation module according to claim 2, wherein the light emitting element includes a light emitting surface, the reflection member includes a light emitting-side opposed portion that is opposed to the light emitting surface and is spaced apart from the light emitting surface in a direction perpendicular to the light emitting surface, and an angle of an interface between the light emitting-side opposed portion of the reflection member and the transparent plastic is less than a critical angle.

5. The insulation module according to claim 2, wherein the refractive index of the reflection member is less than the refractive index of the transparent plastic.

6. The insulation module according to claim 5, wherein the light emitting element includes a light emitting surface, the reflection member includes a light emitting-side opposed portion that is opposed to the light emitting surface and is spaced apart from the light emitting surface in a direction perpendicular to the light emitting surface, and an angle of an interface between the light emitting-side opposed portion of the reflection member and the transparent plastic is greater than or equal to a critical angle.

7. The insulation module according to claim 1, wherein the light emitting element includes a light emitting surface, the light receiving element includes a light receiving surface, the reflection member includes a light emitting-side opposed portion that is opposed to the light emitting surface and is spaced apart from the light emitting surface in a direction perpendicular to the light emitting surface and a light receiving-side opposed portion that is opposed to the light receiving surface and is spaced apart from the light receiving surface in a direction perpendicular to the light receiving surface, and the light emitting-side opposed portion has a smaller thickness than the light receiving-side opposed portion.

8. The insulation module according to claim 1, wherein the light emitting element is bonded to a mount surface of the first die pad with a first bonding material, the light receiving element is bonded to a mount surface of the second die pad with a second bonding material, the first bonding material protrudes from the light emitting element as viewed in a direction perpendicular to the mount surface of the first die pad, the second bonding material protrudes from the light receiving element as viewed in a direction perpendicular to the mount surface of the second die pad, and at least one of the first bonding material and the second bonding material is made of a material that reflects light from the light emitting element.

9. The insulation module according to claim 1, wherein the light emitting element is bonded to a mount surface of the first die pad with a first bonding material, the light receiving element is bonded to a mount surface of the second die pad with a second bonding material, the first bonding material protrudes from the light emitting element as viewed in a direction perpendicular to the mount surface of the first die pad, the second bonding material protrudes from the light receiving element as viewed in a direction perpendicular to the mount surface of the second die pad, the first die pad includes a first protruding portion that extends toward the second die pad beyond the first bonding material, and the second die pad includes a second protruding portion that extends toward the first die pad beyond the second bonding material.

10. The insulation module according to claim 1, wherein the reflection member includes a pad cover portion that covers surfaces of the first die pad and the second die pad, the surfaces being opposite to surfaces on which the light emitting element and the light receiving element are mounted, and at least a part of an interface between the pad cover portion and the transparent plastic includes an uneven portion.

11. The insulation module according to claim 1, wherein the reflection member includes a first end curved surface located at one of two end portions in an arrangement direction of the first die pad and the second die pad, the end portion being closer to the first die pad, a second end curved surface located at the other end portion that is closer to the second die pad, and an intermediate curved surface connecting the first end curved surface to the second end curved surface, the first end curved surface has a curved shape having its center of curvature located at an opposite side of the first end curved surface from the first die pad, the second end curved surface has a curved shape having its center of curvature located at an opposite side of the second end curved surface from the second die pad, and the intermediate curved surface has a curved shape having its center of curvature located at a side of the intermediate curved surface at which the first and second die pads are located.

12. The insulation module according to claim 1, wherein the sealing plastic includes a plastic side surface on which a plurality of terminals are arranged, and the plastic side surface has an uneven portion in a section between a first terminal and a second terminal of the terminals.

13. The insulation module according to claim 12, wherein the second die pad includes a suspension lead, the suspension lead is exposed from the section of the plastic side surface between the first terminal and the second terminal, and the uneven portion is disposed in at least one of a section of the plastic side surface between the first terminal and the suspension lead and a section of the plastic side surface between the second terminal and the suspension lead.

14. The insulation module according to claim 12, wherein the second die pad includes a suspension lead, and the plastic side surface includes a terminal surface on which the terminals are disposed and a suspension lead surface that differs from the terminal surface and from which the suspension lead extends out.

15. The insulation module according to claim 1, wherein the second die pad is longer than the first die pad in an arrangement direction of the first die pad and the second die pad, and a distance between the first die pad and the second die pad in the arrangement direction is longer than a length of the first die pad in the arrangement direction.

16. The insulation module according to claim 1, wherein the second die pad is longer than the first die pad in an arrangement direction of the first die pad and the second die pad, and a distance between the first die pad and the second die pad in the arrangement direction is shorter than a length of the first die pad in the arrangement direction.

17. The insulation module according to claim 1, wherein the transparent plastic covers the entire light emitting element and covers a part of the light receiving element.

18. The insulation module according to claim 1, wherein the light receiving element is bonded, through a bonding material, to a first end portion that is one of two end portions of the second die pad in an arrangement direction of the first die pad and the second die pad, the first end portion being closer to the first die pad, and an edge of the first end portion of the second die pad, the edge being closer to the first die pad, includes a projection extending in a direction perpendicular to a mount surface of the second die pad.

19. The insulation module according to claim 1, wherein the light receiving element includes a first light receiving element and a second light receiving element, the light emitting element includes a first light emitting element and a second light emitting element, the first light emitting element and the first light receiving element form a first photocoupler, the second light emitting element and the second light receiving element form a second photocoupler, the transparent plastic includes:

a first transparent plastic covering the first light emitting element and the first light receiving element; and a second transparent plastic covering the second light emitting element and the second light receiving element, the reflection member includes:

a first reflection member covering the first transparent plastic; and a second reflection member covering the second transparent plastic, and the sealing plastic seals both the first reflection member and the second reflection member and includes a separation wall portion separating the first reflection member from the second reflection member.

20. The insulation module according to claim 1, wherein the light receiving element includes a first light receiving element and a second light receiving element, the light emitting element includes a first light emitting element and a second light emitting element, the first light emitting element and the first light receiving element form a first photocoupler, the second light emitting element and the second light receiving element form a second photocoupler, the transparent plastic includes:

a first transparent plastic covering the first light emitting element and the first light receiving element; and a second transparent plastic covering the second light emitting element and the second light receiving element, the first light emitting element is configured to emit light of a first wavelength, the second light emitting element is configured to emit light of a second wavelength different from the first wavelength, the first transparent plastic is made of a resin material that transmits light of the first wavelength and does not transmit light of the second wavelength, and the second transparent plastic is made of a resin material that transmits light of the second wavelength and does not transmit light of the first wavelength.

* * * * *